United States Patent [19]
Urabe et al.

[11] Patent Number: 5,825,820
[45] Date of Patent: Oct. 20, 1998

[54] WAVEFORM SHAPING METHOD AND EQUIPMENT

[75] Inventors: Yoshio Urabe, Ibaraki; Shouichi Koga, Fukuoka-ken; Hitoshi Takai, Osaka; Koji Kai, Iizuka; Hidetoshi Yamasaki, Amagasaki, all of Japan

[73] Assignee: Matsushita Electric Industrial Co., Ltd., Osaka, Japan

[21] Appl. No.: 264,616

[22] Filed: Jun. 23, 1994

[30] Foreign Application Priority Data

| Jun. 25, 1993 | [JP] | Japan | 5-154776 |
|---|---|---|---|
| Sep. 8, 1993 | [JP] | Japan | 5-223292 |
| Feb. 7, 1994 | [JP] | Japan | 6-013760 |

[51] Int. Cl.$^6$ .................................................. H04L 27/00
[52] U.S. Cl. ............................ 375/259; 375/296; 360/40
[58] Field of Search ........................... 375/296, 259, 375/261; 327/100, 181, 261, 291; 360/40, 42, 44

[56] References Cited

U.S. PATENT DOCUMENTS

| 4,737,969 | 4/1988 | Steel et al. | 375/261 |
|---|---|---|---|
| 4,893,316 | 1/1990 | Janc et al. | 375/261 |
| 5,170,413 | 12/1992 | Hess et al. | 375/260 |

FOREIGN PATENT DOCUMENTS

| 01317090 A | 12/1989 | Japan . |
|---|---|---|
| 04058622 A | 2/1992 | Japan . |

*Primary Examiner*—Don N. Vo
*Attorney, Agent, or Firm*—Ratner & Prestia

[57] ABSTRACT

In the transmitter which carries out burst transmission using information data as a packet, if the status is divided into four modes, namely, burst stop mode, burst rising mode, burst continuous mode, and burst falling mode, a waveform shaping equipment designed to read out shaped waveform data for each mode from outputs of either of the two memory tables, the first memory table which holds waveform data for specific data patterns used in common in burst rising mode and burst falling mode and the second memory table which holds waveform data for all data patterns used in the burst continuous mode, or a waveform shaping equipment comprising the third memory table which holds waveform data corresponding to all the data patterns used in the burst rising mode and the fourth memory table which holds waveform data corresponding to all data patterns used in the burst falling mode and generating shaped waveform data by synthesizing the two outputs of the third and the fourth memory tables at the time of burst continuous mode.

28 Claims, 63 Drawing Sheets

| | A(1) | A(2) | A(3) |
|---|---|---|---|
| | X | X | X |
| p(0) | X | X | X |
| p(1) | D(1) | X | X |
| p(2) | D(2) | D(1) | X |
| p(3) | D(3) | D(2) | D(1) |
| p(4) | D(4) | D(3) | D(2) |
| p(5) | D(5) | D(4) | D(3) |
| p(k−1) | D(k−1) | D(k) | D(k+1) |
| p(n−2) | D(n−2) | D(n−3) | D(n−4) |
| p(n−1) | D(n−1) | D(n−2) | D(n−3) |
| p(n) | D(n) | D(n−1) | D(n−2) |
| p(n+1) | X | D(n) | D(n−1) |
| p(n+2) | X | X | D(n) |
| p(n+3) | X | X | X |

Elapsed time →

T

Data pattern length
(3 time slots)

FIG. 3
PRIOR ART

| Time slot No. | t1 | t2 | t3 | t4 | t5 | t6 | t7 |
|---|---|---|---|---|---|---|---|
| Transmission data | 01 | 00 | 10 | 11 | 11 | 01 | 10 |
| In-phase axis data | 1 | 0 | 0 | 1 | 1 | 1 | 0 |
| Quadrature axis data | 0 | 0 | 1 | 1 | 1 | 0 | 1 |
FIG. 5A
PRIOR ART
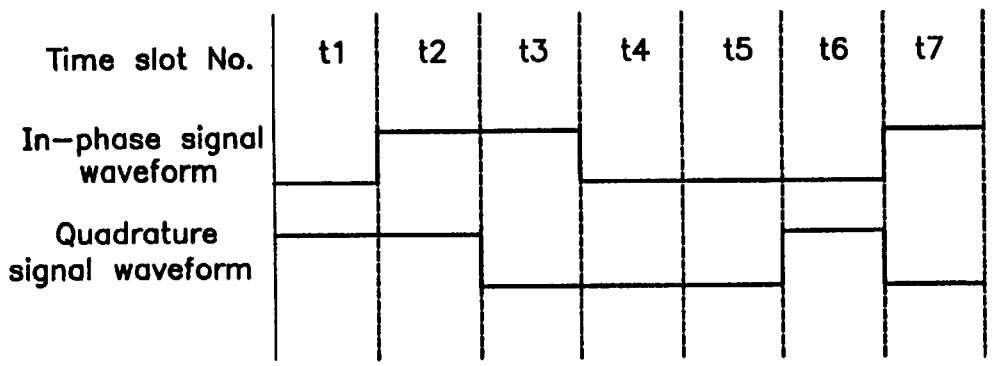
FIG. 5B
PRIOR ART
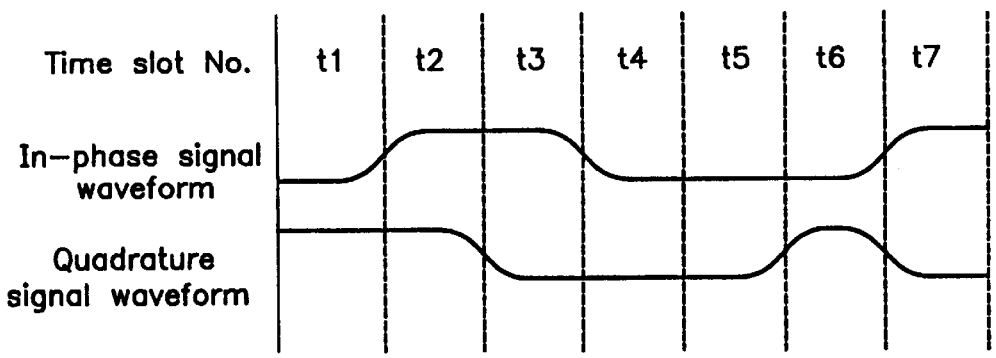
FIG. 5C
PRIOR ART

| Time slot No. | t1 | t2 | t3 | t4 | t5 | t6 | t7 |
|---|---|---|---|---|---|---|---|
| Transmission data | 01 | 00 | 10 | 11 | 11 | 01 | 10 |
FIG. 9A
PRIOR ART
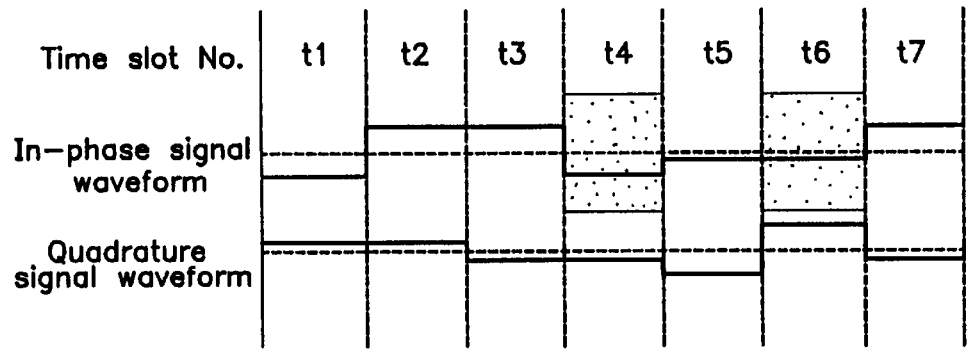
FIG. 9B
PRIOR ART
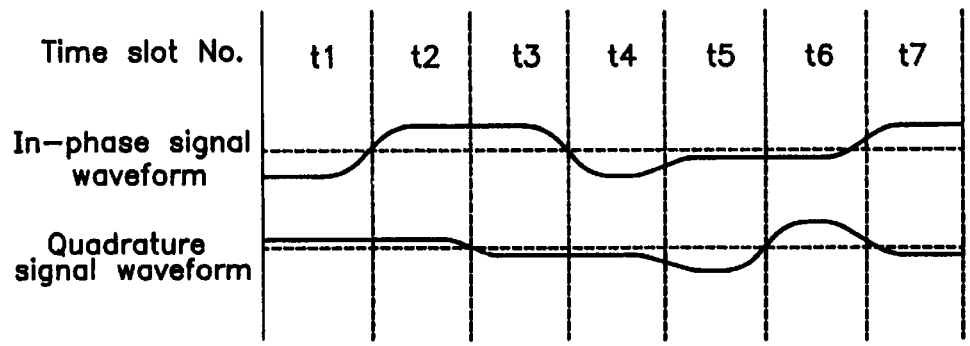
FIG. 9C
PRIOR ART

| Elapsed time | A(1) | A(2) | A(3) | A(4) | A(5) | |
|---|---|---|---|---|---|---|
| 1T | 0 | 0 | 0 | 0 | 0 | Spare sequence |
| 2T | 0 | 0 | 0 | 0 | 1 | |
| 3T | 0 | 0 | 0 | 1 | −1 | |
| 4T | 0 | 0 | 1 | −1 | 1 | |
| 5T | 0 | 1 | −1 | 1 | −1 | |
| 6T | 1 | −1 | 1 | −1 | D(1) | |
| 7T | −1 | 1 | −1 | D(1) | D(2) | |
| 8T | 1 | −1 | D(1) | D(2) | D(3) | |
| 9T | −1 | D(1) | D(2) | D(3) | D(4) | |
| 10T | D(1) | D(2) | D(3) | D(4) | D(5) | |
| 11T | D(2) | D(3) | D(4) | D(5) | D(6) | |
| ⋮ | D(k−2) | D(k−1) | D(k) | D(k+1) | D(k+2) | Ordinary sequence |
| (n+4)T | D(n−5) | D(n−4) | D(n−3) | D(n−2) | D(n−1) | |
| (n+5)T | D(n−4) | D(n−3) | D(n−2) | D(n−1) | D(n) | |
| (n+6)T | D(n−3) | D(n−2) | D(n−1) | D(n) | −1 | |
| (n+7)T | D(n−2) | D(n−1) | D(n) | −1 | 1 | |
| (n+8)T | D(n−1) | D(n) | −1 | 1 | −1 | |
| (n+9)T | D(n) | −1 | 1 | −1 | 1 | |
| (n+10)T | −1 | 1 | −1 | 1 | 0 | Spare sequence |
| (n+11)T | 1 | −1 | 1 | 0 | 0 | |
| (n+12)T | −1 | 1 | 0 | 0 | 0 | |
| (n+13)T | 1 | 0 | 0 | 0 | 0 | |
| (n+14)T | 0 | 0 | 0 | 0 | 0 | |

Pattern length (w=5)

FIG. 18

|  | A(1) | A(2) | A(3) | A(4) | A(5) |  |
|---|---|---|---|---|---|---|
| 1T | 0 | 0 | 0 | 0 | 0 | ⎫ |
| 2T | 0 | 0 | 0 | 0 | 1 | ⎪ |
| 3T | 0 | 0 | 0 | 1 | −1 | ⎬ Spare sequence |
| 4T | 0 | 0 | 1 | −1 | D(1) | ⎪ |
| 5T | 0 | 1 | −1 | D(1) | D(2) | ⎭ |
| 6T | 1 | −1 | D(1) | D(2) | D(3) | ⎫ |
| 7T | −1 | D(1) | D(2) | D(3) | D(4) | ⎪ |
| 8T | D(1) | D(2) | D(3) | D(4) | D(5) | ⎪ |
| 9T | D(2) | D(3) | D(4) | D(5) | D(6) | ⎪ |
| 10T | D(3) | D(4) | D(5) | D(6) | D(7) | ⎪ |
| 11T | D(4) | D(5) | D(6) | D(7) | D(8) | ⎪ |
| ⋮ | ⋮ | ⋮ | ⋮ | ⋮ | ⋮ | ⎬ Ordinary sequence |
|  | D(k−2) | D(k−1) | D(k) | D(k+1) | D(k+2) | ⎪ |
| ⋮ | ⋮ | ⋮ | ⋮ | ⋮ | ⋮ | ⎪ |
| (n)T | D(n−7) | D(n−6) | D(n−5) | D(n−4) | D(n−3) | ⎪ |
| (n+1)T | D(n−6) | D(n−5) | D(n−4) | D(n−3) | D(n−2) | ⎪ |
| (n+2)T | D(n−5) | D(n−4) | D(n−3) | D(n−2) | D(n−1) | ⎪ |
| (n+3)T | D(n−4) | D(n−3) | D(n−2) | D(n−1) | D(n) | ⎭ |
| (n+4)T | D(n−3) | D(n−2) | D(n−1) | D(n) | −1 | ⎫ |
| (n+5)T | D(n−2) | D(n−1) | D(n) | −1 | 1 | ⎪ |
| (n+6)T | D(n−1) | D(n) | −1 | 1 | 0 | ⎪ |
| (n+7)T | D(n) | −1 | 1 | 0 | 0 | ⎬ Spare sequence |
| (n+8)T | −1 | 1 | 0 | 0 | 0 | ⎪ |
| (n+9)T | 1 | 0 | 0 | 0 | 0 | ⎪ |
| (n+10)T | 0 | 0 | 0 | 0 | 0 | ⎭ |

Elapsed time ↓

Pattern length (w=5)

FIG. 19

| | A(1) | A(2) | A(3) | A(4) | |
|---|---|---|---|---|---|
| 1T | 0 | 0 | 0 | 0 | ⎫ Spare sequence |
| 2T | 0 | 0 | 0 | 1 | |
| 3T | 0 | 0 | 1 | −1 | |
| 4T | 0 | 1 | −1 | 1 | ⎭ |
| 5T | 1 | −1 | 1 | D(1) | ⎫ |
| 6T | −1 | 1 | D(1) | D(2) | |
| 7T | 1 | D(1) | D(2) | D(3) | |
| 8T | D(1) | D(2) | D(3) | D(4) | |
| 9T | D(2) | D(3) | D(4) | D(5) | |
| ⋮ | ⋮ | ⋮ | ⋮ | ⋮ | |
| | D(k−2) | D(k−1) | D(k) | D(k+1) | Ordinary sequence |
| ⋮ | ⋮ | ⋮ | ⋮ | ⋮ | |
| (n+2)T | D(n−5) | D(n−4) | D(n−3) | D(n−2) | |
| (n+3)T | D(n−4) | D(n−3) | D(n−2) | D(n−1) | |
| (n+4)T | D(n−3) | D(n−2) | D(n−1) | D(n) | |
| (n+5)T | D(n−2) | D(n−1) | D(n) | −1 | ⎭ |
| (n+6)T | D(n−1) | D(n) | −1 | 1 | ⎫ |
| (n+7)T | D(n) | −1 | 1 | −1 | |
| (n+8)T | −1 | 1 | −1 | 0 | Spare sequence |
| (n+9)T | 1 | −1 | 0 | 0 | |
| (n+10)T | −1 | 0 | 0 | 0 | |
| (n+11)T | 0 | 0 | 0 | 0 | ⎭ |

Elapsed time ↓

Pattern length (w=4)

FIG. 20

| Elapsed time | A(1) | A(2) | A(3) | A(4) | A(5) | |
|---|---|---|---|---|---|---|
| 1T | 0 | 0 | 0 | 0 | 0 | ⎫ |
| 2T | 0 | 0 | 0 | 0 | D(1) | ⎬ Spare sequence |
| 3T | 0 | 0 | 0 | D(1) | D(2) | |
| 4T | 0 | 0 | D(1) | D(2) | D(3) | |
| 5T | 0 | D(1) | D(2) | D(3) | D(4) | ⎭ |
| 6T | D(1) | D(2) | D(3) | D(4) | D(5) | ⎫ |
| 7T | D(2) | D(3) | D(4) | D(5) | D(6) | |
| 8T | D(3) | D(4) | D(5) | D(6) | D(7) | |
| 9T | D(4) | D(5) | D(6) | D(7) | D(8) | |
| 10T | D(5) | D(6) | D(7) | D(8) | D(9) | |
| 11T | D(6) | D(7) | D(8) | D(9) | D(10) | |
| ⋮ | ⋮ | ⋮ | ⋮ | ⋮ | ⋮ | |
| | D(k−2) | D(k−1) | D(k) | D(k+1) | D(k+2) | Ordinary sequence |
| ⋮ | ⋮ | ⋮ | ⋮ | ⋮ | ⋮ | |
| (n−4)T | D(n−9) | D(n−8) | D(n−7) | D(n−6) | D(n−5) | |
| (n−3)T | D(n−8) | D(n−7) | D(n−6) | D(n−5) | D(n−4) | |
| (n−2)T | D(n−7) | D(n−6) | D(n−5) | D(n−4) | D(n−3) | |
| (n−1)T | D(n−6) | D(n−5) | D(n−4) | D(n−3) | D(n−2) | |
| (n)T | D(n−5) | D(n−4) | D(n−3) | D(n−2) | D(n−1) | |
| (n+1)T | D(n−4) | D(n−3) | D(n−2) | D(n−1) | D(n) | ⎭ |
| (n+2)T | D(n−3) | D(n−2) | D(n−1) | D(n) | 0 | ⎫ |
| (n+3)T | D(n−2) | D(n−1) | D(n) | 0 | 0 | |
| (n+4)T | D(n−1) | D(n) | 0 | 0 | 0 | ⎬ Spare sequence |
| (n+5)T | D(n) | 0 | 0 | 0 | 0 | |
| (n+6)T | 0 | 0 | 0 | 0 | 0 | ⎭ |

Pattern length (w=5)

FIG. 22

| Sub slot before first conversion (a1,b1) | Sub slot after first conversion (a1',b1') |
|---|---|
| (0,0) | (1,0) |
| (0,1) | (1,1) |
| (1,1) | (0,1) |
| (1,0) | (0,0) |

FIG. 57

| Sub slot before second conversion (a1,b1,c1) | Sub slot after second conversion (a1',b1',c1') |
|---|---|
| (0,0,0) | (0,1,1) |
| (0,0,1) | (0,1,0) |
| (0,1,1) | (1,1,0) |
| (0,1,0) | (1,1,1) |
| (1,1,0) | (1,0,1) |
| (1,1,1) | (1,0,0) |
| (1,0,1) | (0,0,0) |
| (1,0,0) | (0,0,1) |

FIG. 58

First waveform memory

| First addressing pattern (a1) | Waveform data to be stored |
|---|---|
| 0 | 33A |
| 1 | 33D |

FIG. 59A

Second waveform memory

| Second addressing pattern (b1) | Waveform data to be stored |
|---|---|
| 0 | 33C |
| 1 | 33B |

No. 1 first waveform memory

| First addressing pattern (a1) | Waveform data to be stored |
|---|---|
| 0 | xA |
| 1 | xD |

FIG. 60B

No. 1 second waveform memory

| Second addressing pattern (b1) | Waveform data to be stored |
|---|---|
| 0 | xC |
| 1 | xB |

FIG. 60C

No. 2 first waveform memory

| First addressing pattern (a2) | Waveform data to be stored |
|---|---|
| 0 | yA |
| 1 | yD |

FIG. 60D

No. 2 second waveform memory

| Second addressing pattern (b2) | Waveform data to be stored |
|---|---|
| 0 | yC |
| 1 | yB | first waveform memory

| First addressing pattern (a1,a1',b1',a3',b3') | Waveform data to be stored |
|---|---|
| 00000 | 37xA+37yA+37zA |
| 00001 | 37xA+37yA+37zB |
| 00011 | 37xA+37yA+37zD |
| 00010 | 37xA+37yA+37zC |
| 00100 | 37xB+37yA+37zA |
| 00101 | 37xB+37yA+37zB |
| 00111 | 37xB+37yA+37zD |
| 00110 | 37xB+37yA+37zC |
| 01100 | 37xD+37yA+37zA |
| 01101 | 37xD+37yA+37zB |
| 01111 | 37xD+37yA+37zD |
| 01110 | 37xD+37yA+37zC |
| 01000 | 37xC+37yA+37zA |
| 01001 | 37xC+37yA+37zB |
| 01011 | 37xC+37yA+37zD |
| 01010 | 37xC+37yA+37zC |

FIG. 61A first waveform memory

| First addressing pattern (a1,a1',b1',a3',b3') | Waveform data to be stored |
|---|---|
| 10000 | 37xA+37yD+37zA |
| 10001 | 37xA+37yD+37zB |
| 10011 | 37xA+37yD+37zD |
| 10010 | 37xA+37yD+37zC |
| 10100 | 37xB+37yD+37zA |
| 10101 | 37xB+37yD+37zB |
| 10111 | 37xB+37yD+37zD |
| 10110 | 37xB+37yD+37zC |
| 11100 | 37xD+37yD+37zA |
| 11101 | 37xD+37yD+37zB |
| 11111 | 37xD+37yD+37zD |
| 11110 | 37xD+37yD+37zC |
| 11000 | 37xC+37yD+37zA |
| 11001 | 37xC+37yD+37zB |
| 11011 | 37xC+37yD+37zD |
| 11010 | 37xC+37yD+37zC |

FIG. 61C second waveform memory

| Second addressing pattern (b2,a1',b1',a3',b3') | Waveform data to be stored |
|---|---|
| 00000 | 37xC+37yC+37zC |
| 00001 | 37xC+37yC+37zA |
| 00011 | 37xC+37yC+37zB |
| 00010 | 37xC+37yC+37zD |
| 00100 | 37xA+37yC+37zC |
| 00101 | 37xA+37yC+37zA |
| 00111 | 37xA+37yC+37zB |
| 00110 | 37xA+37yC+37zD |
| 01100 | 37xB+37yC+37zC |
| 01101 | 37xB+37yC+37zA |
| 01111 | 37xB+37yC+37zB |
| 01110 | 37xB+37yC+37zD |
| 01000 | 37xD+37yC+37zC |
| 01001 | 37xD+37yC+37zA |
| 01011 | 37xD+37yC+37zB |
| 01010 | 37xD+37yC+37zD |

FIG. 61B second waveform memory

| Second addressing pattern (b2,a1',b1',a3',b3') | Waveform data to be stored |
|---|---|
| 10000 | 37xC+37yB+37zC |
| 10001 | 37xC+37yB+37zA |
| 10011 | 37xC+37yB+37zB |
| 10010 | 37xC+37yB+37zD |
| 10100 | 37xA+37yB+37zC |
| 10101 | 37xA+37yB+37zA |
| 10111 | 37xA+37yB+37zB |
| 10110 | 37xA+37yB+37zD |
| 11100 | 37xB+37yB+37zC |
| 11101 | 37xB+37yB+37zA |
| 11111 | 37xB+37yB+37zB |
| 11110 | 37xB+37yB+37zD |
| 11000 | 37xD+37yB+37zC |
| 11001 | 37xD+37yB+37zA |
| 11011 | 37xD+37yB+37zB |
| 11010 | 37xD+37yB+37zD |

First waveform memory

| First addressing pattern (a1,a1⊕b1⊕c1) | Waveform data to be stored |
|---|---|
| 00 | 39A |
| 10 | 39D |
| 01 | 39E |
| 11 | 39H |

FIG. 62B

Second waveform memory

| Second addressing pattern (b1,a1⊕b1⊕c1) | Waveform data to be stored |
|---|---|
| 00 | 39C |
| 10 | 39B |
| 01 | 39G |
| 11 | 39F |

⊕ shows the exclusive-OR.

WAVEFORM SHAPING METHOD AND EQUIPMENT

BACKGROUND OF THE INVENTION

1. Field of the Invention

The present invention relates to the waveform shaping equipment and waveform-shaping method for generating bandlimited signals, and for preventing band spread at the head and trail at the edge of burst when burst-like data string is transmitted in the data transmission in which data is transmitted in the form of packet.

2. Related Art of the Invention

In the radio communication, etc., when a packet comprising transmission data is transmitted, it is necessary to limit the bandwidth (bandlimitation) to prevent adjacent channel interference for effective utilization of frequency. For bandlimitation of signals, it is common to limit the bandwidth with respect to the signal waveform of the baseband. Two systems are available for band-limiting the baseband signal waveform: an analog system using analog filter and a digital system by digital signal processing. One of the digital systems is the method to shape waveform by reading out and concatenating the baseband signal waveform previously band-limited by calculation from the memory table such as ROM and the like (for example, IEEE Transactions on Communications, COM-Volume 25, No. 10, Pages 1243–1244). When the waveform shaping method using this memory table system is used, the ideal filter frequency response can be more accurately realized than the analog system waveform shaping method, and the shaped waveform can be changed only by rewriting the memory contents, achieving high versatility. It is also suited for the VLSI technique and can be comparatively downsized.

Referring now to the drawings, the conventional waveform shaping equipment using the above-mentioned method is described with special emphasis placed on the readout principle of shaped waveform and hardware configuration of the waveform shaping equipment.

FIG. 1 shows input data to the waveform shaping equipment. D(1), D(2), . . . , D(k), . . . D(n) show transmission data and X shows the data other than the transmission data, which does not have any information. Each data is successively read into the waveform shaping equipment at every time interval T.

FIG. 2a shows the data pattern comprising each input data of FIG. 1. The data pattern is used to specify part of the address for reading out waveform after bandlimitation from the memory table. In this section, to simplify, description is made supposing that there is an intersymbol interference which has 3 symbols time and the data pattern length is 3 symbols. A(1), A(2), and A(3) show a time slot, respectively. Let the time slot A(2) in each data pattern be the present time slot. Then, time slots A(1), A(3) affect the present time slot A(2) by intersymbol interference. Each data pattern (p(1), p(2), p(3), p(4), data, respectively, and the data pattern p(1) comprises the data (D(1), X, X), the data pattern p(2) comprises the data (D(2), D(1), X), the data pattern p(3) comprises the data (D(3), D(2), D(1)), the data pattern p(4) comprises the data (D(4), D(3), D(2)), the data pattern p(n) comprises the data (D(n), D(n−1), D(n−2)), the data pattern p(n+1) comprises the data (X, D(n), D(n−1)), and the data pattern p(n+2) comprises the data (X, X, D(n)).

FIG. 3 shows the case when the data pattern corresponding to the present time slot which varies at every time interval T is extracted.

FIG. 2b shows baseband waveform after bandlimitation, which is generated when the waveform is read out from the memory table successively at every 1 symbol time T by the data pattern shown in FIG. 3. That is, the waveform w(3) which has 1 symbol time is generated by the data pattern p(3), the waveform w(4) equivalent to 1 symbol time is generated by the data pattern p(4), and the waveform w(n) equivalent to 1 symbol time is generated by the data pattern p(n). Because in the data patterns p(1), p(2), p(n+1), and p(n+2) indefinite data X with no information is contained, it is designed to output the 0-level waveform as the waveform for w(1), w(2), w(n+1), and w(n+2) at the time corresponding to data patterns p(1), p(2), p(n+1), and p(n+2).

FIG. 4 shows one example of a block diagram showing the hardware configuration of conventional waveform shaping equipment. In FIG. 4, S3 denotes a shift register, C3 a counter, M3 a memory table, D3 a D/A converter, and L3 a low-pass filter. dt3 denotes a dta string, co3 a counter output, so3 a shift register output, mo3 a memory output, wd3 a continuous waveform after D/A conversion w13 a shaped waveform after smoothing. In general, let the data string dt3 be the data string of $2^M$ value (M: natural number), 1 symbol is M bits and the shift register 101 is made up of M bits×3 stages. Therefore, the output from each stage becomes M bit each, respectively. For simplification, description will be made assuming that the shift register handles M=1, that is, binary data.

The shift register S3 accumulates data for latest 3 bits of the data string dt3, and while taking in 1-bit data from the data string dt3 at every 1 symbol time and shifting, it outputs 3-bit data pattern so3 in parallel. The memory table M3 is a ROM which stores waveform data for one symbol time with the effects of intersymbol interference taken into account by prior calculation. That is, it stores waveform data for all the patterns which the total of 3 bits comprising the symbol to be transmitted and symbols before and after can take. Now, let the waveform data for one symbol time comprise 8 samples. The counter C3 is a 3-bit counter, which counts up 8 times in one symbol time and repeats operation with one symbol time as one cycle. The memory table M3 designates a total of 6 bits as an address, which comprises 3-bit data pattern so3, an output of each stage of the shift register S3, and 3-bit output co3 of the counter C3 which represents the location in one symbol time, retrieves the waveform data at each time corresponding to the data pattern to be transmitted, and outputs the memory output mo3. The memory output mo3 is converted to continuous waveform wd3 at the D/A converter D3 and after smoothed at the lowpass filter L3, it becomes shaped waveform w13.

Next discussion will be made on the method for generating baseband signals after bandlimitation in the QPSK using this method. FIG. 5a shows data of the in-phase axis and quadrature axis extracted at every time slot from the transmission data string in the QPSK. Expressing this as a transition state for each time slot on the signal space produces FIG. 6. In FIG. 6, each signal point transitions at each time slot and the locus on the time axis of the orthogonal projection cast on the in-phase axis and quadrature axis of the coordinates of transitioning signal point represents the baseband signal waveforms of the in-phase axis and quadrature axis. FIG. 5b shows the baseband signal waveform of the in-phase axis and the quadrature axis corresponding to the in-phase axis and quadrature axis data shown in FIG. 5a before bandlimitation. When the baseband signal waveform of the in-phase axis and quadrature axis shown in FIG. 5b are band-limited with the intersymbol interference of the data pattern length taken into account, the baseband signal waveform after bandlimitation as shown in FIG. 5c can be obtained. The in-phase axis signal waveform and the quadrature axis signal waveform make the H level of waveform correspond to the data value "0" and the L level of waveform to "1" as shown in FIGS. 5b and 5c. In the case of the QPSK, since the baseband signal waveform of the in-phase axis is determined by the in-phase component of the coordinates of each signal point and that of the quadrature axis by the quadrature component, the data patterns of the in-phase axis and the quadrature axis can be obtained separately from the in-phase component and the quadrature component in the time slot. In addition, because the baseband signal waveforms for the same data pattern of the in-phase and quadrature axes become identical, the waveform data necessary for shaping baseband signal waveforms of in-phase and quadrature axes can be used in common. Consequently, the storage capacity can be reduced as shown in, for example, the Japanese Patent Application Laid Open No. 1-317090.

FIG. 7 is a block diagram of waveform shaping equipment for the QPSK by the above-mentioned conventional method. In FIG. 7, C6 is a clock generation circuit, DV6 a ½ frequency divider, DP6 a 2-bit shift register, SR6I a d-bit shift register, SR6Q a d-bit shift register, CO6 a n-bit counter, DS6 a data selector, M6 a L-bit output memory table, SR6 a L-stage 2-bit shift register, FF6I a flip-flop, FF6Qa flip-flop, PI6 a π-phase shift circuit, D6I a D/A converter, D6Q a D/A converter, L6I a low-pass filter, and L6Q a low-pass filter. ck6 is a system clock, ckd6 a divided clock, ckp6 a π-phase shift clock, dt6 a data string, dt6I an in-phase axis input data, dt6Q a quadrature axis input data, so6I an output of shift register SRI6, so6Q an output of shift register SRQ6, co6 a counter output, mo6 a memory output, wd6I an output of D/A converter D6I, wd6Q an output of D/A converter D6Q, w6I shaped continuous waveform of the in-phase axis, and w6Q shaped continuous waveform of the quadrature axis. For simplification, description will be made when the equipment treats the case in which d=3, n=2, and L=3.

The shift register DP6 takes the data string dt6 at every 1 clock while shifting, retains the latest 2-bit data, and outputs by allotting one bit each to the shift register SR6I and the shift register SR6Q. The shift register SR6I and the shift register SR6Q take in the output of shift register DP6 one bit at a time as in-phase axis data dt6I and quadrature axis data dt6Q while shifting every 2 clocks by the divided clock ckd6, hold the latest 3-bit data, respectively, and output the shift register output so6I and shift register output so6Q in parallel as a 3-bit data pattern for the in-phase axis and quadrature axis, respectively. Now, the waveform data for 1 symbol time comprises four samples, and using the 2-bit counter CO6 whose 1 symbol time is 1 cycle, part of the address of waveform data to be read out within one symbol time is specified based on the counter output co6. The memory table M6 which has a 3-bit output is a ROM which stores waveform data for 1 symbol time with the effects of intersymbol interference taken into account by prior calculation. That is, the ROM stores waveform data quantized by 3 bits for all patterns which can be taken by the total of 3 bits comprising the symbol to be transmitted and those before and after it. The shift register output so6I and shift register output so6Q which are data patterns of the in-phase axis and quadrature axis time-share the waveform data in the memory table M6 by being selected by the data selector DS6 alternately and becoming part of the address. The 3-bit memory output mo6 read out alternately from the data pattern of the in-phase axis and quadrature axis, respectively, are allotted to the flip-flop FF6I and flip-flop FF6Q by the 2-bit 3-stage shift register SR6, which shifts every 1 clock, and are taken in simultaneously to the flip-flow FF6I and flip-flop FF6Q by the clock timing ckp6 generated by the π-phase shift circuit PI6. In addition, the outputs of the flip-flop FF6I and flip-flop FF6Q are converted to the analog waveform wd6I of the in-phase axis and the analog waveform wd6Q of the quadrature axis via the D/A converter D6I and D/A converter D6Q, and after smoothed at the lowpass filter L6I and the low-pass filter L6Q, they are formed into the shaped waveform w6I, which is the baseband signal of the in-phase axis, and the shaped waveform w6Q, which is the baseband signal of the quadrature axis. FIG. 8 shows operation timing of each section of the equipment. In the case of QPSK, it has been possible to reduce the memory capacity to one half, which is required to store waveform data by the waveform shaping equipment shown in FIG. 7.

However, in the case of quadrature modulation in which the in-phase axis and quadrature axis baseband signal waveform to be read out must be determined based on both in-phase and quadrature components of the coordinates of the signal point corresponding to the transmission data, for example, in the π/4 shift QPSK and in the PSK-VP (phase shift keying with varied phase) system described in Pages 412–419 of the proceedings of the 40th IEEE Vehicular Technology Conference), it is impossible to extract the in-phase component and quadrature component data independently at the in-phase axis and quadrature axis for each time slot and form a data pattern.

This will now be described by way of example in the case of the π/4 shift QPSK. FIG. 9a shows the transmission data for each time slot in the π/4 shift QPSK. The signal point corresponding to the transmission data of each time slot takes the transition state as shown in FIG. 10 on the signal space. In FIG. 10, A9e shows the quadrature coordinate axis corresponding to the even-number time slot, and A9o shows the quadrature coordinate axis corresponding to the odd-number time slot when the quadrature coordinate axis A9e is rotated 45°. In FIG. 10, the signal point transitions every even-number time slot and odd-number time slot with the quadrature coordinate axis varied, and the locus of the orthogonal projection which the coordinates of the transitioning signal point cast on the in-phase axis and quadrature axis on the time axis represents the baseband signal waveform of the in-phase axis and that of the quadrature axis. FIG. 9b shows the baseband signal waveforms of the in-phase and quadrature axes before bandlimitation, which correspond to the transmission data shown in FIG. 9a. Band-limiting to the in-phase and quadrature axes baseband signal waveforms shown in FIG. 9b, produces the intersymbol interference and can provide the baseband signal waveform after the bandlimitation as shown in FIG. 9c. In the case of π/4 shift QPSK, in-phase and quadrature baseband signal waveforms corresponding to the transmission data depend on both in-phase and quadrature components of the coordinates of the signal point. That is, this is also apparent from the fact that the in-phase baseband signal waveforms read out at the timeslots t4 and t6 shown in FIG. 9b differ because in the even-number time slots t4 and t6 of FIG. 9a, each in-phase component takes the same data value "1," but each quadrature component differs. This means that for reading out waveform for both in-phase and quadrature axes, it is necessary to use as part of the address (1) the data pattern which comprises double bit number including both in-phase and quadrature components for each time slot and (2) the signal which selects quadrature coordinate axis either A9e or A9o respectively. In the case of π/4 shift QPSK, the same data pattern is used for the in-phase and quadrature axes, but because the baseband signal after bandlimitation of in-phase axis and quadrature axis to be read out for the same data pattern differs, respectively, it is unable to take a configuration to time-share the memory table as shown in FIG. 6 and it must be designed to store in separate memory tables, respectively, the baseband signal waveforms in all cases with the effects of inter-symbol interference from several symbols for the in-phase and quadrature axes taken into account.

However, in the configuration in which all the baseband signal waveforms for the above in-phase and quadrature data patterns are stored in separate memory tables, respectively, suppose that the number of symbols which have effects on the intersymbol interference is d, the number of samples in one symbol is n, and the quantization bit number of waveform data is L, the memory capacity required to retain the waveform data becomes $2 \times 2^{\wedge}(3d) \times L \times n$ bits in the case of the $\pi/4$ QPSK and $2 \times 2^{\wedge}(2d) \times L \times n$ bits in the case of the QPSK-VP, creating a problem that the memory capacity greatly increases as compared to $2^{\wedge}d \times L \times n$ bits of the QPSK.

When burst-like data strings are transmitted by each of the above systems, for example, in the case of FIG. 2b, abrupt rise and fall of waveform occur at the burst edge at the head and the trail of the data string at non-continuous points qb and qc, causing the spectrum to spread and the band to expand. Consequently, it becomes also necessary to shape the waveform smoothly at the burst edge. Conventionally, in waveform shaping at this kind of the burst edge, for example, as described in the Japanese Patent Application Laid Open No. 4-58622, waveform shaping is generally carried out by installing a variable gain amplifier or a variable attenuator at the portion where the waveform is amplified and varying the gain or attenuation rate smoothly at the start and at the end of data string.

The conventional burst waveform shaping equipment using the above-mentioned method will now be described with reference to the accompanying drawings.

FIG. 11 is a block diagram illustrating a conventional burst waveform shaping equipment and FIG. 12 is a diagram showing waveform at each section of the burst waveform shaping equipment in FIG. 11. In FIG. 11, WG10 is a continuous waveform shaping means, VA10 a variable gain amplifier, and CS10 a gain control signal generating means. In FIGS. 11 and 12, dt10 is a data string, wo10 a shaped continuous waveform, vo10 an output signal, and co10 a gain control signal.

The data string dt10 is the burst-like data composed by arranging preamble pre, information data info, and postamble post in that order as shown in FIG. 12. Of these, info is the data string to be transmitted and pre and post are data strings which do not carry information. The contents of pre and post may be optional but at this point, as an example, the 0101 4-bit data string is assumed for both.

The continuous waveform shaping means WG10 is a circuit similar to the above-mentioned waveform shaping equipment and outputs shaped continuous waveform wo10 which is shaped to have smooth waveform at the data continuing portion.

At first, the gain control waveform generating means CS10 generates the gain control signal co10 and controls the gain of the variable gain amplifier VA10. In this event, when the gain control signal co10 is zero, the gain of the variable gain amplifier VA10 is zero and as the gain control signal co10 increases, the gain also increases. The gain control signal co10 is zero in the period without data, smoothly increases from zero to a specified level in the period of preamble, holds the specified level during the period of information data, and smoothly decreases to zero from the specified level in the period of postamble. Consequently, the output signal vo10 outputted by the variable gain amplifier VA10 has a zero amplitude during the period without any data string to be transmitted, smoothly increases the amplitude in the preamble interval before the data string to be transmitted starts, and smoothly decreases the amplitude in the postamble interval when the data string to be transmitted ends.

With the above mentioned operation, the output signal vo10 is obtained by multiplying the output of the continuous waveform shaping means by the gain waveform of the variable gain amplifier, and because the waveform smoothly varies even at the head and the trail of the data string, the spread of spectrum during transmission of the burst-like data can be prevented.

When carrier transmission is carried out, it is common to generate baseband waveforms as the shaped continuous waveform wo10 and to carry out burst shaping using a variable gain amplifier at the high-frequency amplified portion after the carrier is modulated with wo10.

However, with the above-mentioned configuration, a variable gain amplifier for burst shaping and a gain control means are required in addition to the continuous waveform shaping means. Furthermore, to prevent spectrum spread, it is necessary to hold the gain change adequately gentle; this requires at least several symbols for the preamble and postamble lengths during the period when the gain is varied.

SUMMARY OF THE INVENTION

An object of this invention is to provide a waveform shaping equipment which can prevent band spread without excessively expanding the hardware scale by generating waste data carrying no information at the head and trail of the burst.

Another object of this invention is to provide a waveform shaping equipment which can achieve waveform shaping during data continuation and can prevent band spread at the head and the trail of the burst by allowing the memory table to take care of rising waveform and falling waveform for one symbol time with respect to the current time slot.

Still another object of this invention is to provide a waveform shaping equipment which can reduce the memory capacity required for the in-phase axis and quadrature axis baseband signal wave shape data in quadrature modulation signal generation of the modulation system with the constellation, in which all the coordinates of each signal point on the signal space at optional time in one symbol time is superimposed on every coordinates obtained by rotating 90° with the origin set as a center.

A waveform shaping equipment of the present invention using transmission data forming packets as inputs as well as transmission status signals for indicating whether the transmission data is inputted or not as inputs, forming data patterns successively from the transmission data, concatenating pulse waveforms read out based on the data patterns, generating and outputting signal waveforms corresponding to the packets, and designating to spare sequence predetermined periods at a start of readout of the pulse waveforms and at an end of completing readout of the pulse waveforms and designating to ordinary sequence a period for reading the pulse waveforms except the spare sequence period, the waveform shaping equipment comprises:

a pattern generating means for generating the data patterns based on the transmission data and the transmission status signals;

an addressing signal generating means for decoding the data patterns and generating addressing signals;

a control means for generating sequence change-over signals for controlling readout of pulse waveforms in the spare sequence and ordinary sequence and sample position signals for specifying a readout position in the present time slot;

a waveform generating means for generating pulse waveforms read out at the time of the spare sequence and pulse waveforms read out at the time of the ordinary sequence based on the addressing signals and sequence change-over signals;

an output means for smoothly concatenating successively pulse waveforms generated from the waveform generating means, wherein the transmission data and transmission status signals provided from outside the waveform shaping equipment are inputted to an input portion of the pattern generating means, and the transmission status signals provided from outside the waveform shaping equipment are inputted to an input portion of the control means, the data patterns are inputted to the addressing signal generating means, and the addressing signals, sequence change-over signals, and sample point signals are inputted to the waveform generating means, the pulse waveforms are inputted to the output means, and signal waveforms corresponding to the packets are generated from the output means.

Further the waveform shaping equipment comprises a first memory for generating according to address signal a first waveform which is the first half of the bandlimited pulse waveform corresponding to each symbol of the transmission data, a second memory for generating according to the address signal a second waveform which is the latter half of the bandlimited pulse waveform, and a waveform processing means for processing the first and second waveforms to produce the pulse waveform.

The present invention generates pulse waveforms for the predetermined data patterns for the predetermined period at the burst edge during packet transmission under the above-mentioned configuration to eliminate noncontinuous points of signal waveforms, thereby achieving waveform shaping free from the spread of band.

By dividing in advance the pulse waveforms for one symbol data into two parts: the first half and the second half, and storing the pulse waveforms in the memory table, there is no need to store waveforms of all the cases with intersymbol interference from several symbols taken into account, and when the packet transmission begins, waveform smoothly rises to output the first waveform, which is the first half of the pulse waveform, and when the packet transmission finishes, waveform smoothly falls to output the second waveform, which is the second half of the pulse waveform, and during the period when transmission data continues in the packet, the third waveform which is the sum of the second waveform which is the second half of the pulse waveform for the preceding data and the first waveform which is the first half of the pulse waveform for the succeeding data is continuously outputted, realizing the waveform shaping free from band spread.

In the case of modulation system in which the constellation coincides geometrically even the mapping which rotates each signal point on the signal space 90° with the origin set as the center at optional time during one symbol time, decomposing all the signal points in the constellation at every four signal points on the plurality of quadrature coordinate axes with different phases prevents the same waveform data from allowing access to the in-phase and quadrature axes simultaneously on the basic quadrature coordinate axis in one symbol time, and utilizing the property that the combination of waveform data to be read out for the in-phase and quadrature axes is specified in several forms enables sharing of waveform data between the in-phase and quadrature axes.

Because the present invention constitutes the first memory unit and the second memory unit with semiconductor memory, it can employ a configuration method suited for the VLSI technique, and can store either the first half or latter half of pulse waveform only for one symbol data, thereby requiring only a small memory capacity.

According to the present invention, because during the period with no data string to be transmitted, the output waveform is made to the zero level, and at the head of the data string to be transmitted, the first waveform which is the first half of the band-limited pulse waveform is outputted, and during the period thereafter to the trail of the data string to be transmitted, the third waveform which is the sum of the above-mentioned first and the second waveforms is outputted, and at the trail of the data string to be transmitted, the second waveform which is the second half of the band-limited pulse waveform is outputted, burst shaping and waveform shaping at the time of data continuation can be achieved with the same equipment, and burst shaping is enabled in a short time without requiring the preamble and postamble.

According to the present invention, in the case of the modulation system in which the constellation can geometrically coincide, even for the mapping to rotate 90° each signal point on the signal space with the origin set to the center in optional time during on symbol time, the waveform data can be shared with the in-phase and quadrature axes, enabling a small memory capacity.

BRIEF DESCRIPTION OF THE DRAWINGS

FIG. 3 is a diagram illustrating time sequence of the data pattern when the data pattern length w is set to 3.

FIG. 5a is a diagram illustrating transmission data for each time slot in conventional QPSK waveform shaping equipment.

FIG. 5b is a diagram illustrating baseband signal waveform of the in-phase and quadrature axes before bandlimitation based on the transmission data diagram shown in FIG. 5a.

FIG. 5c is a diagram illustrating baseband signal waveform of the in-phase and quadrature axes after bandlimitation based on the transmission data diagram shown in FIG. 5a.

FIG. 6 is a diagram illustrating the constellation in the QPSK based on the transmission data diagram shown in FIG. 5a.

FIG. 9a is a diagram illustrating the transmission data for each time slot in the conventional π/4 shift QPSK waveform shaping equipment.

FIG. 9b is a diagram illustrating baseband signal waveform of the in-phase and quadrature axes before bandlimitation based on the transmission data diagram shown in FIG. 9a.

FIG. 9c is a diagram illustrating baseband signal waveform of the in-phase and quadrature axes after bandlimitation based on the transmission data diagram shown in FIG. 9a.

FIG. 18 is a diagram illustrating the time sequence when the data pattern length w is set to 5 and 4-bit dummy data string is set.

FIG. 19 is a diagram illustrating the time sequence when the data pattern length w is set to 5 and 2-bit dummy data string is set.

FIG. 20 is a diagram illustrating the time sequence when the data pattern length w is set to 4 and 3-bit dummy data string is set.

FIG. 22 is a diagram illustrating the time sequence when the data pattern length w is set to 5 and no dummy data string is used.

FIG. 57 is a table showing an example of a first conversion on the signal space.

FIG. 58 is a table showing an example of a second conversion on the signal space.

FIGS. 59a and 59b are tables showing examples of waveform data to be stored in the first and second waveform memories in the tenth exemplary embodiment of the present invention.

FIGS. 60a, 60b, 60c and 60d are tables showing waveform data which is stored in memories.

FIGS. 61a, 61b, 61c and 61d are tables showing waveform data stored in the first and second waveform memories corresponding to the main slot.

FIGS. 62a and 62b are tables showing it is possible to assign four types of wave form data to the first and the second waveform memories with respect to each quadrature coordinate axis.

PREFERRED EMBODIMENTS OF THE INVENTION

The invention will now be described by way of examples with reference to the accompanying drawings.

Figure 1:
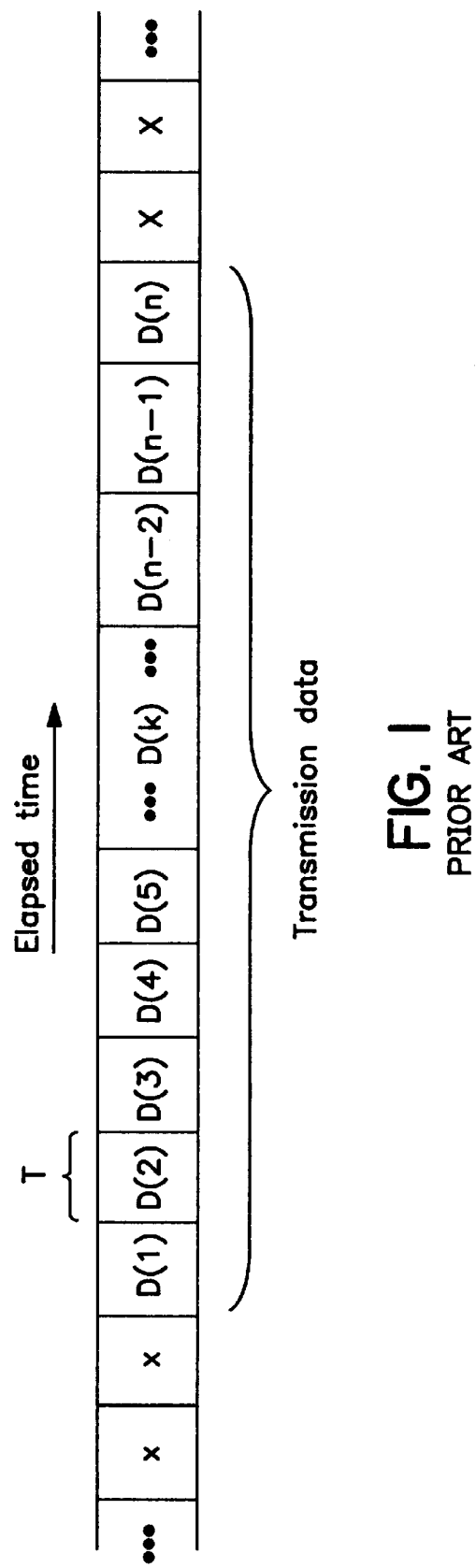
FIG. 1 is a diagram illustrating of transmission data for each unit time T.
Figure 2A:
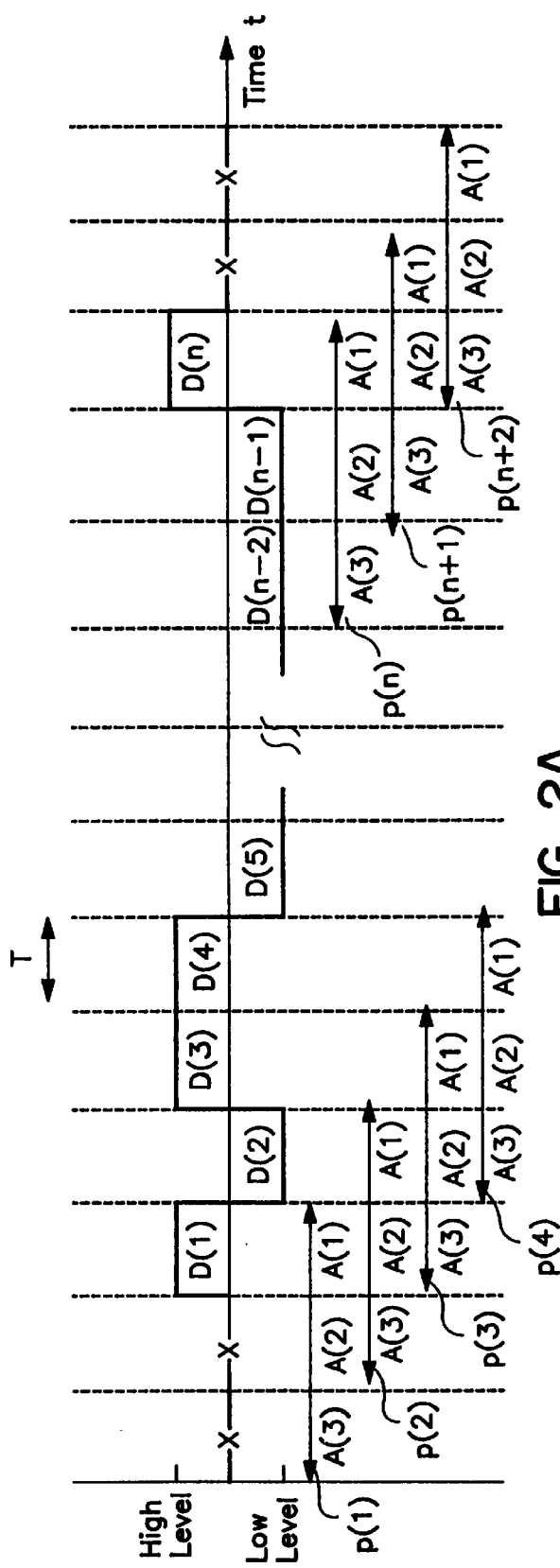
FIG. 2a is a diagram illustrating of the data pattern.
Figure 2B:
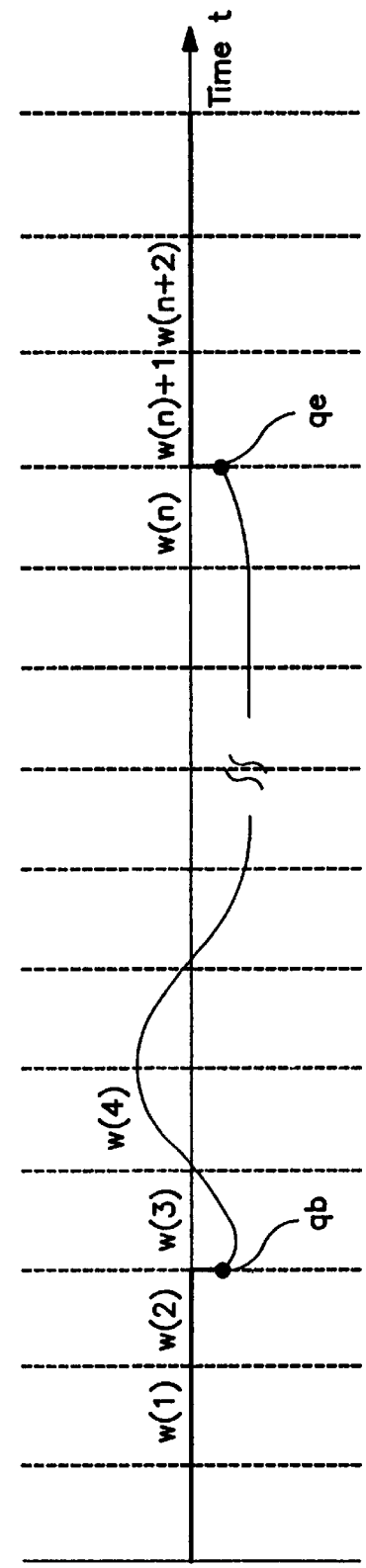
FIG. 2b is a diagram illustrating the baseband signal waveform after bandlimitation, which is read out based on the data pattern.
Figure 4:
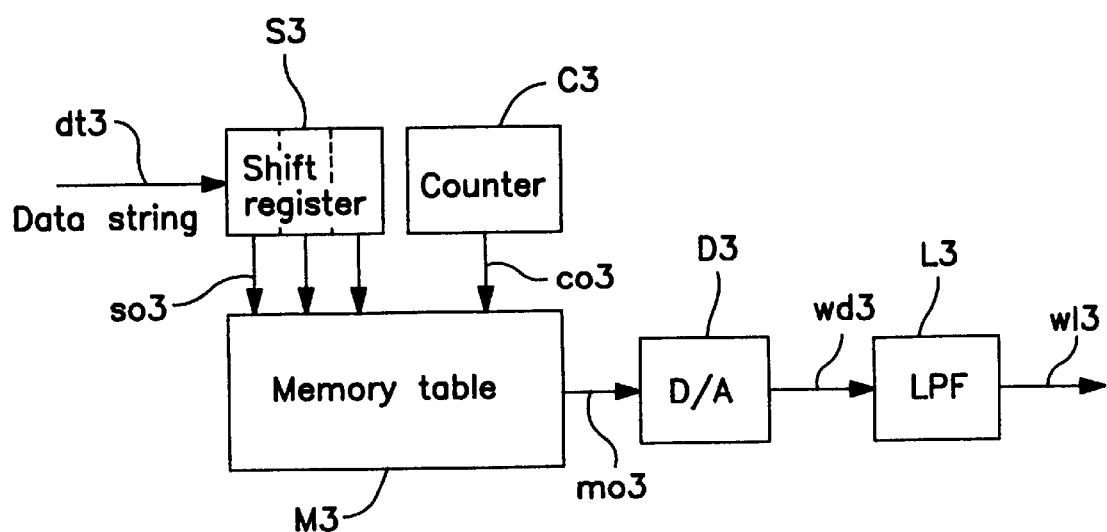
FIG. 4 is a schematic block diagram illustrating a prior art waveform shaping equipment.
Figure 6:
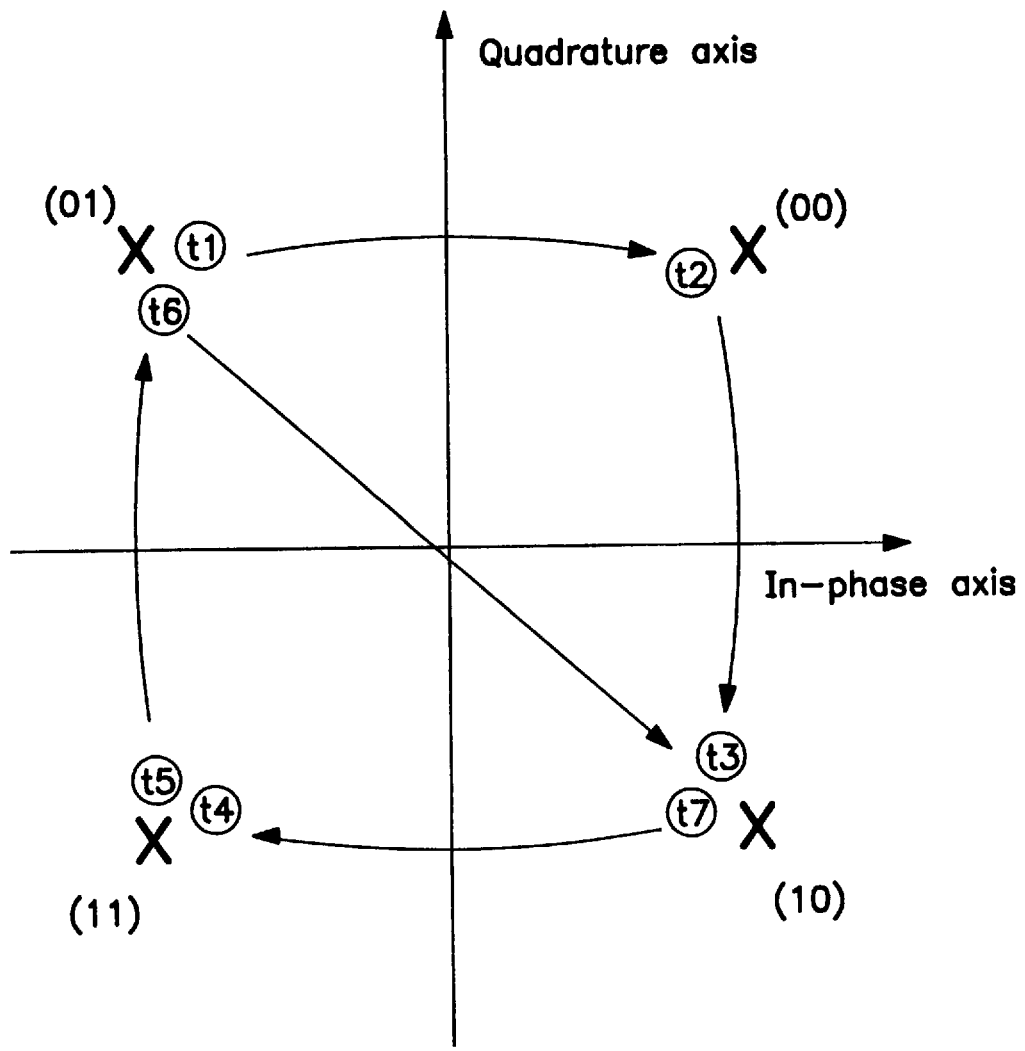
Figure 7:
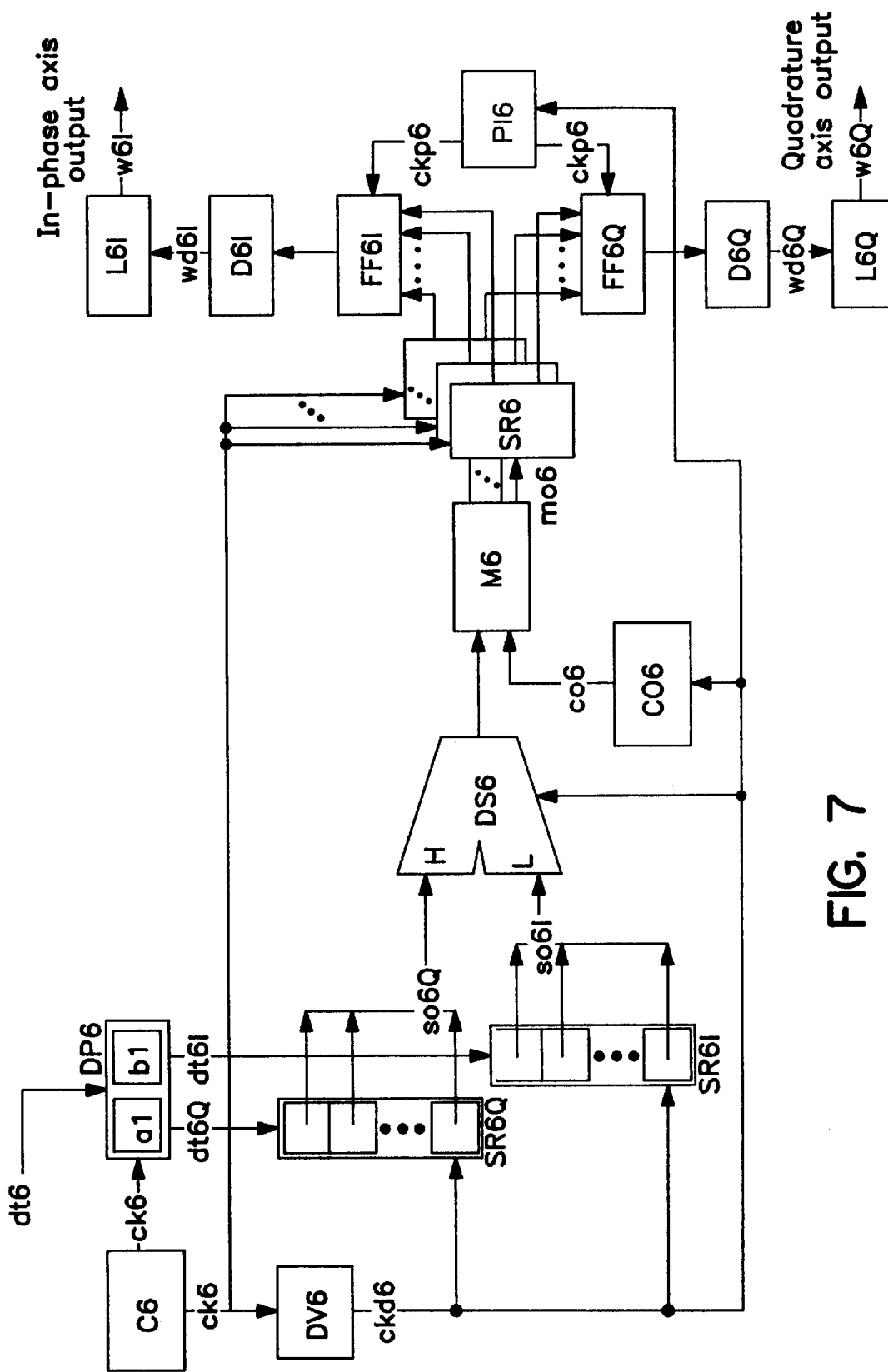
FIG. 7 is a block diagram illustrating one configuration of a conventional QPSK waveform shaping equipment with reduced memory capacity.
Figure 8:
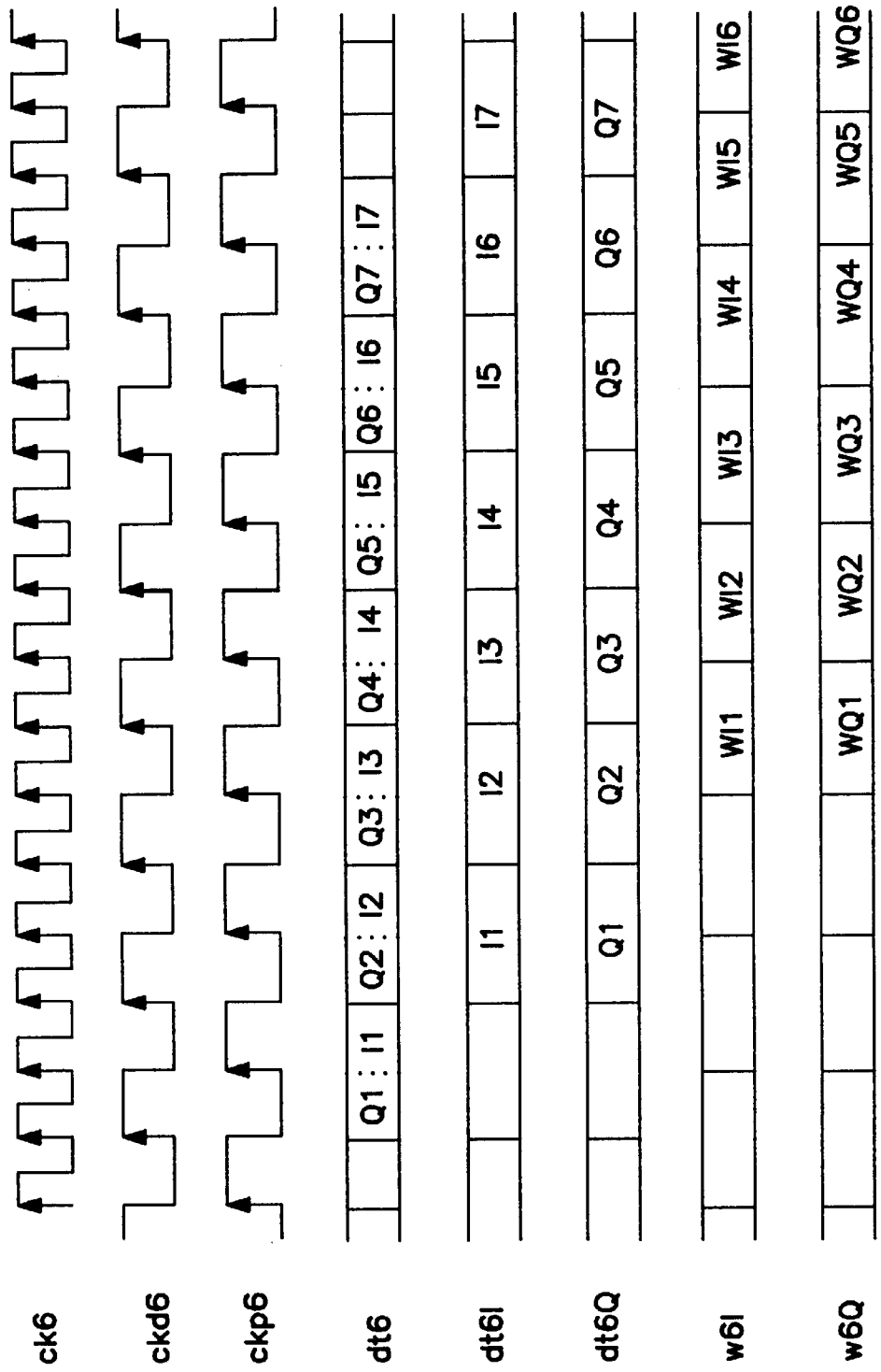
FIG. 8 is a diagram illustrating operation timing at each section in the equipment of FIG. 7.
Figure 10:
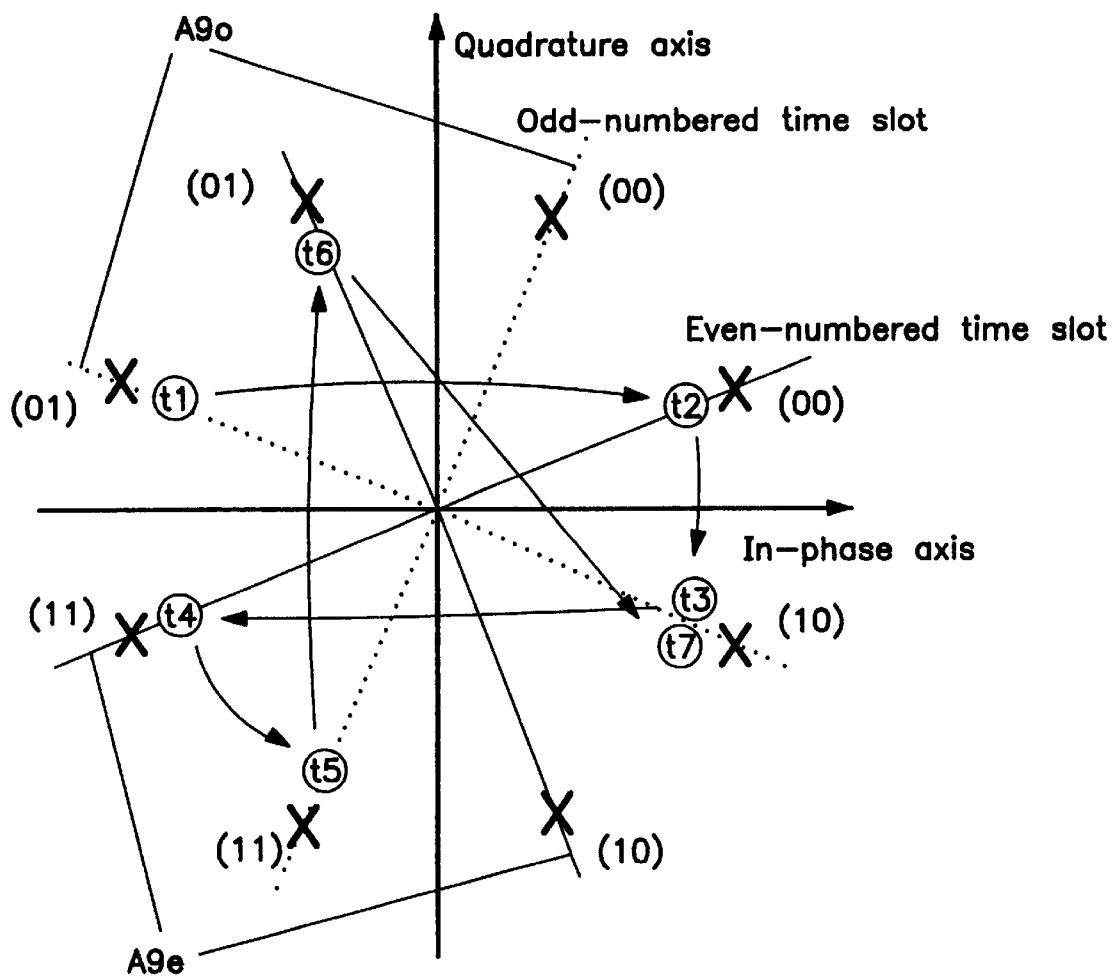
FIG. 10 is a diagram illustrating the constellation in the π/4 shift QPSK based on the transmission data diagram shown in FIG. 8.
Figure 11:
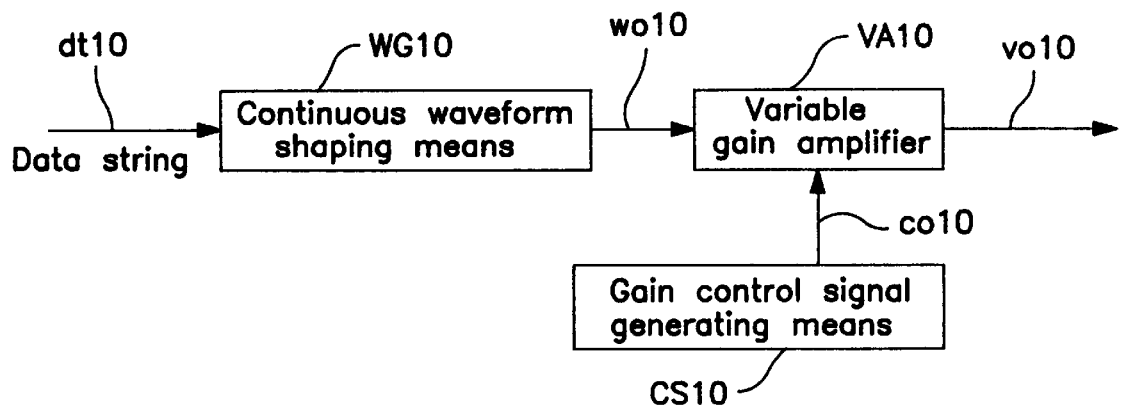
FIG. 11 is a block diagram of a conventional burst waveform shaping equipment.
Figure 12:
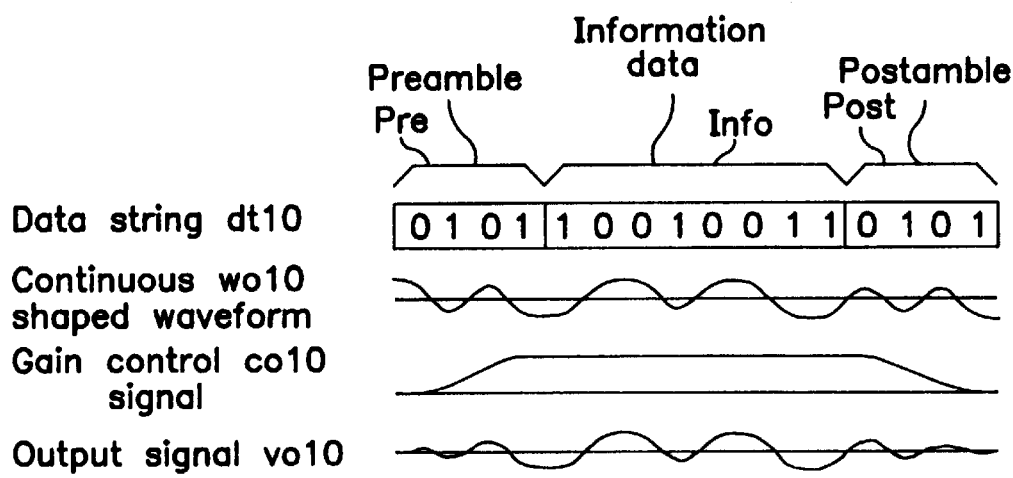
FIG. 12 is a diagram illustrating signal waveforms of each section of the conventional burst waveform shaping equipment.
Figure 13:
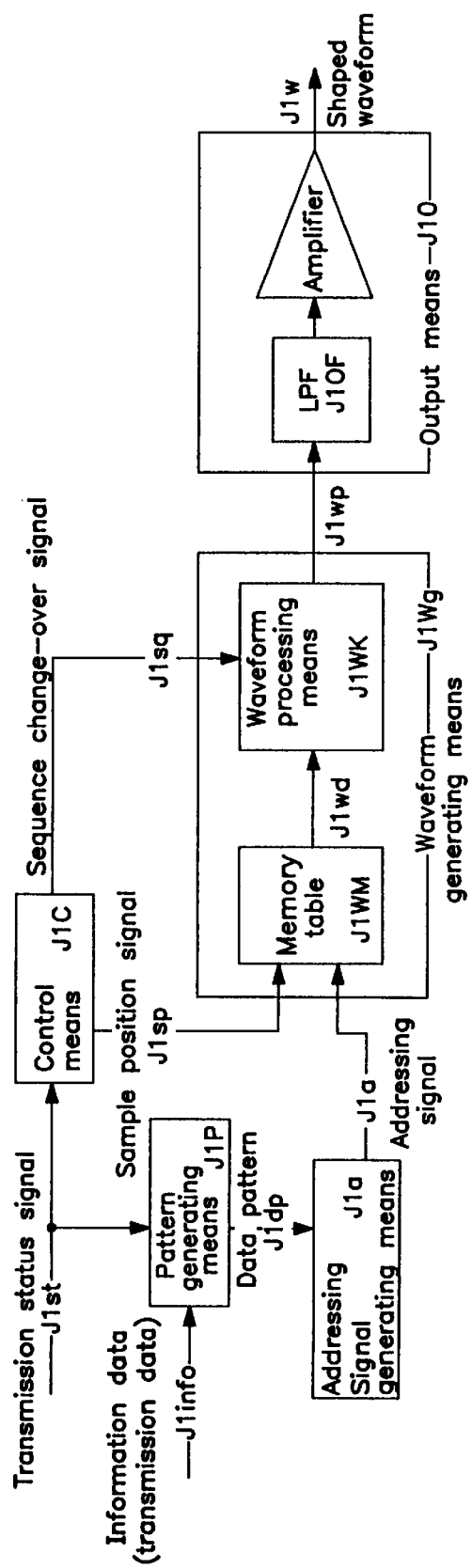
FIG. 13 is a block diagram of the waveform shaping equipment according to the 0th embodiment of the present invention.

FIG. 13 shows a basic configuration illustrating the 0th embodiment of the waveform shaping equipment according to the present invention. The description will be made with reference to FIG. 13.

To the input of the pattern generator J1P, the information data J1info and the transmission status signal J1st which provide information whether information J1info is entered or not are inputted successively from outside the waveform shaping equipment. At the pattern generator J1P, the data pattern J1dp of a specified number of bits is generated in the specified number.

To the address generator J1A, the data pattern J1dp is inputted. At the address generator J1A, the address signal J1a is generated so as to be used for part of readout of pulse waveform in the memory table by decoding the data pattern J1dp.

To the control means J1C, transmission status signal J1st is inputted from outside the wave shaping equipment. The control means J1C generates sequence change-over signals J1sq for controlling mode change-over from spare sequence to ordinary sequence or ordinary sequence to spare sequence in the waveform generator by taking out from the transmission status signal J1st the information whether the information data J1info is inputted. At the control means J1C, the sample point signal J1sp is generated for specifying the present readout point in the present time slot.

To the waveform generator J1Wg, the address signal J1a, sequence signal J1sq, and sample point signal J1sp are inputted. The waveform shaping equipment J1Wg comprises a memory table J1WM and a waveform processor J1WK, while the waveform processor J1WK has a D/A converter. To the memory table, address signal J1a and sample signal J1sp are inputted, and with these signals, the digital waveform value J1wd is read out. To the waveform processor J1WK, waveform value J1wd and sequence change-over signal J1sq are inputted, and the analog pulse waveform J1wp which has a given amplitude in one sample time is generated through the D/A converter after a specified calculation is carried out with respect to the inputted waveform value based on the sequence change-over signal J1sq.

To the output device J1O, the pulse waveform J1wp is inputted. The output device J1O smoothes the pulse waveform J1wp which forms staircase waveform after D/A conversion with the low-pass filter J1OF and shapes to the signal waveform which has a specified band component only, and further level-converts to a specified voltage and range-converts to a specified amplitude. That is, from the output device, the shaped waveform J1w of the waveform shaping equipment is obtained.

Figure 14:
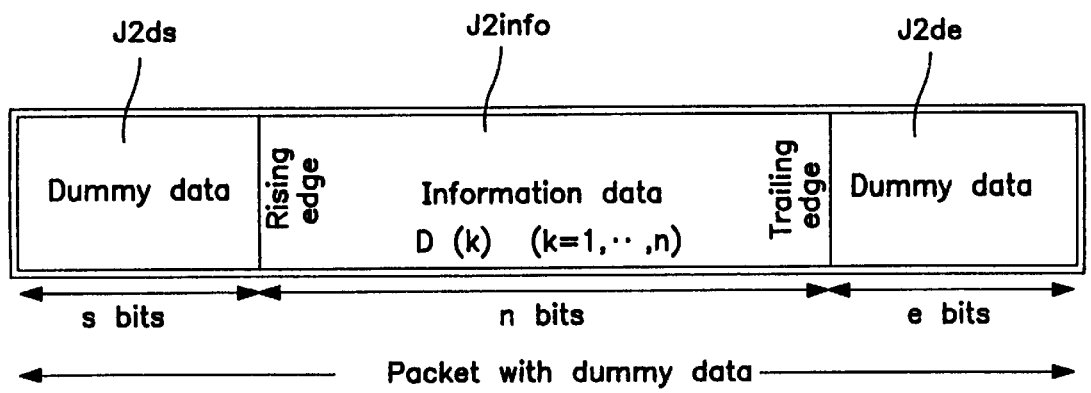
FIG. 14 is a diagram illustrating the configuration of a packet with dummy data.

First, FIG. 14 is a diagram illustrating the configuration of the packet with dummy data to be used in the present invention.

In FIG. 14, the packet with dummy data comprises the transmission data of (n+s+e) bit, where the n-bit transmission data in the packet is designated to information data J2info and s-bits and e-bits at the head and the trail of the packet to dummy data. Of the dummy data, the s-bit at the head is designated as predummy data J2ds and the e-bit at the trail as postdummy data J2de.

Figure 15:
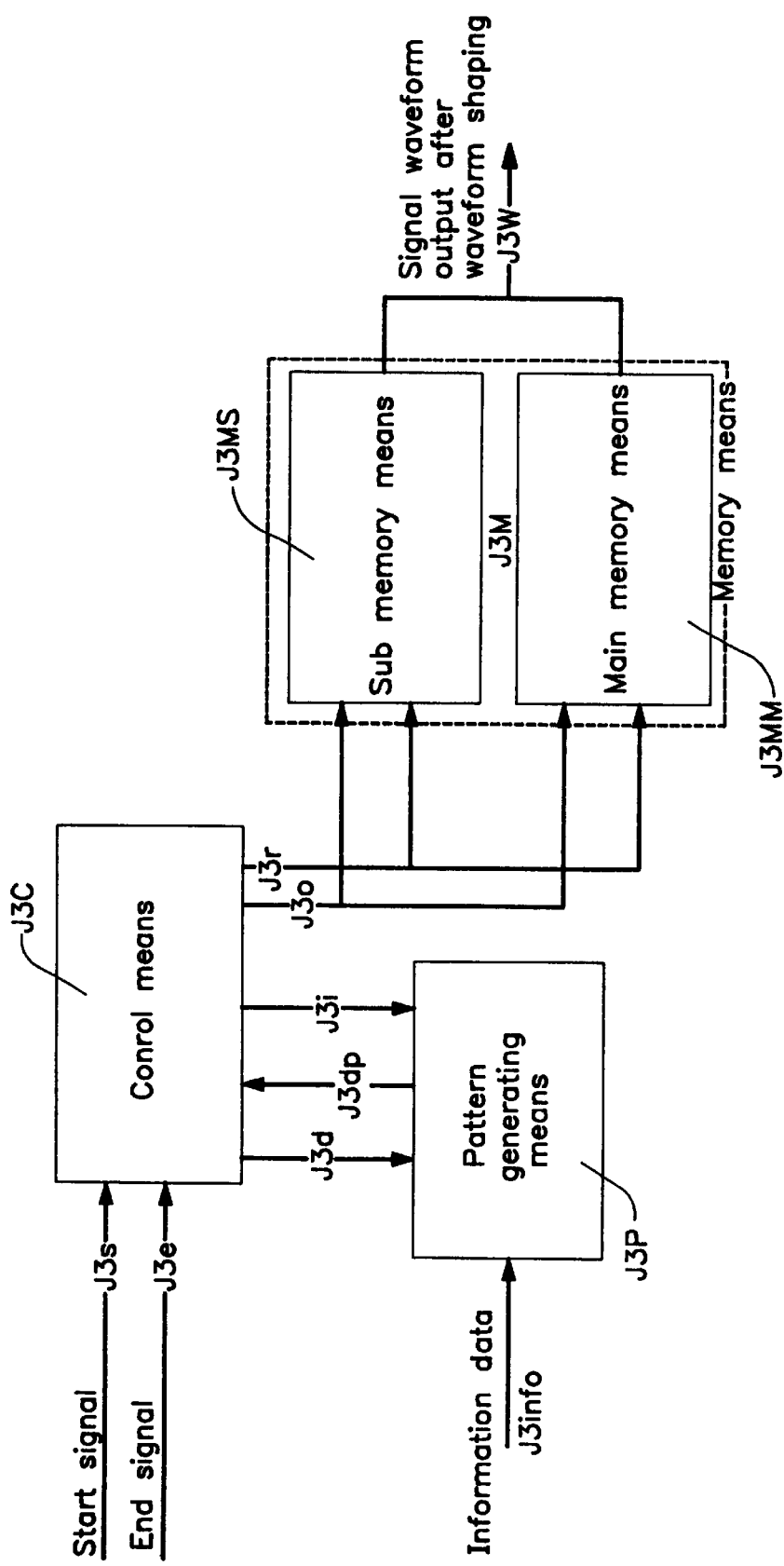
FIG. 15 is a block diagram of the waveform shaping equipment according to the 1st, 2nd, and 3rd embodiments (and the 3rd embodiment) of the present invention.

FIG. 15 is a schematic block diagram illustrating basic configuration of the first, second, third, and fourth embodiment of the waveform shaping equipment according to the present invention.

To the input of the pattern generator J3P, information data J3info is successively inputted from outside of the waveform shaping equipment, and at the pattern generator J3P, dummy data J3d generated from the control means J3c is added to the head and the trail of the information data string J3info to form a packet with dummy data, and part of the packet with dummy data is extracted to generate the data pattern J3dp. To the control means J3C, the transmission status signal which advises the presence of information data J3info is inputted from outside of the waveform shaping equipment as start signal J3s and end signal J3e. The start signal J3s is a signal to input the pulse wave for triggering as soon as the head of the information data J3info is inputted and the end signal J3e is a signal to input the pulse wave for triggering as soon as the trail of the information data J3info is inputted. The control means J3C generates dummy data J3d for the pattern generator J3P for a specified period a specified time after these start signal J3s/end signal J3e are inputted. The control means J3C generates input control signal J3i, output control signal J3o, and readout signal J3r based on the data pattern J3dp and start signal J3s/end signal J3e. The input control signal J3i is a control signal for allowing the pattern generator J3P to select either information data J3info or dummy data J3d and to constitute a packet with dummy data, the output control signal J3o is a control signal for selecting either main memory means J3MM or sub-memory means J3SM in the memory means J3 to be used for each sequence, and the readout signal J3r is a signal to serve as an address for specifying partial waveform to be read out from the main memory J3MM and the sub memory means J3SM respectively. The output control signal J3o and readout signal J3rare inputted to the main memory means J3MM and the sub memory means J3SM, which read out partial waveform using part of the output control signal J3o and readout signal J3r, respectively. The read out partial waveform is concatenated successively at the output section of each memory means and the signal waveform J3w which has the waveform shaped is outputted.

Figure 16:
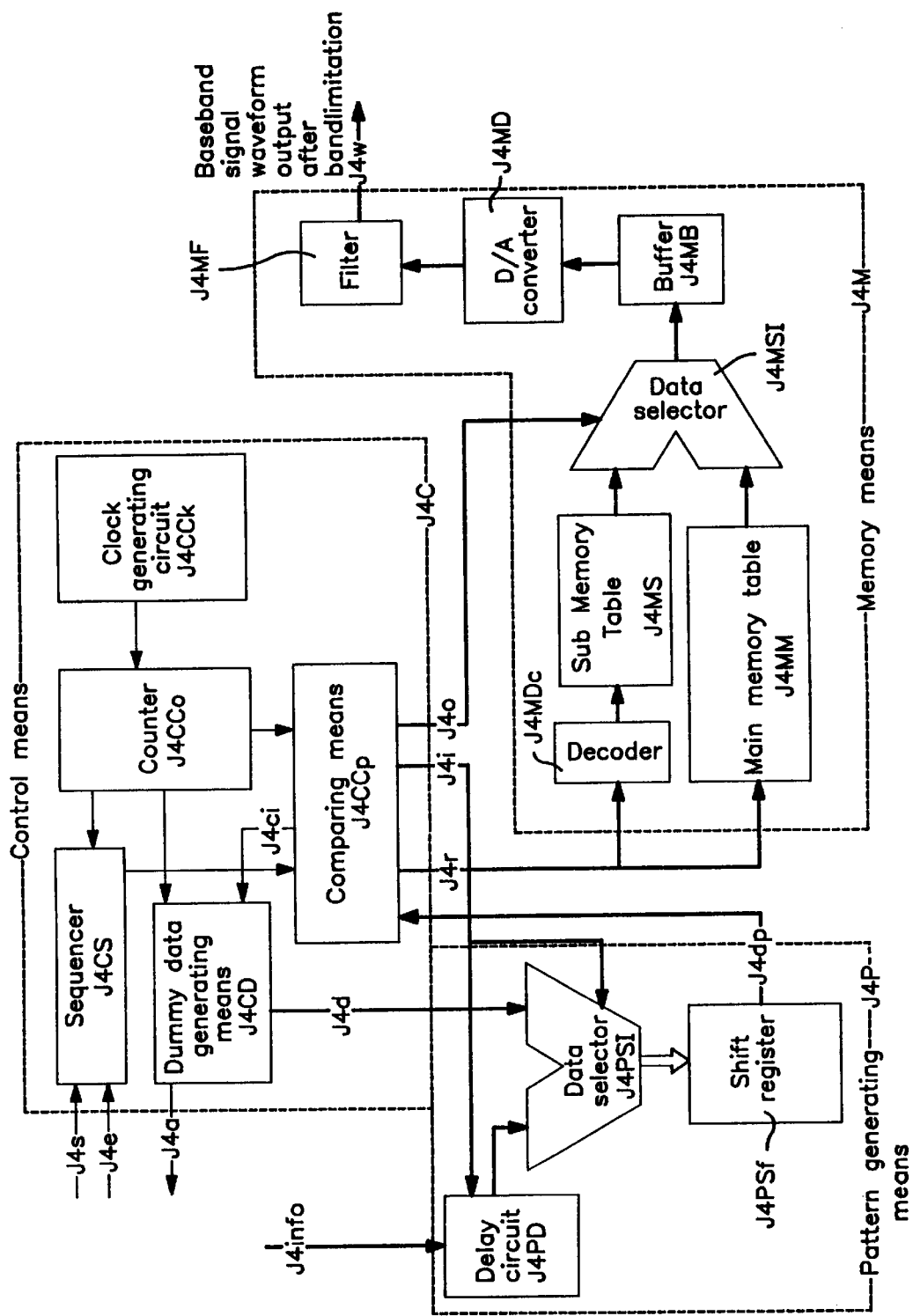
FIG. 16 is a detailed drawing illustrating one example where the memory unit in the waveform shaping equipment shown in FIG. 15 comprises semiconductor memory, the pattern generator comprises a shift register, and the control comprises a sequencer.

FIG. 16 is a schematic block diagram illustrating exemplary configuration of the waveform shaping equipment in which the memory means comprises a semiconductor memory, data selector, buffer, D/A converter, and filter, the pattern generator comprises a delay unit, data selector, and shift register, and the control means comprises a clock generator, counter, sequencer, comparing unit, and dummy data generator in FIG. 15.

Description on FIG. 16 is made as follows.

In the pattern generator J4P, the information data J4info delayed for a certain time (D=KT) from the point where the start signal J4s is applied is inputted to the data selector J4PSl by the dummy data J4d or the delay unit J4PD. The delay unit J4PD comprises a shift register. The data selector J4PSl is selected by the input control signal J4i, and inputs dummy data J4d when the dummy data J4d is generated, or otherwise, inputs the delay unit output J4PD to the shift register J4PSf. The shift register J4PSf shifts every unit time T in synchronism with the data clock (1/T). The parallel output of the shift register J4PSf generates the data pattern J4dp with the output having w bits. This data pattern J4dp is inputted to the control means J4C and inputted to the main memory table J4MM and sub memory table J4SM as it is as part of the readout signal J4r.

In the control means J4C, the counter J4CCo operates on the sampling clock (1/t) generated at the clock generation circuit J4CCk. The output of this counter J4CCo shows the sampling point in the present time slot and forms, as it is, part of the readout signal J4r for instructing the address of each memory table. The sequencer J4CS operates in synchronism with the data clock which is divided by 2^n for the sampling clock (1/t) generated by the clock generation circuit J4CCk, and holds the transition state every unit time T after the start signal J4s/end signal J4e are applied for a predetermined period. The comparing unit J4CCp compares the information in the comparing unit with the output of the counter J4CCo and that of the sequencer J4CS, generates the input control signal J4i and output control signal J4o as well as readout signal J4r and internal control signal j4ci, and times each sequence. The dummy data generator J4CD generates the acknowledge signal J4a and the dummy data J4d to be used at intervals of unit time T based on the internal control signal J4ci from the comparing unit J4CCp.

In the memory means J4M, the main memory means is designated as the main memory table J4MM and sub memory means as the sub memory table J4MS. To the main memory table J4MM which is accessed in the ordinary sequence, partial waveforms of baseband signal waveforms after bandlimitation for all binary patterns are written. To the sub memory table J4MS accessed in the spare sequence, partial waveforms of the baseband signal waveforms after bandlimitation are written with respect to ternary patterns for every unit time T shift of the dummy data to be used. The period of this spare sequence is determined by the pattern length w. To the main memory table J4MM and the sub memory table J4MS, the readout signal J4r generated at the control means J4C is inputted, and to the data selector J4MS, the output control signal J4o generated at the control means J4C is inputted, respectively. The main memory table J4MM reads out partial waveform utilizing the output of the counter J4CCo, which is part of the readout signal J4r, and the data pattern J4dp. In the similar manner, the sub memory table J4MS reads out partial waveform utilizing the output of the counter J4CCo, which is part of the readout signal J4r, the data pattern J4dp, and sub memory table control signal. The read out partial waveform is concatenated successively at the output section of the buffer J4MB by selecting the data selector J4MSl with the output control signal in accordance with each sequence as well as sampling and holding at the buffer J4MB. The concatenated signal waveform is smoothed by the filter J4MF after it passes the D/A converter J4MD and the baseband signal waveform J4w after bandlimitation is generated. Now, if the dummy data string to be used is specified, because it is only required to read out partial waveform of the baseband signal after bandlimitation with respect to the constantly fixed pattern for the spare sequence sequentially from the sub memory table J4MS, the memory capacity of the sub memory table J4MM to be used for the spare sequence can be greatly reduced by preparing a decoder J4MDc at the sub memory table input section and carrying out the readout in accordance with part of the readout signal J4r.

Figure 17:
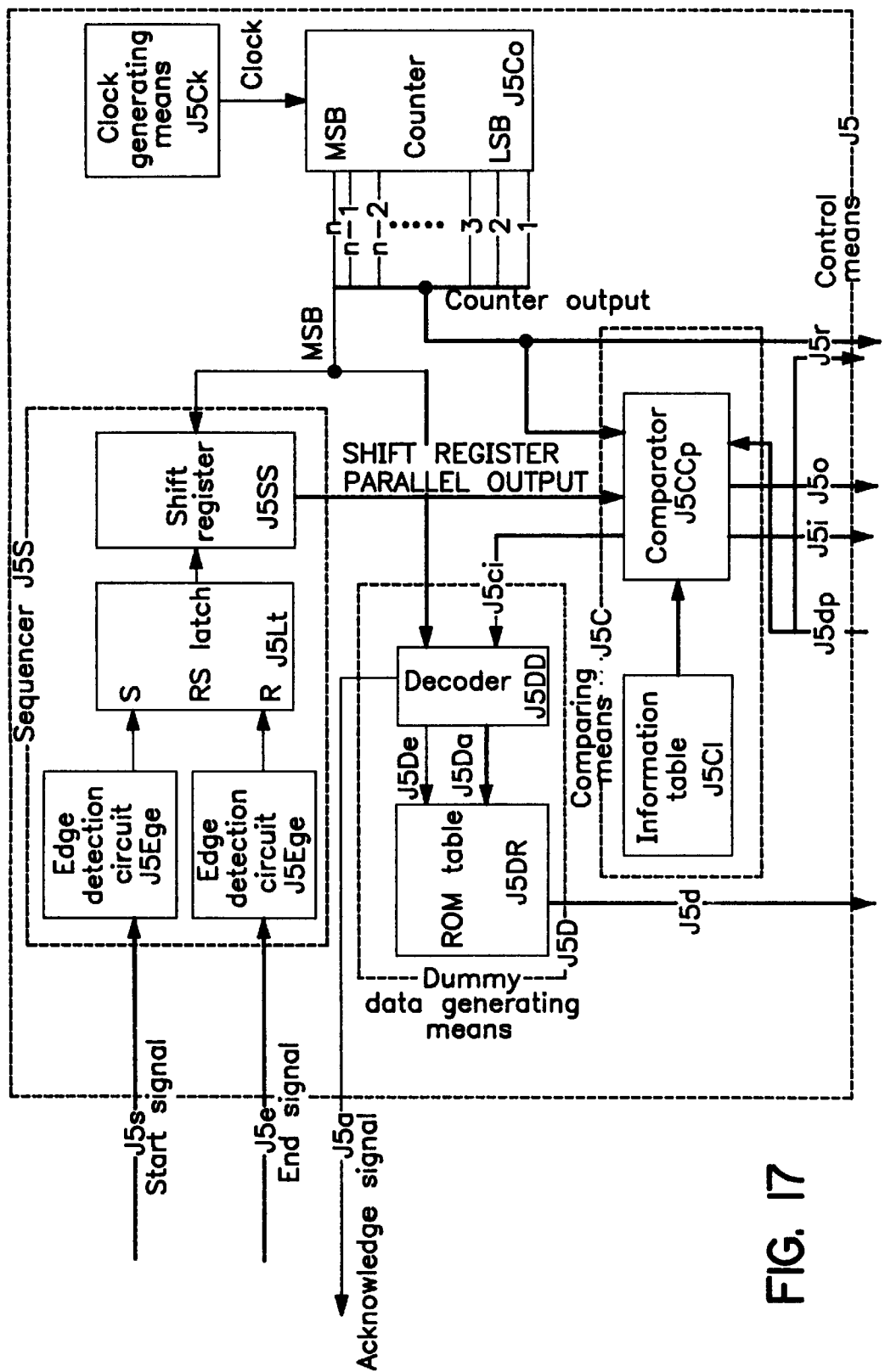
FIG. 17 is a diagram illustrating one example of the control in the waveform shaping equipment which comprises a sequencer.

FIG. 17 illustrates an exemplary configuration of a control means when the sequencer J4CS of the control means of FIG. 16 is formed with a shift register J5Sf, edge detection circuits J5Egs, J5Ege, and a latch J5Lt, the comparing unit J4CCp with a comparator J5CCp, buffer J5CB, and information table J5CI, and the dummy data generator J4CD with a decoder J5DD and ROM J5DR.

Now FIG. 17 is described as follows.

The clock generation circuit J5Ck generates the sampling clock (1/t) for realizing the sampling interval t of 2^n partial waveforms in 1 time slot. This sampling clock forms the operation clock of the counter J5Co.

The counter J5Co has n-bit output, its MSB is the clock with the sampling clock (1/t) generated by the clock generation circuit J5Ck divided by 2^n, and serves as the data clock (1/T) for the entire waveform shaping equipment. The n-bit output of the counter J5Co indicates the sampling point in the present time slot and is inputted to the comparing unit J5CC.

In the sequencer J5S, the shift register J5Sf operates in synchronism with the data clock (1/T). At the input section of the sequencer J5S, there are edge detection circuit sJ5Egs, J5Ege which detect the rising edges of the start signal and end signal, respectively, and generates specified pulses. The output of the edge detection circuit J5Egs is inputted to the set side of RS latch 5J5Lt on the next stage, and the output of the edge detection circuit J5Ege is inputted to the reset side of the RS latch 5J5Lt, respectively. The output of the RS latch J5Lt is inputted to the shift register, and when the start signal is inputted, it inputs the logical value "1" to the shift register J5Sf and when the end signal is inputted, it inputs the logical value "0". The number of shifts L of the shift register J5Sf requires the number enough to express all the transition states for each unit time T in the spare sequence, and the parallel output of the shift register J5Sf is inputted to the comparing unit J5CC.

In the comparing unit J5CC, the information table JC5 control information which is compared in extracting timing of the comparator J5CCp. The comparator J5CCp takes out the positional information of the change-over edge between the logical values "1" and "0" from the output of the sequencer J5S and extracts timing by collating the positional information and the output of the counter J5Co with the information table J5I. In addition, comparator J5CCp has a decoder inside and based on the extracted timing, it generates input control signal J5i, output control signal J5o, readout signal J5r, and internal control signal J5ci. The readout signal J5i comprises data pattern J5dp and output of counter J5Co.

In the dummy data generator J5D, the decoder J5DD outputs address signal J5Da for reading out dummy data J5d to be used from ROM table J5dr and enable signal J5De for controlling generation and stopping of dummy data J5d. In addition, the decoder J5DD returns the acknowledge signal J5a for informing the receipt of the start signal J5s and end signal J53. The dummy data J5d read out from ROM table J5DR is outputted successively to the pattern generation circuit at every time intervals T.

Referring now the configuration drawings of FIG. 16 and FIG. 17, the first, second, and third embodiments are described.

FIG. 18 illustrates a time sequence expressing a data pattern forming process in the first embodiment according to the present invention when the hardware is configured based on the schematic block diagrams shown in FIG. 16 and FIG. 17. In the first embodiment, the pattern length w is 5 and dummy data string 4 bits, and {1, −1, 1, −1} is used for the predummy data and {−1, 1, −1, 1} for the postdummy data.

Now, the specific description will be made on the generation timing of the input control signals, output control signals, and readout signals from the comparing unit in the case of this first embodiment.

In this first embodiment, D (k) (k=1, . . . , n) denotes the information data. Each 1T, 2T, . . . , (n+14)T shows the elapsed time for every unit time T, and A (1), A (2), . . . , A (5) denote each time slot in the pattern, respectively. Now, the present time slot is A (3). In this first embodiment, the number of shifts of the delay unit is designated as K=4 and the number of shifts of the shift register as L=9.

Observation of the time sequence shown in FIG. 18 indicates that time 1T to 5T and time (n+10)T to (n+14)T coincide with the spare sequence containing data value 0 and time 6T to (n+9)T with the ordinary sequence comprising binary values of 1 and −1. In the period from time 2T to 5T, the dummy data corresponding to the predummy data is generated from the dummy data generator, while in the period from time (n+6)T to (n+9)T, the dummy data corresponding to the post dummy data string is generated. The input control signal generated by the comparing unit selects the data selector in the pattern generator and allows the shift register in the sequencer to input the dummy data during this period. Because in this first embodiment, the dummy data string to be used is specified to one set and no information data is always included in the pattern during the spare sequence, the partial waveform is read out by a constantly fixed pattern. That is, in the time section 1T of the spare sequence, it is allowed to read out partial waveforms by the pattern {0, 0, 0, 0, 0} in the time section 1T of the spare sequence and by the pattern {0, 0, 0, 0, 1} in the time section 2T of the spare sequence, and this same principle applies to the time section 3T, 4T, 5T, (n+10)T, (n+11)T, (n+12)T,(n+13)T, and (n+14)T. Therefore, in the spare sequence, the comparing unit combines the sub memory table control signals obtained by decoding the parallel output of the shift register with the counter output, generates the readout signal for sub memory table access, and reads out partial waveforms. In the ordinary sequence, the comparing unit combines the data pattern and counter output as it is, generates the read out signal for main memory table access, and reads out partial waveforms. The control signal generated by the comparing unit may change over the data selector from the sub memory table to the main memory table at the timing of time 5T to 6T and from sub memory table to main memory table at the timing of time (n+9)T to (n+10) T. In this first embodiment, the period of the ordinary sequence from 8T to (n+7)T has the information data contained in the present time slot A(3), which is actually the transmission of information data.

FIG. 19 illustrates a time sequence representing the forming process of the data pattern in the second embodiment according to the present invention when the hardware is configured based on the configuration drawings shown in FIG. 16 and FIG. 17. In the second embodiment, the pattern length w is 5 and dummy data string 2 bits, and {1, −1} is used for the predummy data and {−1, 1} for the postdummy data.

Now, the specific description will be made on the generation timing of the input control signals, output control signals, and readout signals from the comparing unit in the case of this second embodiment.

In this second embodiment, D (k) (k=1, . . . , n) denotes the information data. Each 1T, 2T, . . . , (n+10)T shows the elapsed time for every unit time T, and A (1), A (2), . . . , A (5) denote each time slot in the pattern, respectively. Now, the present time slot is A (3). In this second embodiment, the number of shifts of the delay unit is designated as K=2 and the number of shifts of the shift register as L=7.

Observation of the time sequence shown in FIG. 19 indicates that time 1T to 5T and time (n+6)T to (n+10)T coincide with the spare sequence containing data value 0 and time 6T to (n+9)T with the ordinary sequence comprising binary values of 1 and −1. In the period from time 2T to 3T, the dummy data corresponding to the predummy data is generated from the dummy data generator, while in the period from time (n+4)T to (n+5)T, the dummy data corresponding to the post dummy data string is generated. The input control signal generated by the comparing unit selects the data selector in the pattern generator and allows the shift register in the sequencer to input the dummy data during this period. Because in this second embodiment, the dummy data string to be used is specified to one set and no information data is included in the pattern in the time section 2T, 3T and time section (n+8)T, (n+9)T in the spare sequence, the comparing unit combines the sub memory table control signals obtained by decoding the parallel output of the shift register with the counter output, generates the readout signal for sub memory table access, and reads out partial waveforms. In the time sections 4T, 5T and time sections (n+6)T, (n+7)T, because the information data is included in the pattern, the read out signal waveforms depend on the information data included in it. Therefore, in this period, the comparing unit combines the sub memory table control signals obtained by decoding the parallel output of the shift register and part of data pattern and counter output to generate the readout signal, and reads out partial waveforms from the sub memory table using it as an address. In the ordinary sequence, the comparing unit combines the data pattern and counter output as it is, generates the readout signal for main memory table access, and reads out partial waveforms. The output control signal is only required to change over the data selector from the sub memory table to the main memory table at the timing of time 5T to 6T and from sub memory table to main memory table at the timing of time (n+5)T to (n+6)T. In this second embodiment, the information data is transmitted during the period from time 6T to time (n+5)T. In this second embodiment, the hardware of the control means becomes complicated as compared to the first embodiment, but the time required from the start to the end of transmission of information data can be shortened by 2 time slots.

In these first and second embodiments, discussion was made on the case when the pattern length (w=5) is an odd number, but the same principle can be applied to the case when the pattern length w is an even number.

FIG. 20 illustrates a time sequence expressing a data pattern forming process in the third embodiment according to the present invention when the hardware is configured based on the schematic block diagrams shown in FIG. 16 and FIG. 17. In the third embodiment, the pattern length w is 4 and dummy data string 3 bits, and {1, −1, 1} is used for the predummy data and {−1, 1, −1} for the postdummy data.

Now, the specific description will be made on the generation timing of the input control signals, output control signals, and readout signals from the comparing unit in the case of this third embodiment.

In this third embodiment, D (k) (k=1, . . . , n) denotes the information data. Each 1T, 2T, . . . , (n+11)T shows the elapsed time for every unit time T, and A (1), A (2), A (3), A (4) denote each time slot in the pattern, respectively. Now, the present time slot is located between A (2) and A (3) so that the effects of each data in the pattern before and after the present time slot on the present time slot becomes uniform. In this third embodiment, the number of shifts of the delay unit is designated as K=3 and the number of shifts of the shift register as L=7.

Observation of the time sequence shown in FIG. 20 indicates that time 1T to 4T and time (n+8)T to (n+11)T coincide with the spare sequence containing data value 0 and time 5T to (n+7)T with the ordinary sequence comprising binary values of 1 and −1. In the period from time 2T to 4T, the dummy data corresponding to the predummy data is generated from the dummy data generator, while in the period from time (n+5)T to (n+7)T, the dummy data corresponding to the post dummy data string is generated. The input control signal generated by the comparing unit selects the data selector in the pattern generator and allows the shift register in the sequencer to input the dummy data during this period. Because in this third embodiment as well, the dummy data string to be used is specified to one set and no information data is always included in the pattern during the spare sequence, the partial waveform is read out by a constantly fixed pattern, which is the same as in the case of the first embodiment. The output control signal generated by the comparing unit may change over the data selector from the sub memory table to the main memory table at the timing of time 4T to 5T and from sub memory table to main memory table at the timing of time (n+7)T to (n+8) T. In this embodiment, the information data is transmitted in the period from time 6T to (n+6)T.

As described above, in these first, second, and third embodiments, the sequencer is formed by the use of a shift register, but the same effects can be obtained even when the sequencer is formed by the use of a counter.

Figure 21:
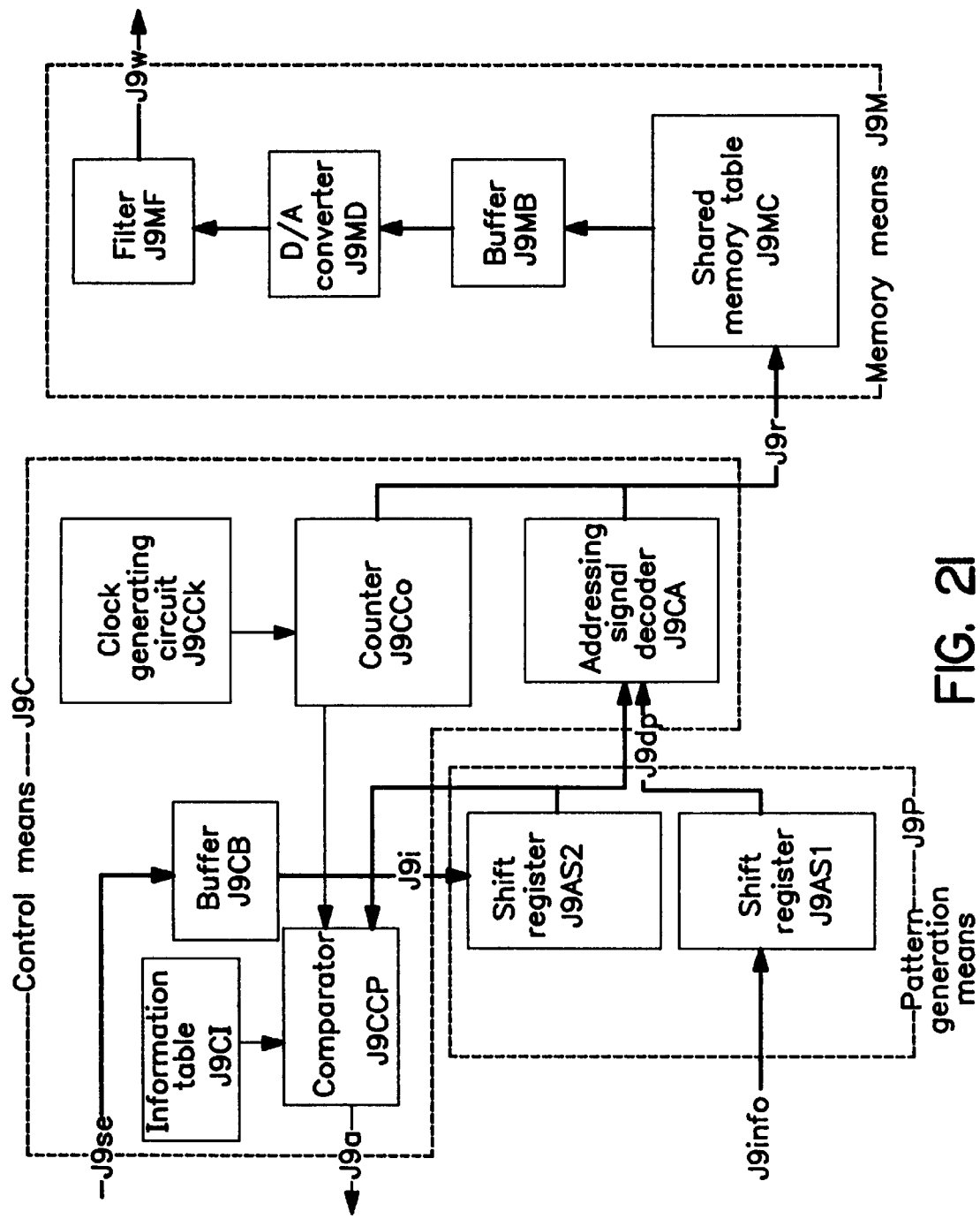
FIG. 21 is a detailed drawing illustrating one example where the memory unit in the waveform shaping equipment shown in FIG. 15 comprises semiconductor memory, the pattern generator comprises a shift register, and the control comprises an address decoder.

FIG. 21 is a schematic block diagram illustrating the exemplary waveform shaping equipment when as compared with FIG. 15, the memory means is formed with a semiconductor memory, buffer, D/A converter, and filter, the pattern generator is formed with a shift register only, and the control means is formed with a clock generation circuit, counter, shift register, address decoder, comparator, information table, and buffer.

Referring now FIG. 21, preferred embodiments will be described.

In the control means J9C, the clock generation circuit J9CCk generates sampling clock (1/t) for realizing sampling intervals t of $2^n$ pieces of partial waveforms during one time slot. This sampling clock (1/t) becomes the operation clock for the counter J9CCo. The counter J9CCo has n-bit outputs and MSB of the output becomes the data clock (1/T). Then-bit output of the counter J9CCo indicates the sampling point in the present time slot and constitutes part of read out signal J9r for indicating the address of the memory table. The output of the counter J9CCo is inputted also to the comparator J9CCp. To the buffer J9CB, the start/end signal J9se is inputted. In this start/end signal J9se, the change from logic value "0" to logic value "1" indicates the input of the start signal, while the change from logic value "1" to logic value "0" indicates the input of the end signal. This output of the buffer J9CB is inputted to the pattern generator Jo as the input control signal J9i. The ternary data pattern J9dp generated at the pattern generator J9P is inputted to the address decoder J9CA and the address decoder J9CA generates part of the readout signal J9r for access to the memory table in the memory means based on this ternary data pattern. The comparator J9CCp generates the acknowledge signal J9a to outside the waveform shaping equipment by collating the output of the counter J9CCo and part of the data pattern J9dp from the pattern generator J9P with the information table J9CI.

In the pattern generator J9P, two shift registers shift in synchronism with the data clock (1/T). To the shift register J9PS1, the information data J9info is inputted. To the shift register J9PS2, the input control signal J9i is inputted through the buffer J9Pb in the control means, and the transition state every unit time T after application of the start/end signal J9se is maintained. The parallel outputs of the shift register J9PS1 and shift register J9PS2 have the number of outputs equivalent to the pattern length w. The parallel outputs of these two shift registers are combined in two pairs, respectively, in order of time series, forming the ternary data pattern J9dp which is expressed with 2 bits. Each 2 bits of this ternary data pattern J9dp are designed to take the data value 0 irrespective of the logic value of the shift register J9PS21 when the logic value of the shift register J9PS2 is "0," and when the logic value of the shift register J9PS2 is "1" and that of the shift register J9SP1 "1," they take the data value 1, and when the logic value of the shift register J9PS2 is "1" and that of the shift register J9SP1 "0," they take the data value −1.

In the memory means J9M, the common memory table J9MC is formed by integrating the main memory table with the sub memory table. To the common memory table J9MC, all partial waveforms of baseband signals after bandlimitation are stored. The readout signal J9r generated from the control means J9C is formed by combining the signal generated from the address decoder J9CA with the output of the counter J9CCo. The common memory table J9MC reads out partial waveforms of baseband signals after bandlimitation using this readout signal J9r as an address, and the read out partial waveform is sampled and held at the buffer J9MB to be concatenated successively at the output section of the buffer J9MB. The concatenated signal waveform is smoothed by the filter J9MF after it passes the D/A converter J9MD and the baseband signal waveform after bandlimitation is formed.

Referring now to the schematic block diagram of FIG. 21, the fourth embodiment will be explained.

FIG. 22 illustrates a time sequence expressing a data pattern forming process in the fourth embodiment according to the present invention when the hardware is configured based on the schematic block diagrams shown in FIG. 21. In the fourth embodiment, the pattern length w is 5 and no dummy data string is used.

Now, the specific description will be made on the fourth embodiment.

D (k) (k=1, . . . , n) denotes the information data. Each 1T, 2T, . . . , (n+6)T denotes elapsed time for every unit time T, and A (1), A (2), A (3), A (4), A (5) denote each time slot in each pattern. Now, the present time slot is A (3). Observation of the time sequence shown in FIG. 22 indicates that time 1T to 5T and time (n+2)T to (n+6)T coincide with the spare sequence containing data value 0 and time 6T to (n+1)T with the ordinary sequence comprising binary values of 1 and −1. In the common memory table, partial waveforms of all baseband signals before and after bandlimitation for ternary patterns are retained. It is, therefore, only required to read out partial waveforms of baseband signal after bandlimitation with the readout signal generated from the control means used for the address. In this fourth embodiment, from time 4T to (n+3)T period, the present time slot contains the information data, which means that the information data is being transmitted. In this fourth embodiment, the hardware scale with respect to the shift register, address decoder, memory, etc. increases but no complicated control means is required to change over the memory table and the dummy data string is not necessary to generate. In the fourth embodiment, it is possible to input the information data into the shift register in the pattern generator from the first time without using dummy data, and the time equivalent to several time slots required for transmitting dummy data strings can be shortened. In the case of this fourth embodiment, the ternary patterns were described but the same principle will be applied to multilevel patterns exceeding ternary patterns, if an address decoder for converting multilevel patterns to binary address signals is provided, partial waveforms of baseband signals after bandlimitation are found by calculation for the number of all combinations, and the results are written in the common memory table.

In these embodiments, the profile of the baseband signal waveform before bandlimitation for expressing each transmission data is not limited only to rectangular waveform but may be optional. In addition, the present invention is not limited only to baseband signal waveform shaping but may be applied to modulated waveform shaping.

Figure 23:
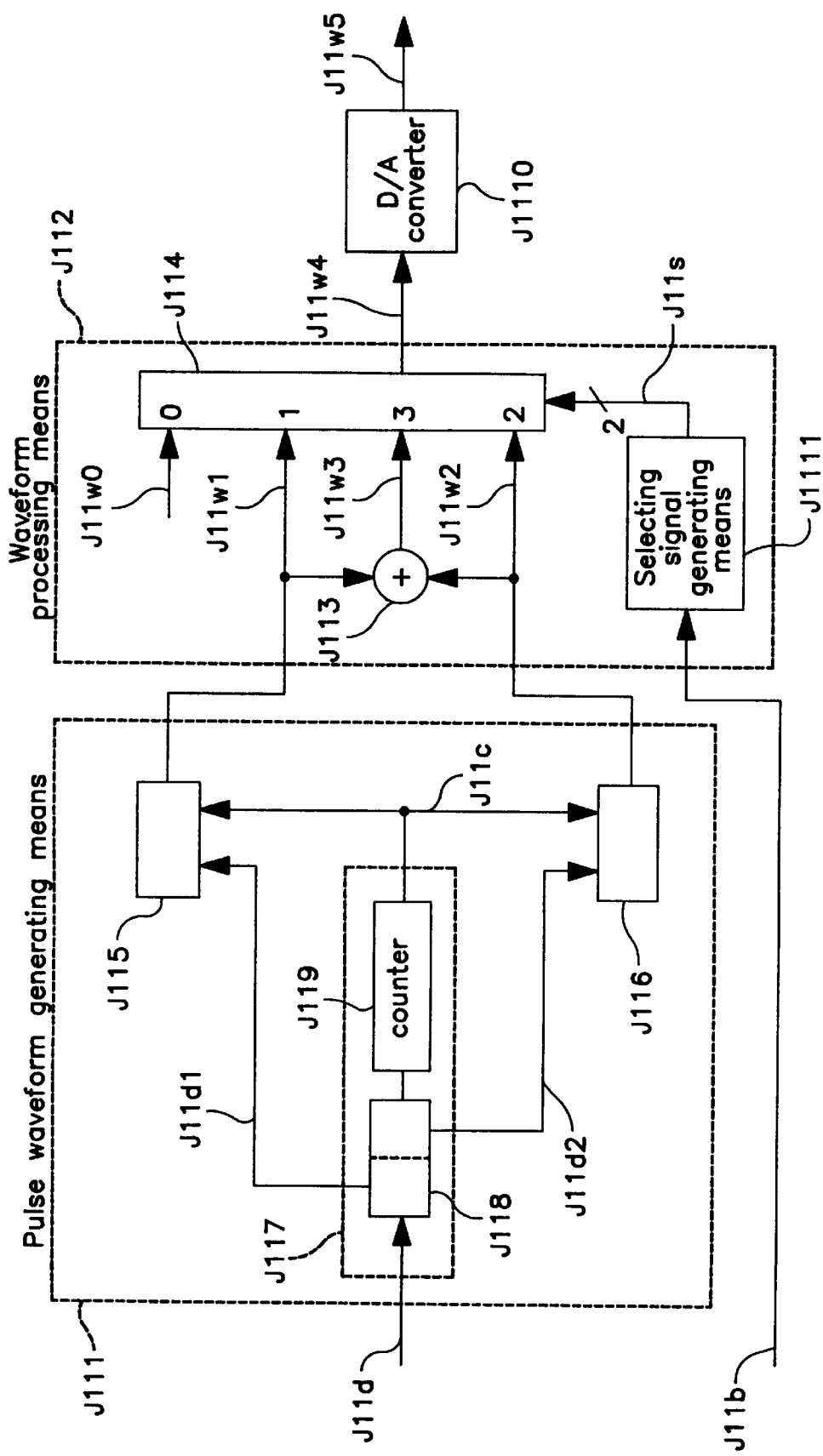
FIG. 23 is a block diagram of waveform shaping equipment of the 5th embodiment of the present invention.
Figure 24A:
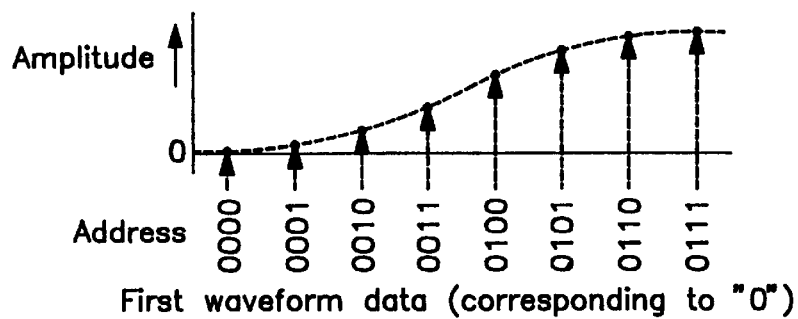
FIGS. 24a–24d (referred to collectively as FIG. 24) are diagrams illustrating waveform data which the waveform generating means has in the same embodiment.
Figure 24B:
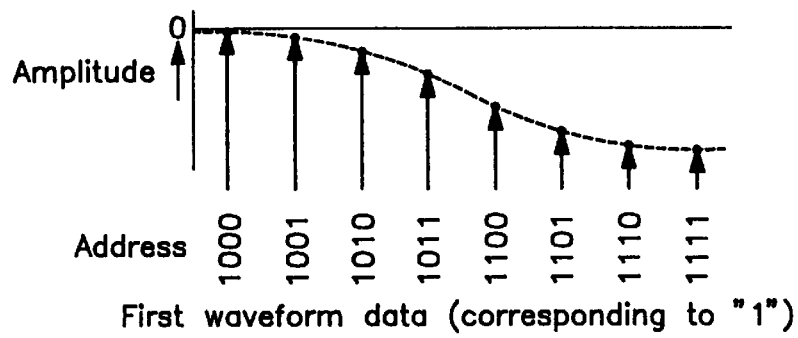
Figure 24C:
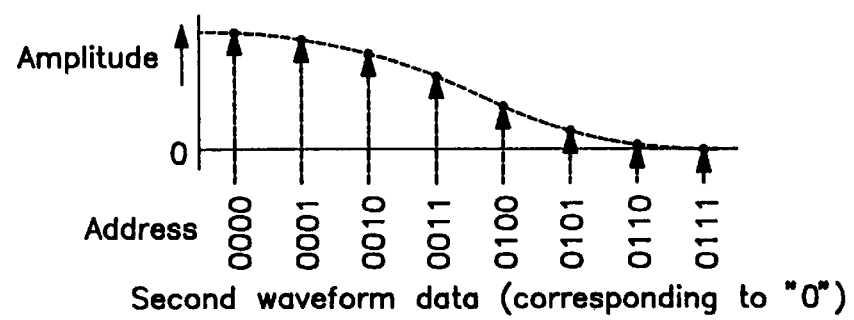
Figure 24D:
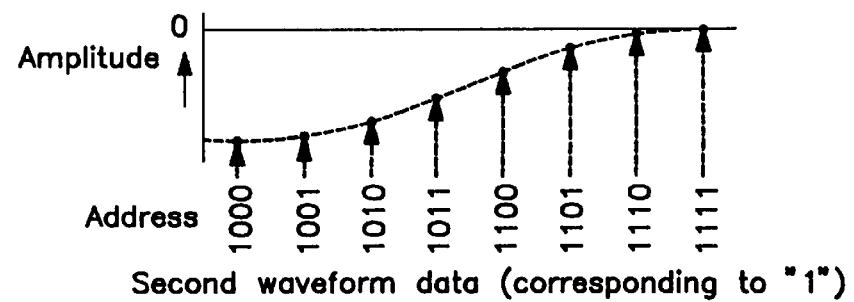

FIG. 23 is a schematic block diagram illustrating a waveform shaping equipment in the fifth embodiment of the present invention. In FIG. 23, J111 denotes a pulse waveform generating means, which comprises an address generating means J117 and memory tables J115 and J116. The address generating means J117 comprises a shift register J118 and counter J119. J112 denotes a waveform processing means, which comprises a waveform adding means J113, waveform selecting means J114, and selecting signal generating means J1111. J1110 is a D/A converter. J11d denotes data strings, J11d1 and J11d2 are the first-stage output and the second-stage output of the shift register J118, respectively, J11c is a counter output, J11w0 is a zero-level waveform, J11w1 is the first waveform, J11w2 is the second waveform, J11w3 is the third waveform, J11w4 is a shaped waveform, J11b is a burst control signal, J11s is a selecting signal, and J11w5 is an analog signal. Now, each symbol of data string J11d is a binary symbol of either 0 or 1 and is transmitted bit by bit per one symbol time. The burst control signal J11b controls the start and the end of the data string to be transmitted of the data string J11d.

FIG. 24 illustrates the waveform data which is stored in advance in the memory tables J115 and J116. In the memory table J115, the first waveform data shown in FIG. 24-*a* and FIG. 24-*b* and the second waveform data shown in FIG. 24-*c* and FIG. 24-*d* are stored. However, the first and the second waveforms are waveforms for the first half and the second half of the pulses for 1 symbol data, respectively. In this event, a positive polarity pulse is used for the data "0" and a negative polarity pulse is used for the data "1." For the pulse for one symbol data, the waveform which converges within two symbol times in all is assumed. Each waveform data comprises 8 sample data per 1 symbol time. Consequently, memory tables J115 and J116 store a total of 16 samples each of data, 8 samples for 1 symbol time for data "0" and 8 samples for 1 symbol time for data "1," respectively.

In FIG. 23, the data string J11d is first inputted to the shift register J118. The shift register J118 shifts the data every 1 symbol time and outputs in parallel the first-stage output J11d1 and the second-stage output J11d2. In the following description, one symbol time from the point in ]which the shift register J118 shifts the data to the point in which it shifts the data next is called the symbol interval. The counter J119 is a 3-bit counter which counts up every one-eighth symbol time and repeats counting at the intervals of 1 symbol time. The counter output J11c is a 3-bit binary symbol which counts up successively from "000" to "111" in each symbol interval. The addressing signal generating means J117 comprises a shift register J118 and a counter J119, and feeds 4-bit address with the most significant bit as J11d1 and J11d2 and three low-order bits as J11c to memory tables J115 and J116, respectively.

With the address generated as above, the memory tables J115 and J116 output the first waveform J11w1 and the second waveform J11w2. The first waveform J11w1 takes the waveform data of FIG. 24-*a* and FIG. 24-*b* successively from the left when J11d1 is "0" and "1," respectively, in each symbol interval. The second waveform J11w2 takes the waveform data of FIG. 24-*c* and FIG. 24-*d* successively from the left when J11d2 is "0" and "1," respectively, in each symbol interval.

The waveform adding means J113 adds the first waveform J11w1 and the second waveform J11w2 and outputs the third waveform J11w3. The waveform selecting means J114 inputs the first waveform J11w1, the second waveform J11w2, the third waveform J11w3 and the zero-level waveform J11w0, selects either one in accordance with the selecting signal J11s, and outputs it as shaped waveform J11w4. In this event, the zero-level waveform J11w0 is a waveform whose value is constantly zero; for example, when two's-complement representation is used, this can be achieved by constantly bringing all bits to zero.

Figure 25:
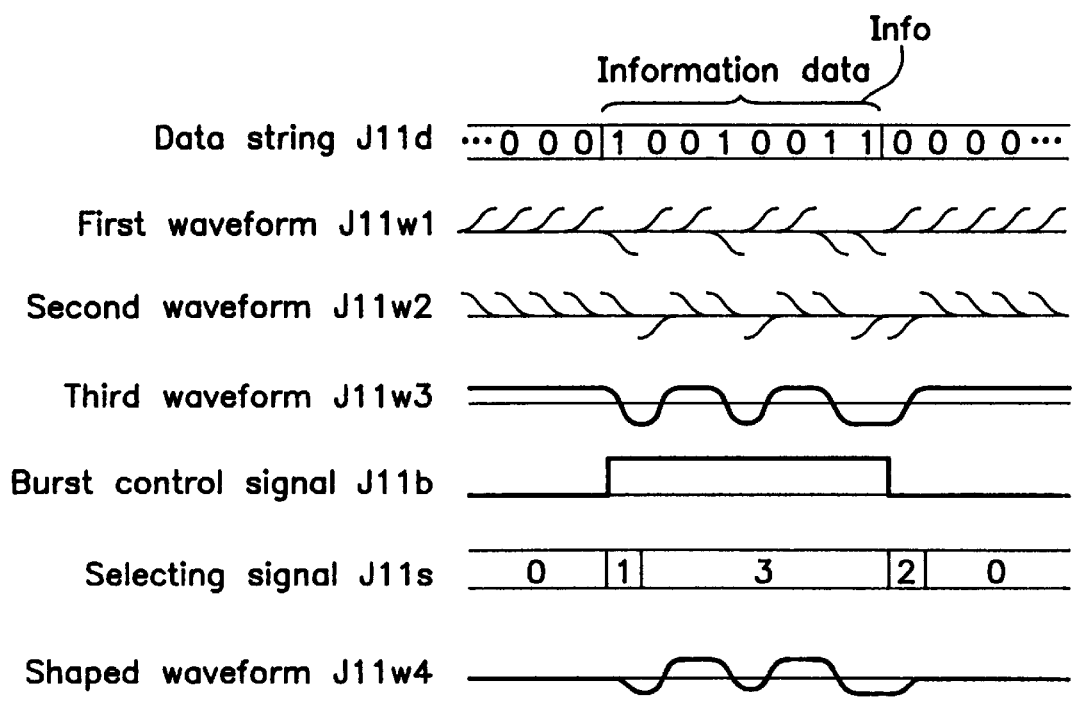
FIG. 25 is a diagram illustrating signal waveform of each section in the same embodiment of the present invention.

FIG. 25 illustrates waveforms of each section of the waveform shaping equipment of FIG. 23. In FIG. 25, signals taking digital values are expressed by converting them into analog values.

In FIG. 25, of the data strings J11d, the portion of information data info is the data to be transmitted, which occurs in the burst form. The burst control signal J11b is a signal for indicating the start and the end of data to be transmitted and becomes a high level during the period from the start to the end of information data info and in the period other than the above, it becomes low level. The contents of the data string before and after the information data info may be optional, but in this embodiment, operation will be described with the contents all designated to zero for convenience.

The data string J11d is inputted into the shift register J118 and the data for the latest 2 bits is retained. From the memory table J115, the first half of either positive polarity or negative polarity pulses are outputted in accordance with the first-stage output J11d1 of the shift register J118. Because in this event J11d2 varies 1 symbol time delayed from J11d1, the polarity change of the second waveform occurs 1 symbol time delayed with respect to the polarity change of the first waveform as shown in FIG. 25. That is, in each symbol interval, the second waveform represents the latter half of the pulse corresponding to the preceding data and the first waveform the first half of the pulse corresponding to the succeeding data.

The third waveform J11w3 which is the sum of the first waveform J11w1 and the second waveform J11w2 represents the waveform generated by interference between the preceding and succeeding data in each symbol interval, and covers the area from the center of the pulse corresponding to the preceding data and the center of the pulse corresponding to the succeeding data. Consequently, the waveform successively arranging the third waveforms generated in each symbol interval is the waveform superimposing pulses corresponding to each symbol of the data string J11d, and is a waveform shaped output for the continuous data.

Next description will be made on the operation at the start and the end of the information data info. The selecting signal generating means J1111 generates the selecting signal J11s and controls operation of the waveform selecting means J114. The selecting signal J11s is, in general, a 2-bit signal and the four kinds of values which the signal can take are now expressed as 0, 1, 2, 3. The waveform selecting means J114 selects the zero level signal J11w0 when the selecting signal J11s is 0, the first waveform J11w1 when it is 1, the second waveform j11w2 when it is 2, and the third waveform J11w3 when it is 3, respectively, and outputs them as J11w4. The selecting signal J11s takes 1 in the symbol interval just after the start of the information data info, 3 from the next symbol interval to the end of information data info, and 2 from the end of information data info to the next symbol interval as shown in FIG. 25. And in the area other than the above, it takes 0. Therefore, the shaped waveform J11w4, which is the selector output, is a zero-level waveform J11w0 up to the start of the information data info, and the waveform smoothly rises from the zero level because from the start of the information data info to 1 symbol time the waveform becomes the first waveform which is the first half of the pulse for the first bit. Thereafter to the end of the information data info, the third waveform occurs and from the end of the information data info to one symbol time, the second waveform which is the latter half of the pulse for the last pulse is generated. This causes the waveform to converge to the zero level with a smooth trailing. Thereafter the waveform becomes the zero-level signal J11w0 again.

With the above operation, the shaped waveform J11w4 becomes smoothly shaped waveform throughout the whole period including the start and the end of the data to be transmitted in transmission of burst-like information data. Lastly, the D/A converter J1110 converts the shaped waveform J11w4, which is a digital signal waveform, to an analog waveform and obtains a smoothly shaped burst-like analog output J11w5.

In the above fifth embodiment, the first and the second waveforms are designated to be simple positive-polarity or negative-polarity pulses as shown in FIG. 24, but they are not limited to these but may be more complicated pulse waveforms or modulated waveforms. The data string J11d is designated to be the binary string of either "0" or "1," but it is not limited to these, but may be multilevel symbols. For example, if the data string J11d is a string of 2^M level symbol, the shift register J118 is configured in M bit×2 stages and J11d1 and J11d2 become M-bit signals, respectively. The first and the second waveform are designated to have 8 samples per 1 symbol time but they are not limited to these but may have optional number of samples. In order to express the start and the end of the data string to be transmitted, the burst-like control signal J11b is designed to be used but other methods may be used; for example, a method to feed data start signals and data end signals separately or a method to multiplex information of the starting time and ending time in the data string itself may be used.

In the above fifth embodiment, if the present invention is applied to continuous data transmission, not to burst transmission, it can be designed to eliminate the waveform selecting means J114 and the selecting signal generating means J1111 and to constantly D/A convert the third waveform J11w3.

Figure 26:
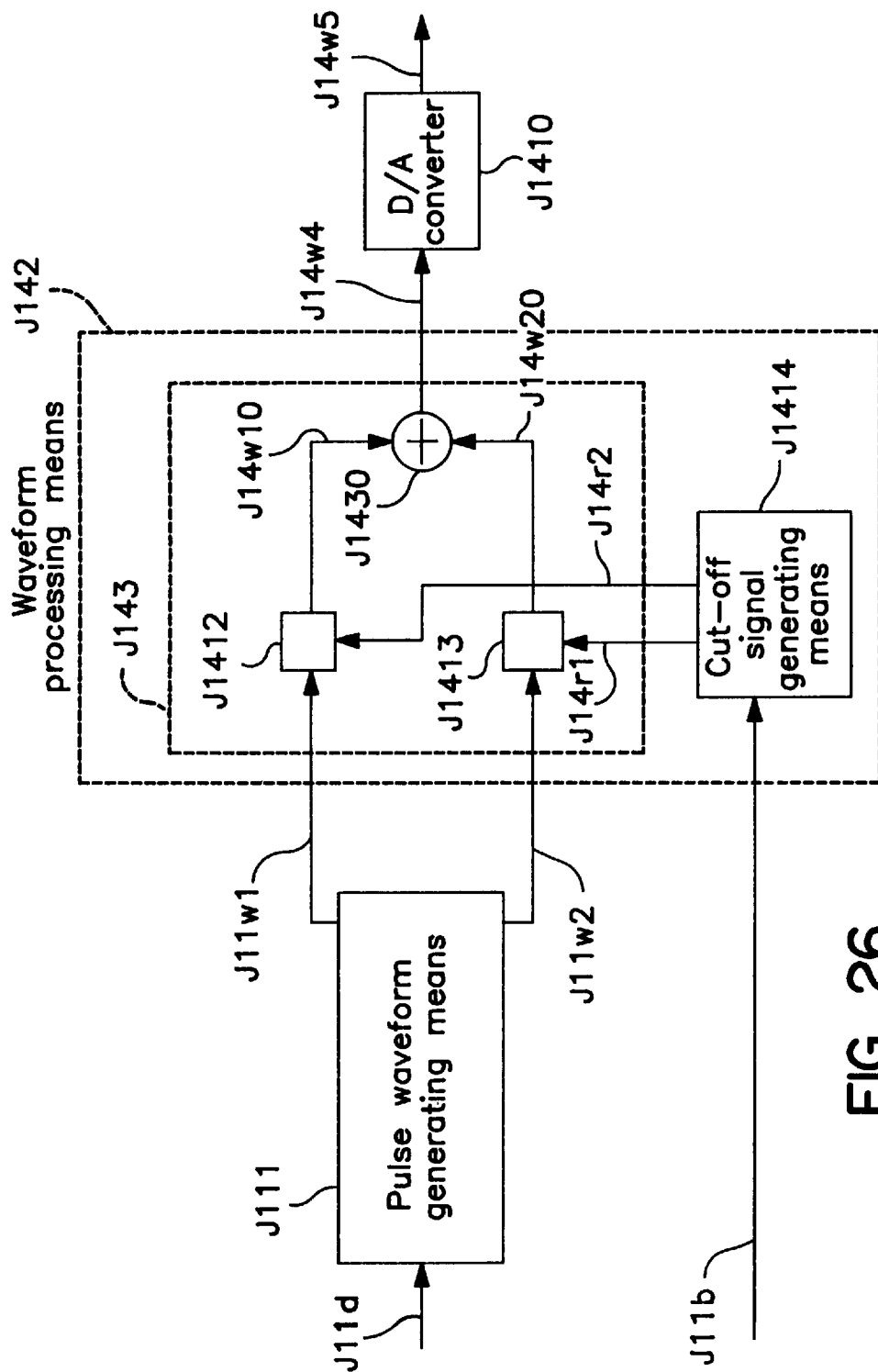
FIG. 26 is a block diagram illustrating the waveform shaping equipment of the 6th embodiment.

Next, the sixth embodiment will be described. FIG. 26 is a schematic block diagram illustrating a waveform shaping equipment in the sixth embodiment of the present invention. In FIG. 26, J141 denotes a waveform adding means which comprises an adder J1430 and latches J1412, J1413. J1414 denotes a cut-off signal generating means. The waveform processing means J142 comprises with these components. Because other portions are the same as those of the fifth embodiment in FIG. 23, the description on which will be omitted.

Figure 27:
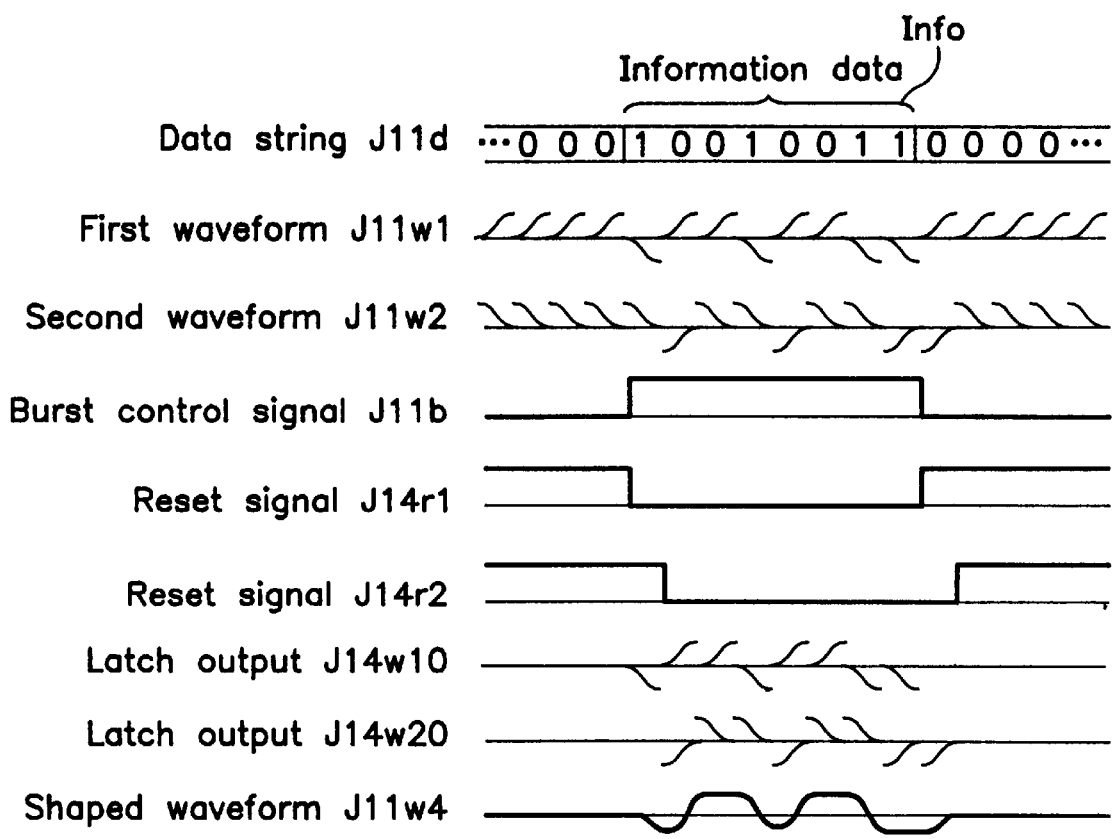
FIG. 27 is a diagram illustrating signal waveform of each section in the same embodiment of the present invention.

FIG. 27 illustrates the signal waveform of each portion of the waveform shaping equipment of FIG. 26. In FIG. 27, signals taking digital values are converted to analog values for indication.

In FIG. 26, latches J1412 and J1413 uses the first waveform J11w1 and the second waveform J11w2 as input signals, respectively, and outputs signals same as those of input signals or zero-level signals in accordance with the reset signals J14r1 and J14r2. That is, they assume responsibility for cutting off the inputs to the waveform adding means J143, respectively. In this case, J14r1 and J14r2 are assumed to be positive logic reset signals. That is, the output J14w10 of latch J1412 becomes J11w1 when J14r1 enters low level, and enters zero level when it enters high level, and similarly, the output J14w20 of latch J1413 becomes J11w2 when J14r2 enters low level, and zero level when it enters high level.

The cut-off signal generating means J1414 generates reset signals J14r1 and J14r2 as shown in FIG. 27 from timing of the change of burst control signal J11b. This brings the input of the waveform adding means J143 partially to the zero level and controls the output waveform of the adder. First of all, up to the start of information data info, both J14r1 and J14r2 are at the high level. At the start of information data info, J14r1 changes to low level but J14r2 is held to high level and after the next symbol interval, both J14r1 and J14r2 change to high level. Consequently, as shown FIG. F15, J14w10 becomes the first waveform in the interval from the start to the end of the information data info, and in other intervals, changes to zero level. J14w20 becomes the second waveform in the interval from the next symbol interval of the start of the information data info to the next symbol interval of the end of the information data info, and in other intervals, changes to zero level.

The adder J1430 adds J14w10 and J14w20 and obtains shaped waveform J14w4 as an output. As clear from FIG. 25 and FIG. 27, this is identical to that of shaped waveform 11w4 in the fifth embodiment. That is, it becomes the first waveform during 1 symbol time from the start of information data info and smoothly rises, and thereafter to the end of information data info, it becomes the third waveform which is the sum of the first and the second waveforms, and then, smoothly falls as the second waveform for 1 symbol time from the end of information data info. Finally, D/A converter J1110 converts the shaped waveform J14wk, which is a digital signal waveform, to analog waveform and obtains the analog output same as that of the fifth embodiment.

By the way, in the sixth embodiment described above, latches J1412 and J1413 are used to bring J14w10 and J14w20 to zero level, but any circuits other than latches can be used if they can control passing and cut-off of input of the waveform adding means J143; for example, a circuit which fixes either one of the two input selectors to zero level may be used.

Figure 28:
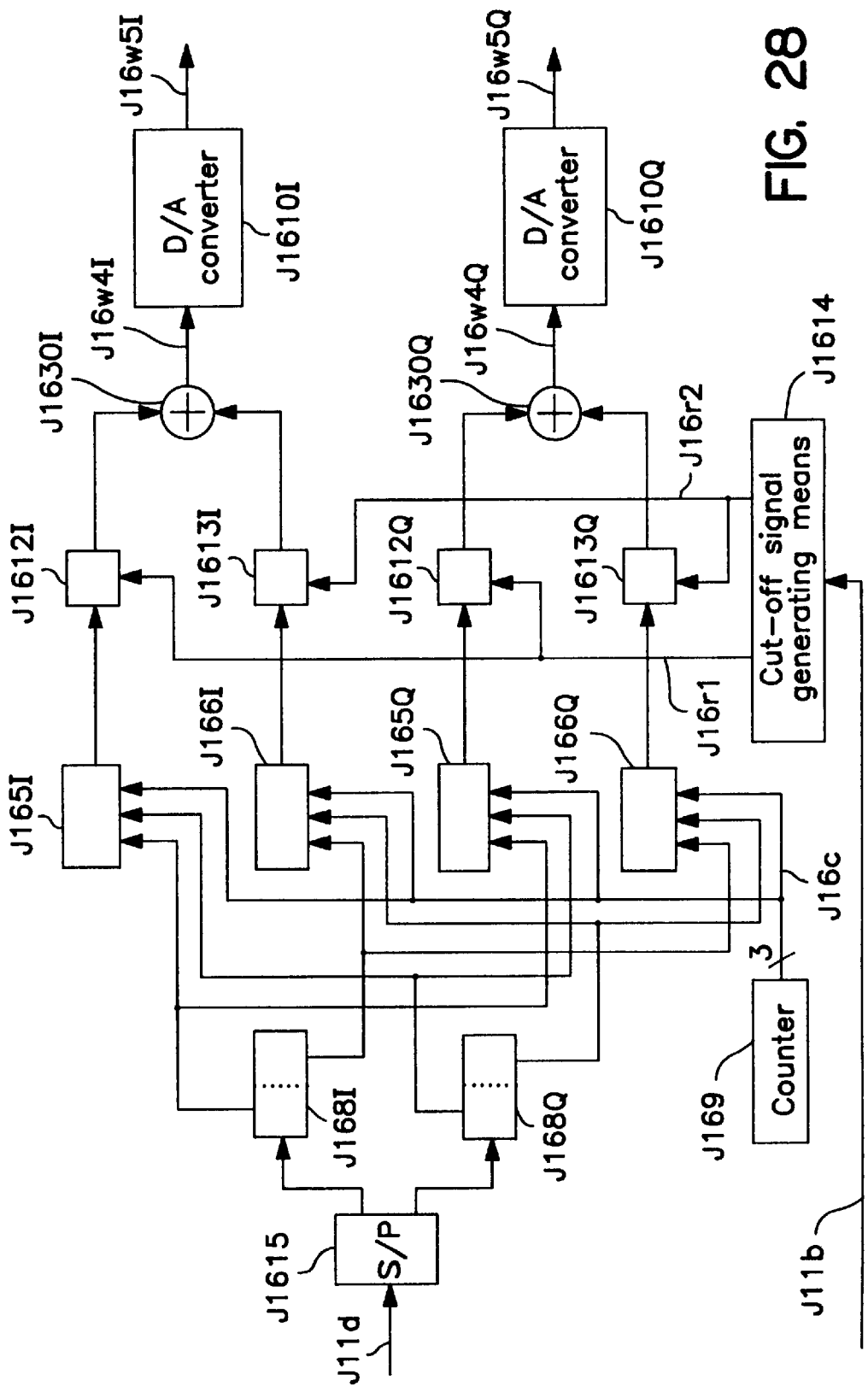
FIG. 28 is a block diagram illustrating the waveform shaping equipment of the 7th embodiment of the present invention.

Next discussion will be made on the seventh embodiment. FIG. 28 illustrates a block diagram of the waveform shaping equipment of the seventh embodiment according to the present invention. The waveform shaping equipment of this embodiment is designed to generate band-limited two baseband signals to be applied for quadrature modulation such as quadrature phase shift keying. In FIG. 28, J1615 is a serial-parallel converter, J168I and J168Q are shift registers, J165I, J166I, J165Q and J166Q are memory tables, J1612I, J1613I, J1612Q and J1613Q are latches, J1614 is a cutoff signal generating means, J1630I and J1630Q are adders, J1610I and J1610Q are D/A converters. In FIG. 28, data string J11d is converted to 2-bit serial data strings by the serial-parallel converter J1615 and one data string is fed to the shift register J168I and the other to the shift register J168Q. After two shift registers J168I and J168Q, two systems of the circuit basically similar to the wave shaping equipment of FIG. 26 in the sixth embodiment and generate waveforms of baseband signals for in-phase axis (I axis) and those for quadrature axis (Q axis), respectively.

What differs from the equipment of FIG. 26 is that both outputs of two systems of shift register J168I and J168Q are fed as address of the memory table. In this embodiment, because one symbol data comprises 2 bits, the relevant waveform generating means have four types of waveform data for one symbol time comprising 8 samples, respectively, and selects either one type by combining 2-bit data for output. The counter J169 and cutoff signal generating means J1614 are same as those shown in FIG. 26 in the sixth embodiment, and these outputs can be shared in the circuits for I axis and Q axis, thereby allowing only one system to be provided.

As described above, the present invention is also suited for application where waveform shaping is carried out for baseband signals for quadrature modulation or multilevel modulation in carrier transmission.

Figure 29:
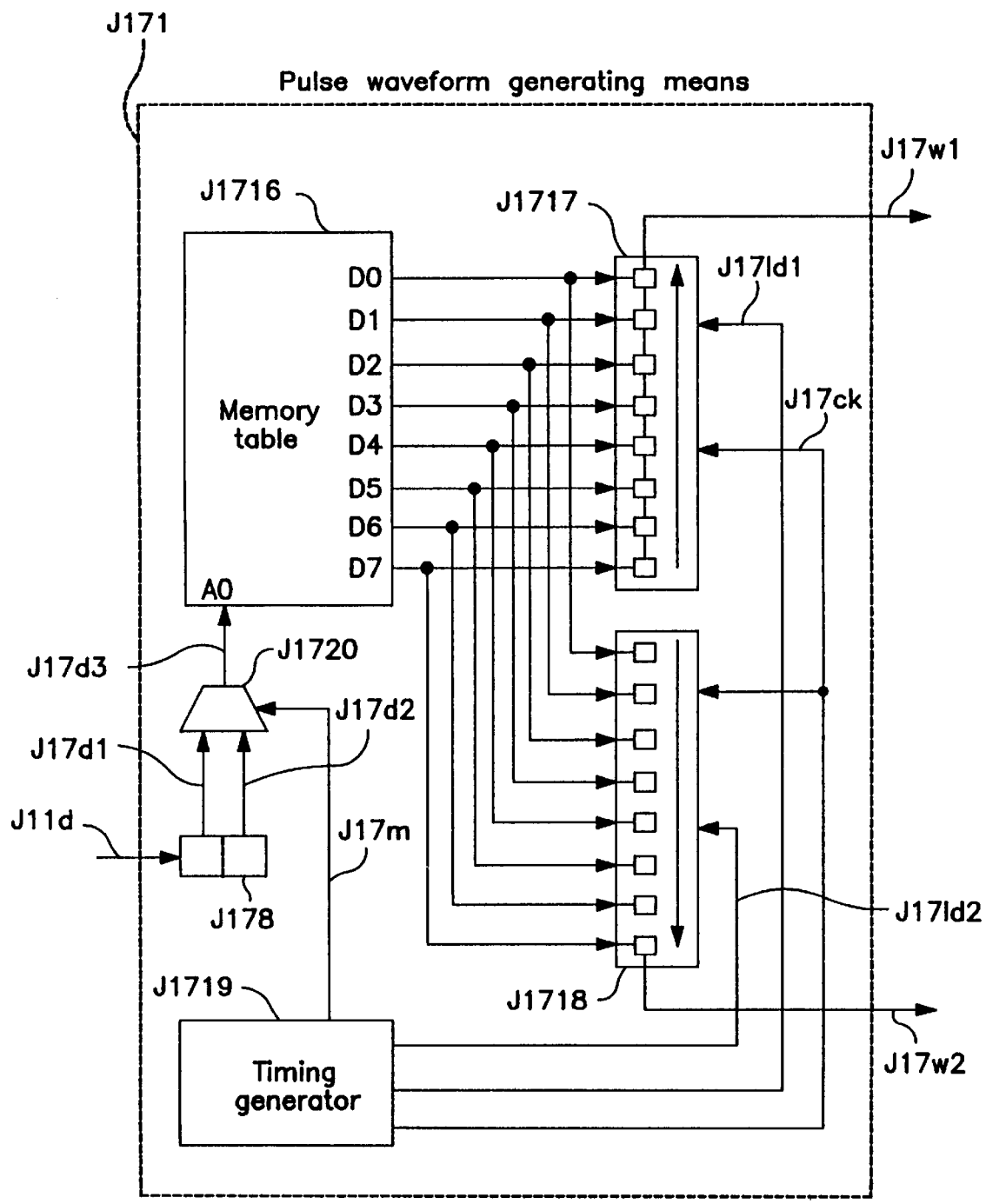
FIG. 29 is a block diagram illustrating the waveform generator of the 8th embodiment.
Figure 30:
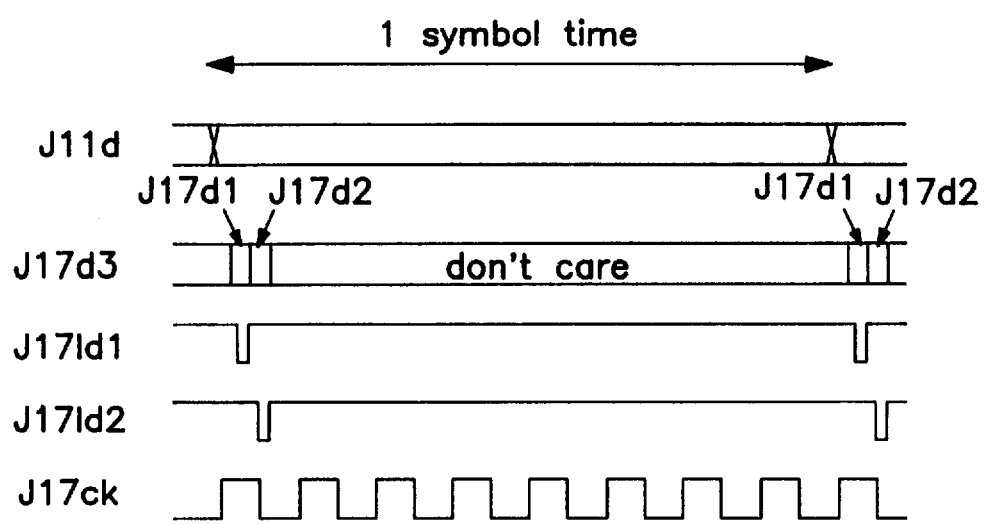
FIG. 30 is a diagram illustrating signal waveform of each section in the same embodiment of the present invention.

Now, the eighth embodiment is described. FIG. 29 is a block diagram illustrating the pulse waveform generating means in the waveform shaping equipment in the eighth embodiment according to the present invention. Portions other than the pulse waveform generating means are same as those of the fifth embodiment. In FIG. 29, J1716 is a memory table, J1717, J1718 are shift registers for waveform data, J1719 is a timing generator, and J1720 is a multiplexer. The shift register J178 is the same as that shown in FIG. 23 in the fifth embodiment. The pulse waveform generating means J171 comprises the above components. FIG. 30 illustrates the timing of signals of each section of FIG. 29.

The memory table J1716 stores only the data equivalent to FIG. 24-a and FIG. 24-b. What is characteristic in the present embodiment is that as waveform data, the first waveform and the second waveform are designed to be symmetrical with regard to time. With this configuration, even if waveforms equivalent to FIG. 24-a and FIG. 24-b only are stored, using these inverted with regard to time can produce waveforms equivalent to FIG. 24-c and FIG. 24-d.

The memory table J1716 has 1-bit address inputs, according to which 8-sample data of FIG. 24-a and FIG. 24-b can be outputted in parallel. Shift registers J1717 and J1718 take in 8-sample waveform data outputted by the memory table J1716 and output 1 sample at a time while shifting. However, these two shift registers shift in the opposite directions.

The timing generator J1719 generates load signals J171d1, J171d2 and clock J17ck of the timing shown in FIG. 30 and feeds them to shift registers J1717 and J1718. However, J171d1 and J171d2 are negative logic load signals and shift registers J1717, J1718 load data in series when they are at low level. When J171d1 or J171d2 are at high level, the shift register J1717 or J1718 shifts data at the rising edge of clock J17ck for output. In addition, the timing generator generates multiplexer control signal J17m and feeds to the multiplexer J1720. The multiplexer J1720 selects either of the first-stage output J17d1 or the second-stage output J17d2 of the shift register J178 and outputs as J17d3. J17d3 serves as an address of the memory table J1716. Timing of J17d3 shall conform to that shown in FIG. 30. However, in the periods other than those stated J17d1 and J17d2, the value of J17d3 may be indefinite. The shift registers J1717 and J1718 load waveforms to the rising edge of each symbol interval in accordance with J17d1 and J17d2, and while shifting in the direction opposite to each other, the waveform data is outputted successively.

With the above mentioned action, the shift register J1717 outputs waveform of FIG. 24-a or FIG. 24-b as first waveform J17w1 in accordance with J17d1. The shift register J1718 outputs waveform obtained by time-inverting FIG. 24-a or waveform obtained by time-inverting FIG. 24-b as second waveform J17w2 in accordance with J17d2. In addition, the memory table J1716 requires only to possess data equivalent to FIG. 24-a and FIG. 24-b, enabling this embodiment to reduce the memory table capacity to one half that of the fifth embodiment.

Figure 31:
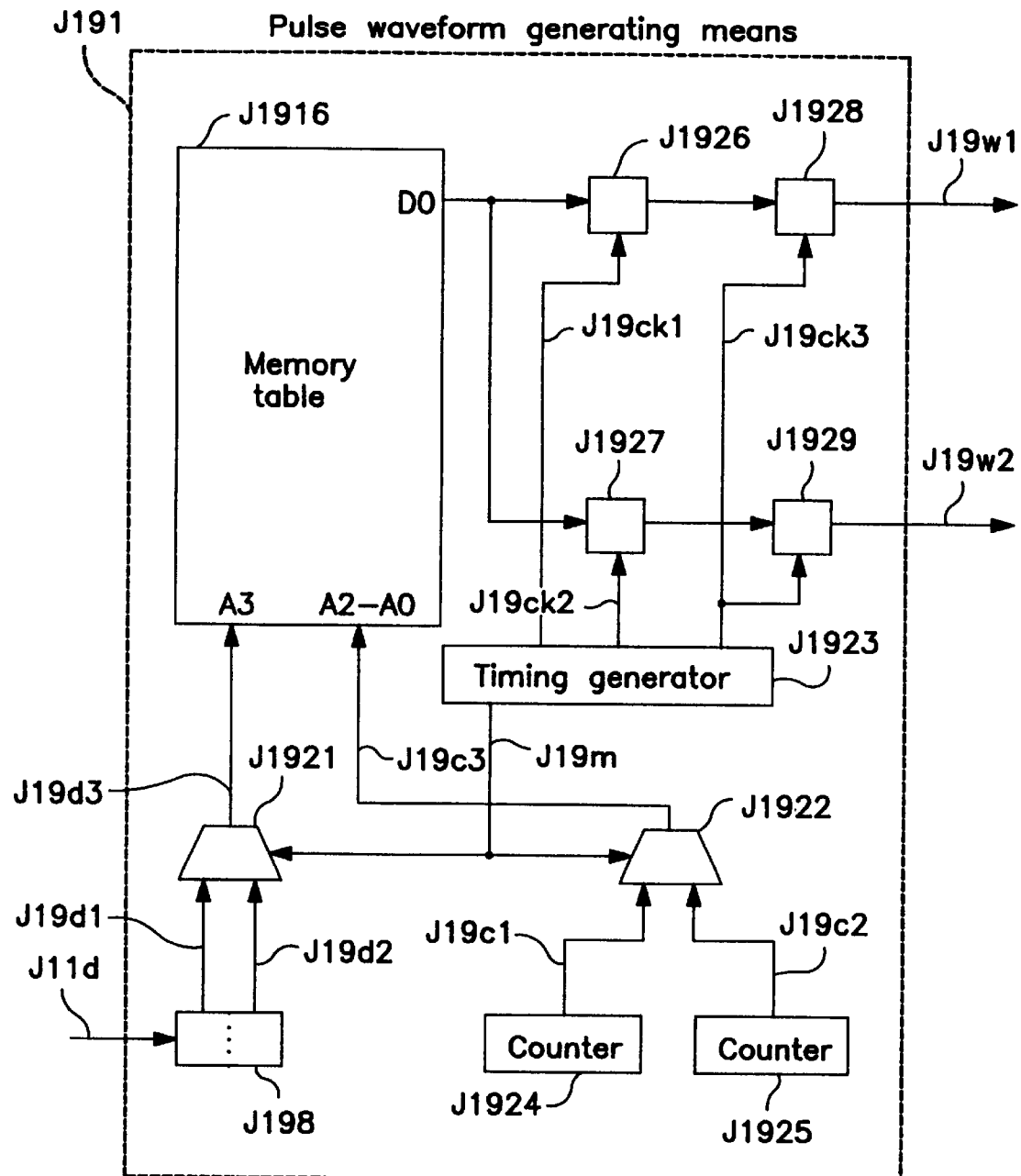
FIG. 31 is a block diagram illustrating the waveform shaping equipment of the 9th embodiment of the present invention.
Figure 32:
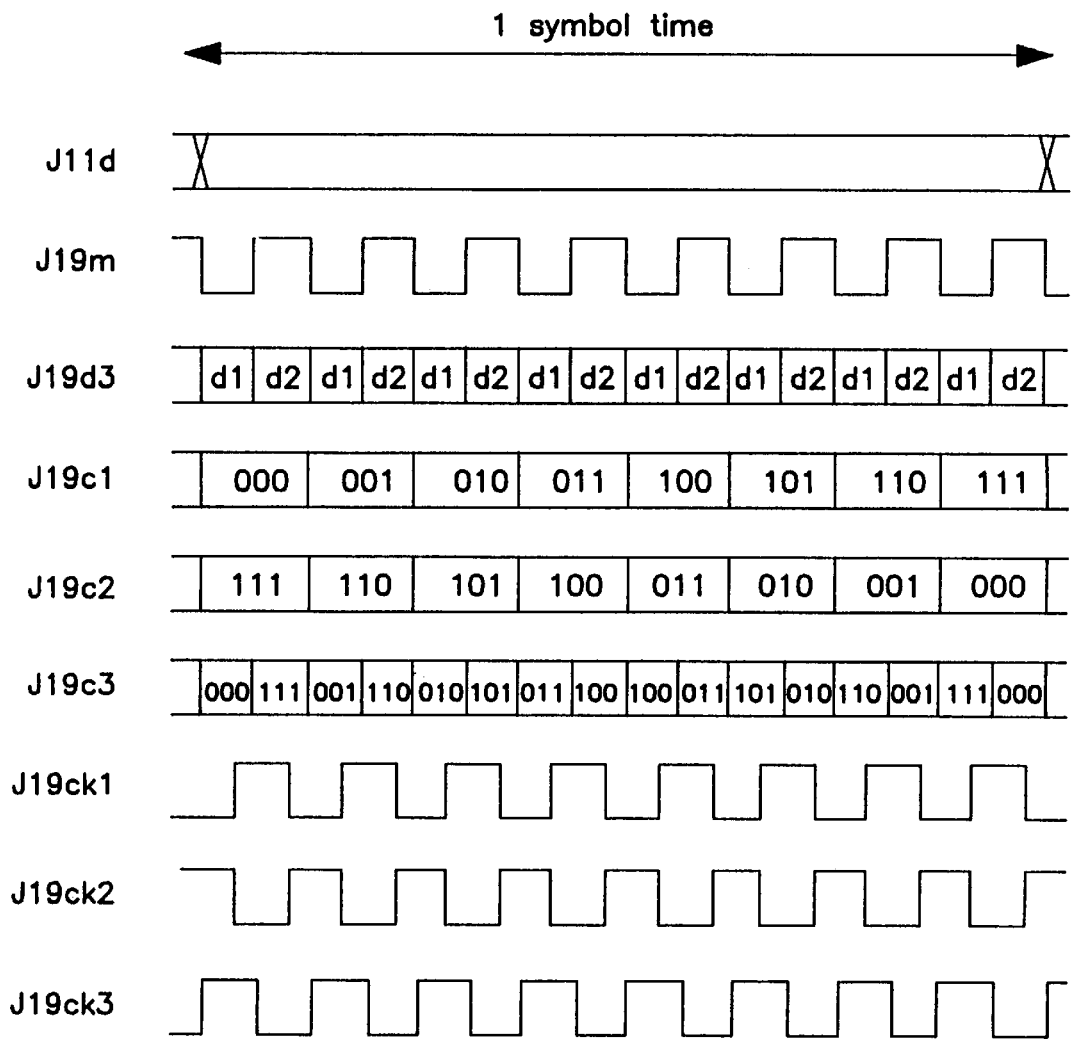
FIG. 32 is a diagram illustrating signal waveform of each section in the same embodiment.

Now, the ninth embodiment is described. FIG. 31 illustrates the pulse waveform generating means in the waveform shaping equipment in the ninth embodiment according to the present invention. Portions other than the pulse waveform generating means are same as those of the fifth embodiment. In FIG. 31, J1916 is a memory table, J1921 and J1922 are multiplexers, J1923 is a timing generator, J1924 and J1925 are counter, and J1926 to J1929 are latches. The shift register J198 is the same as that shown in FIG. 23 in the fifth embodiment. The pulse waveform generating means J191 comprises the above components. FIG. 32 illustrates the timing of signals of each section of FIG. 31.

In this embodiment as well, the first waveform and the second waveform are designed to achieve symmetrical relationship with regard to time same as in the eighth embodiment, and the memory table J1916 stores only the data corresponding to FIG. 24-*a* and FIG. 24-*b* in the same manner as in the eighth embodiment. What differs from the eighth embodiment is that the memory table J1916 has 4-bit address inputs in the same manner as in the case of fifth to seventh embodiments and outputs data one sample at a time.

First of all, counters J1924 and J1925 are 3-bit counters and count up and count down in each symbol interval, respectively, and generate counter outputs 19c1 and J19c2 as shown in FIG. 32.

Next, the timing generator J1926 generates multiplexer control signals J19m as shown in FIG. 32 and controls multiplexers J1921 and J1922. With these signals, the multiplexer J1921 selects J19d1 and J19d2 alternately and outputs J19d3 shown in FIG. 32. The multiplexer J1922 selects counter outputs J19c1 and J19c2 alternately and outputs J19d1 shown in FIG. 32. Using these as addresses, the memory table J1916 outputs alternately the data of selecting each sample of waveform of FIG. 24-*a* or FIG. 24-*b* corresponding to J19d1 successively from the left and the data of selecting each sample of waveform of FIG. 24-*a* or FIG. 24-*b* corresponding to J19d2 successively from the right. That is, it outputs the data corresponding to the first waveform J19w1 and the data corresponding to the second waveform J19w2 alternately by time-sharing sample by sample.

The timing generator J1923 further generates clock signals J19ck1, J19ck2, and J19ck3 shown in FIG. 32 and feeds J19ck1 to latch J1926, J19ck2 to latch J1927, J19ck3 to latches J1928 and J1929, respectively. The latch 1926 takes in and holds the data corresponding to the first waveform at the rising edge of J19ck1 and the latch 1927 takes in and holds the data corresponding to the second waveform at the rising edge of J19ck2. Finally, because outputs of latches J1926 and 1927 have their change timing not synchronized each other, latches J1928 and J1929 align timing of signals of these two systems at the rising edge of J19ck3 and output the first waveform J19w1 and the second waveform J19w2, respectively.

As described above, in this embodiment as well, in the same manner in the eighth embodiment, the memory table capacity can be reduced to one half from that of the fifth embodiment. In addition to this, because the first waveform data and the second waveform data are read alternately from the memory table sample by sample by time sharing, shift registers J1717, J1718 of the eighth embodiment can be eliminated and the circuit can be simplified.

Figure 33:
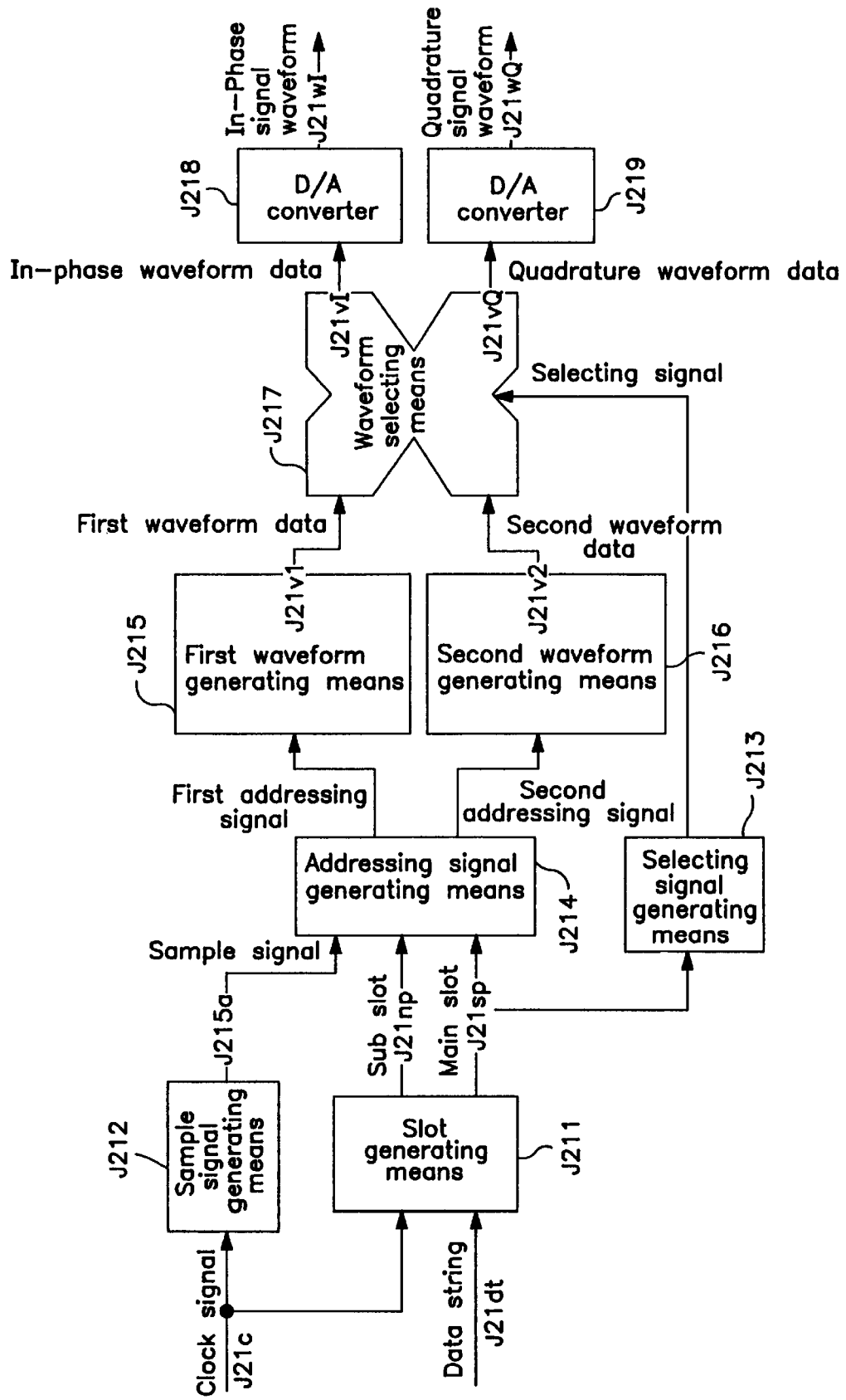
FIG. 33 is a block diagram illustrating the waveform shaping equipment of the 10th embodiment of the present invention.

FIG. 33 is a block diagram illustrating a waveform shaping equipment in the 10th embodiment according to the present invention. In FIG. 33, J211 denotes a slot generating means, J212 a sample generating means, J213 selecting signal generating means, J214 an addressing signal generating means, J215 a first waveform generating means, J216 a second waveform generating means, J217 a waveform selecting means, J218 a D/A converter, and J219 a D/A converter, while J21dt denotes a data string, J21c a clock signal, J21sp a main slot, J21np a sub slot, J21sa a sample signal, J21a1 the first addressing signal, J21a2 the second addressing signal, J21ss a selecting signal, J21v1 the first waveform data, J21v2 the second waveform data, J21vI an in-phase waveform data, J21vQ a quadrature waveform data, J21wI an in-phase signal waveform, and J21wQ a quadrature signal waveform.

In FIG. 33, at the slot generating means J211, data string J21dt and clock signal J21c are inputted and one piece of main slot J21sp and d−1 pieces of sub slot J21np are formed and outputted.

At the sample signal generating means J212, clock signal J21c is inputted and n-bit sample signal J21sa is generated.

At the addressing signal generating means J214, main slot J21sp, sub slot J21np, and sample signal J21sa are inputted, and (m×d−1+n)-bit first addressing signal J21a1 and the second addressing signal J21a2 are formed and outputted. At the selecting signal generating means J213, main slot J21sp is inputted and 1-bit selecting signal J21ss is formed and outputted.

At the first waveform generating means J215 and the second waveform generating means J216, the first addressing signal J21a1 and the second addressing signal J21a2 are inputted, respectively. At the first waveform generating means J215, based on (m×d−1+n)-bit first addressing signal J21a1, L-bit first waveform data J21v1 is read out from the first waveform memory which stores 2^(m×d−1) types of waveform data. At the second waveform generating means J216, based on (m×d−1+n)-bit second addressing signal J21a2, L-bit second waveform data J21v2 is read out from the second waveform memory which stores 2^(m×d−1) types of waveform data.

Figure 35A:
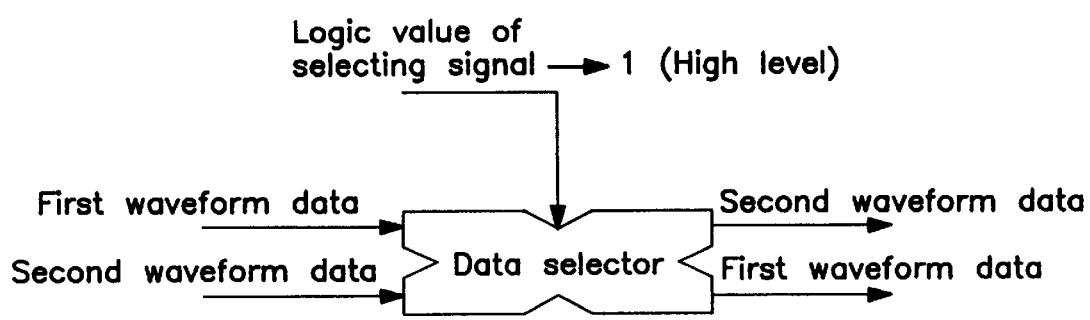
FIGS. 35a and 35b (referred to collectively as FIG. 35) are diagrams illustrating functions of the data selector in the 10th embodiment.
Figure 35B:
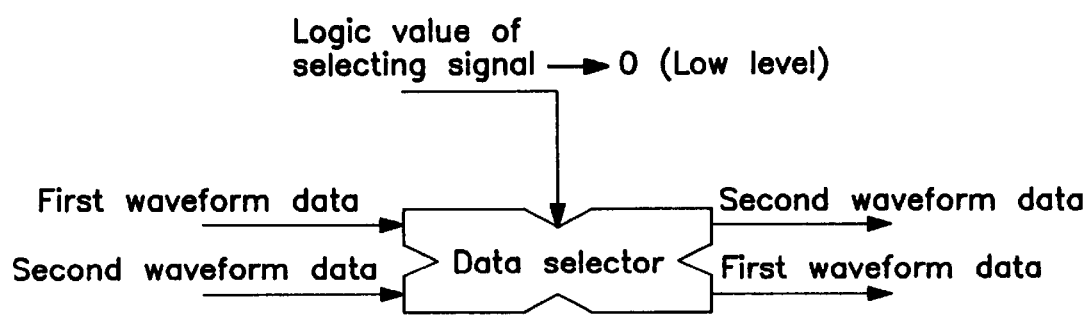

At the waveform selecting means, first waveform data J21v1, second waveform data J21v2, and selecting signal J21ss are inputted. The waveform selecting means comprises the data selector with functions as shown in FIG. 35, and allotting the first waveform data J21v1 and the second waveform data J21v2 by the selecting signal J21ss, it outputs the in-phase waveform data J21vI and the quadrature waveform data J21vQ.

The in-phase waveform data J21vI and quadrature waveform data J21vQ are inputted to the D/A converter J218 and D/A converter J219 to form continuous signal waveforms and are outputted as in-phase waveform J21wI and quadrature waveform J21wQ.

Figure 34:
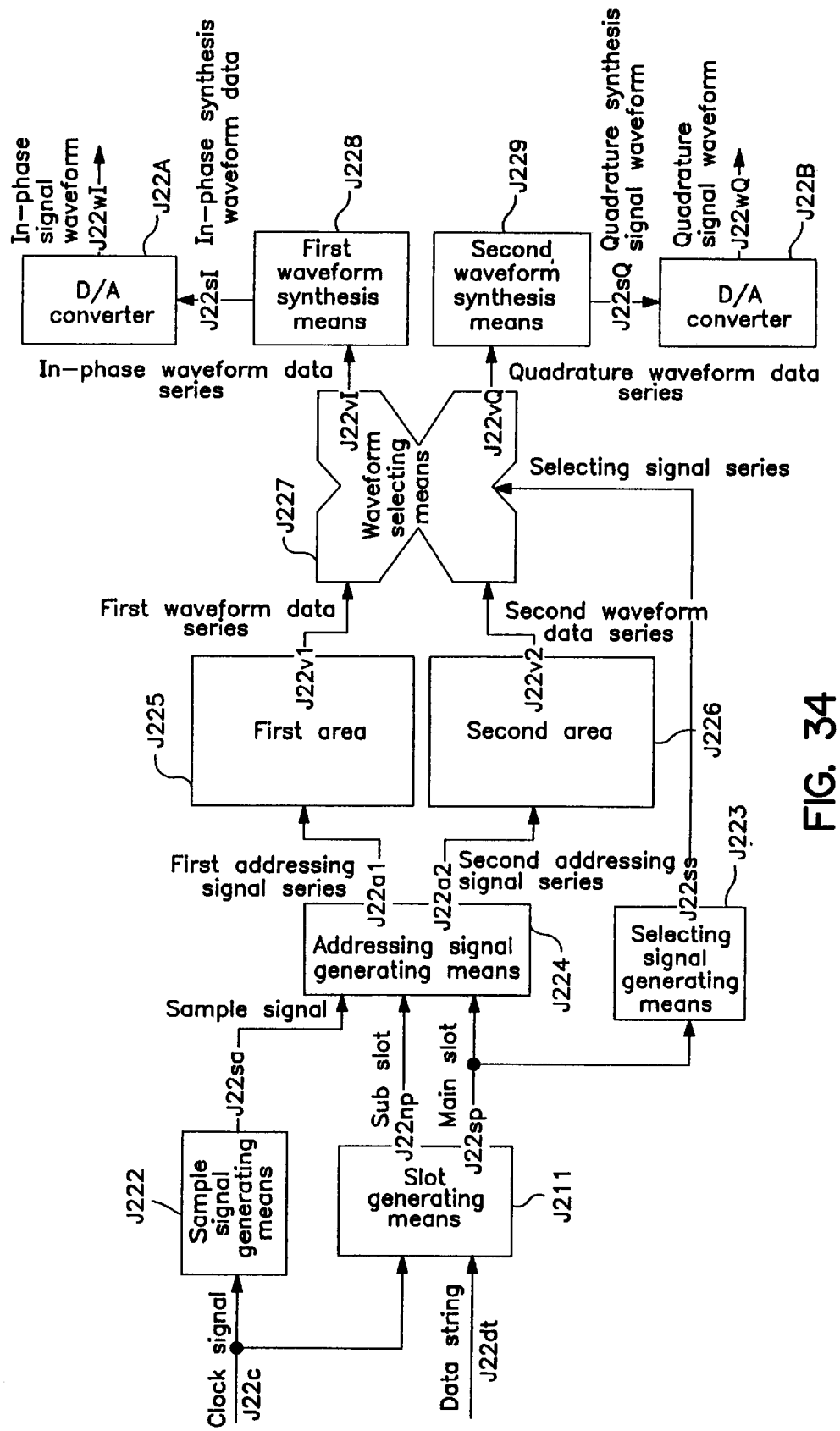
FIG. 34 is a block diagram illustrating the waveform generator of the 11th embodiment.

FIG. 34 illustrates a block diagram of the waveform shaping equipment in the 11th embodiment according to the present invention. In FIG. 34, J221 denotes a slot generating means, J222 a sampling signal generating means, J223 a selecting signal generating means, J224 an addressing signal generating means, J225 the first domain, J226 the second domain, J227 a waveform selecting means, J228 the first waveform synthesis means, J229 the second waveform synthesis means, J22A a D/A converter, and J22B a D/A converter, while J22dt denotes a data string, J22c a clock signal, J22sp a main slot, J22np a sub slot, J22sa a sample signal, J22a1 the first addressing signal series, J22a2 the second addressing signal series, J22ss the selecting signal series, J22v1 the first waveform data series, J22v2 the second waveform data series, J22vI an in-phase waveform data series, J2vQ a quadrature waveform data series, J22sI an in-phase synthesis waveform data, J22sQ a quadrature synthesis waveform data, J22wI an in-phase signal waveform, and J22wQ a quadrature signal waveform.

In FIG. 34, at the slot generating means J221, the data string J22dt and clock signal J22c are inputted, and s pieces of main slot J22sp and d-s pieces of sub slot J22snp are formed and outputted.

At the sample signal generating means J222, clock signal J22c is inputted and n-bit sample signal J22sa is generated.

At the addressing signal generating means J224, s pieces of main slot J22sp, d-s pieces of sub slot J22np, and sample signal J22sa are inputted, and the first addressing signal series J22a1 comprising s pieces of first addressing signals and the second addressing signal series J22a2 comprising s pieces of the second addressing signals are formed and outputted.

At the selecting signal generating means J223, s pieces of main slot J22sp are inputted and s-bit selecting signal J22ss is formed and outputted.

The first domain J225 comprising s pieces of first waveform generating means has the first addressing signal series J22a1 inputted and from the first domain J225, the first waveform data series J22v1 comprising s pieces of first waveform data is read out and outputted.

The second domain J226 comprising s pieces of second waveform generating means has the second addressing signal series J22a2 inputted and from the second domain J226, the second waveform data series J22v2 comprising s pieces of second waveform data is read out and outputted.

The waveform selecting means comprises s pieces of data selector with functions of FIG. 35 with respect to relevant waveform data and has the first waveform data series J22v1, second waveform data series J22v2, and selecting signal series J22ss inputted, and outputs the in-phase waveform data series J22vI comprising s pieces of in-phase waveform data and the quadrature waveform data series J22vQ comprising s pieces of quadrature waveform data based on the selecting signal series J22ss.

The in-phase waveform data series J22vI and quadrature waveform data series J22vQ are synthesized by the first waveform synthesis means J228 and the second waveform synthesis means J229, respectively, to form the in-phase synthesis waveform data J22sI and quadrature synthesis waveform data J22sQ, and are inputted to the D/A converter J22A and D/A converter J22B and are outputted as in-phase waveform J22wI and quadrature waveform J22wQ, which are continuous signal waveforms.

Figure 36:
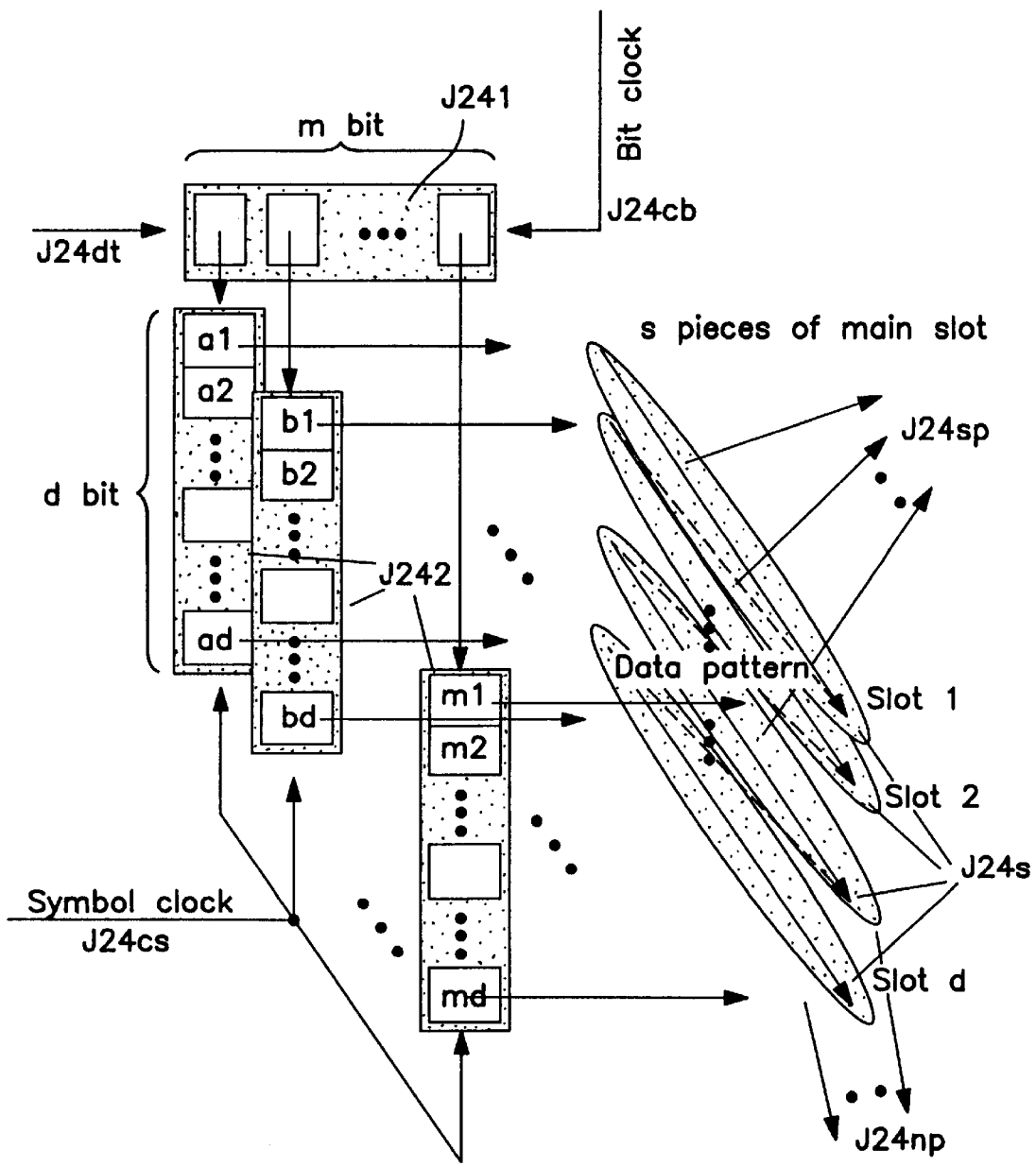
FIG. 36 is a fragmentary circuit diagram of the slot generating means in the 10th and 11th embodiments.

FIG. 36 is a diagram illustrating circuit configuration of the slot generating means in the 10th and 11th embodiments. In FIG. 36, J241 denotes an m-bit shift register, J242 a d-bit shift register with m stages, J24dt data, J24s a slot, J24sp a main slot, J24np a sub slot, J24cs a symbol clock, and J24cb a bit clock, while the bit clock J24cb is a sampling clock signal divided by n and the symbol clock j24cs is a bit clock J24cb divided by m. The shift register J241 takes data J24dt every bit clock J24cb by shifting and holds m-bit data for one symbol. The m-stage shift register J242 takes in the output of the shift register J241 every symbol clock J24cs by shifting, and (a1, b2, . . . , m1), . . . , (ad, bd, . . . , md) are outputted in parallel by m×d bits of the data pattern length as each slot J24s. In this event, s pieces out of d pieces of slot J24s are formed as the main slot J24sp and the remaining d-s pieces as sub slot J24nnp and are outputted. In the case of the 10th embodiment, s=1.

Figure 37:
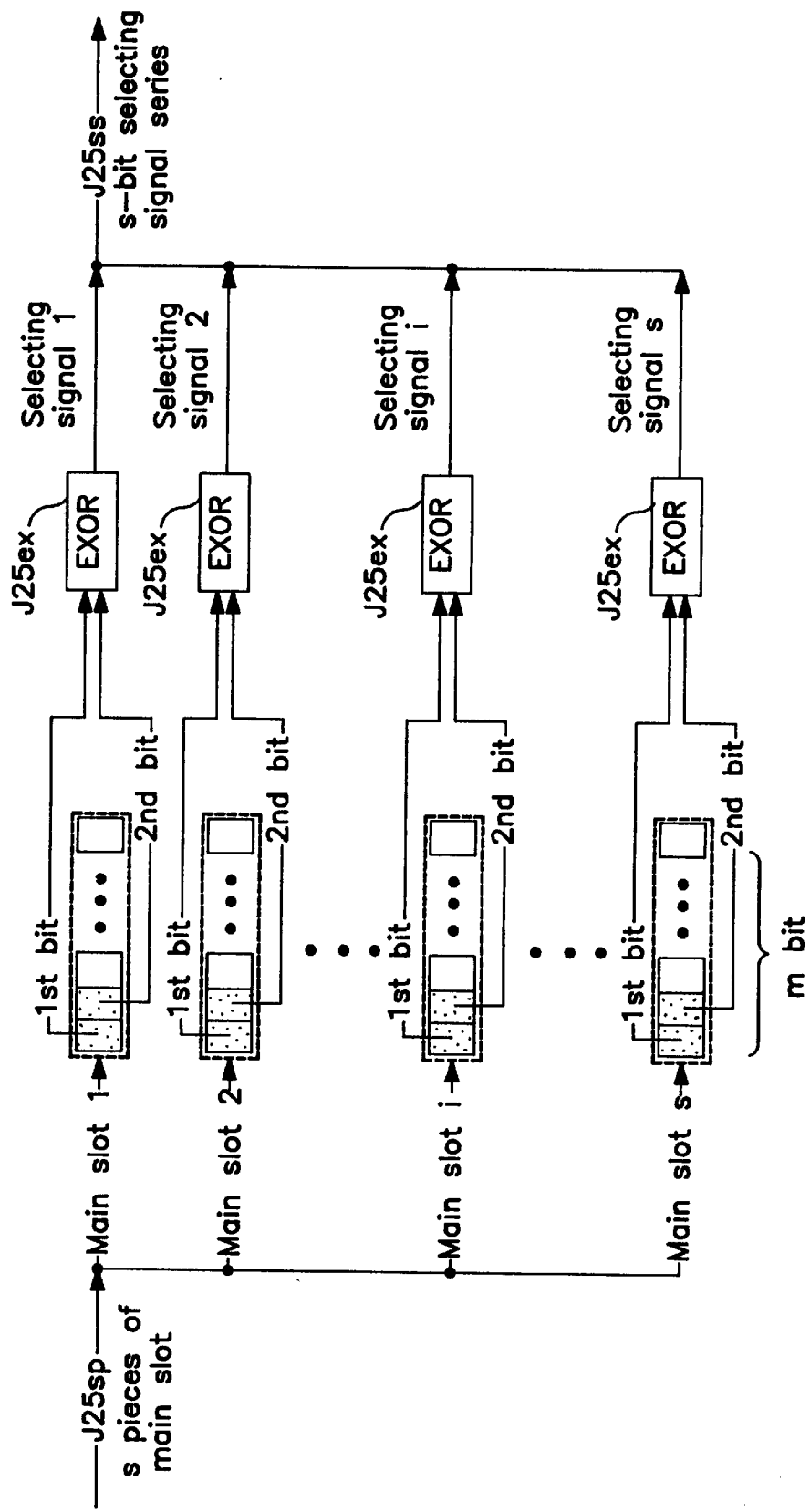
FIG. 37 is a fragmentary circuit diagram of the selection signal generating means in the 10th and 11th embodiments.

FIG. 37 is a diagram illustrating circuit configuration of the selecting signal generating means in the 10th and 11th embodiments. In FIG. 37, J25sp denotes a main slot, J25ex an EXOR (exclusive OR) circuit and J25ss an s-bit selecting signal series. The exclusive OR is executed to the first and second bits from the head of S pieces of main slot J25sp and the results become 1-bit selecting signals, and after arranged in the sequence of No. i of the main slot, they are outputted as s-bit selecting signal series J25ss. Because in the case of the 10th embodiment, s=1, they are outputted as 1-bit selecting signals J25ss.

Figure 38:
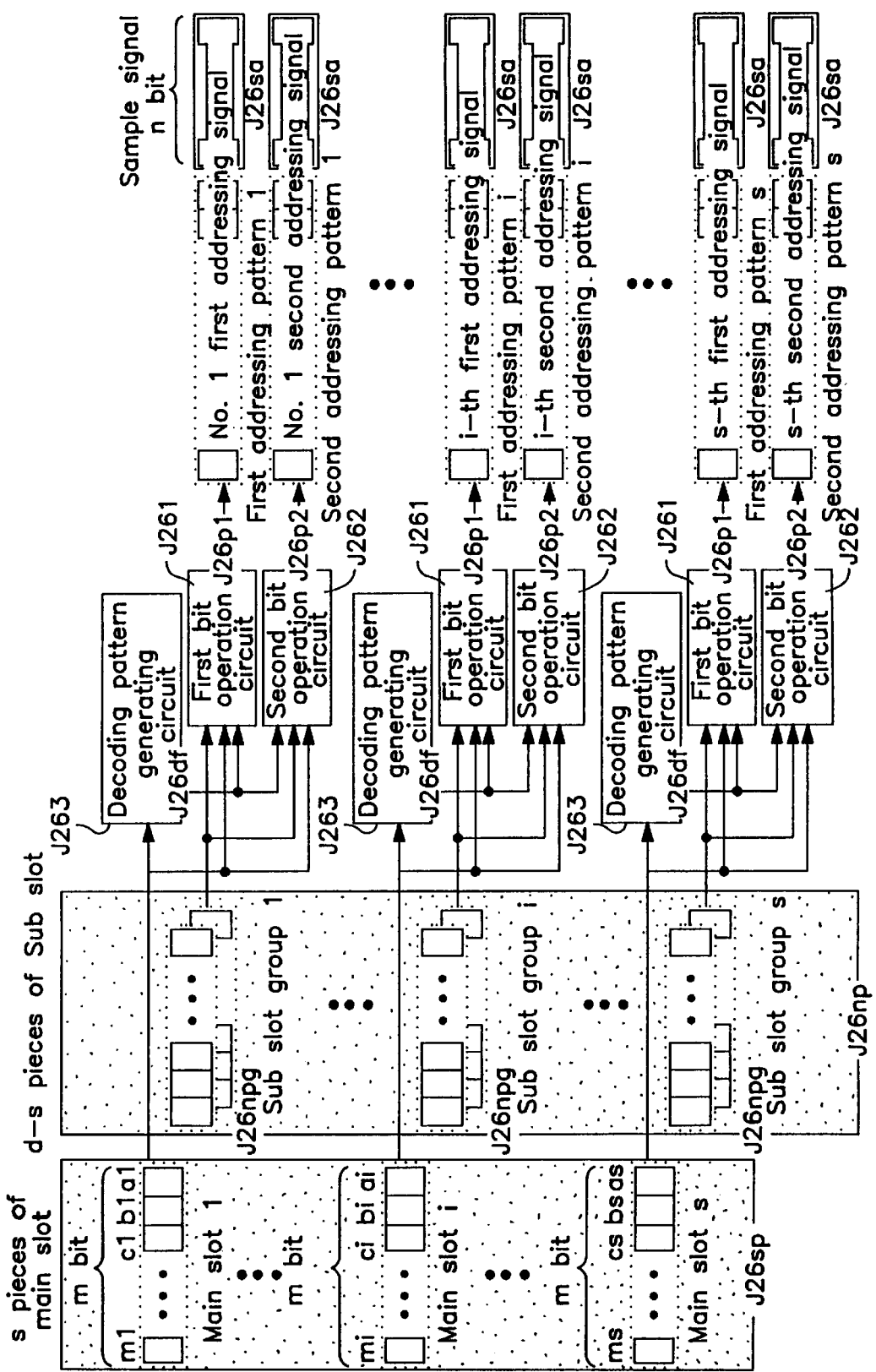
FIG. 38 is a circuit diagram illustrating the address signal generating means in the 10th and 11th embodiments.

FIG. 38 illustrates an entire block diagram of the addressing signal generating means in the 10th and 11th embodiments. In FIG. 38, J261 denotes the first bit operation circuit, J262 the second bit operation circuit, and J263 a decoding pattern generating circuit, while J26sp denotes s pieces of main slot, J26np d-s pieces of sub slot, J26npg a sub slot group, J26df a decoding pattern, J26p1 the first address pattern, J26pn the second address pattern, J26sa a sample signal, J26a1 the first addressing signal, and J26a2 the second addressing signal. In this event, the i-th sub slot group is supposed to be associated with the i-th main slot beforehand. The main slot and the sub slot groups for each i are inputted to the i-th decoding pattern generating circuit J263 and m-2 bit decoding pattern J26df is outputted. The main slot and sub slot groups for each i and the decoding pattern J26df are inputted to the i-th first bit operation circuit J261 and second bit operation circuit J262, respectively and the i-th first addressing pattern J26p1 and the second addressing pattern J26p2 are generated. The i-th first addressing pattern J26p1 and the second addressing pattern J26p2 have the sampling signal J26sa added, respectively, and the i-th first addressing signal J26a1 and the second addressing signal J26a2 are formed. The first address signal J26a1 and second addressing signal J26a2 for every i are arranged in the sequence of i, respectively and the first addressing signal series and the second addressing signal series are formed and outputted. Because in the case of the 10th embodiment, s=1, the first addressing signal J26a1 and the second addressing signal J26a2 are outputted as it is.

Figure 39:
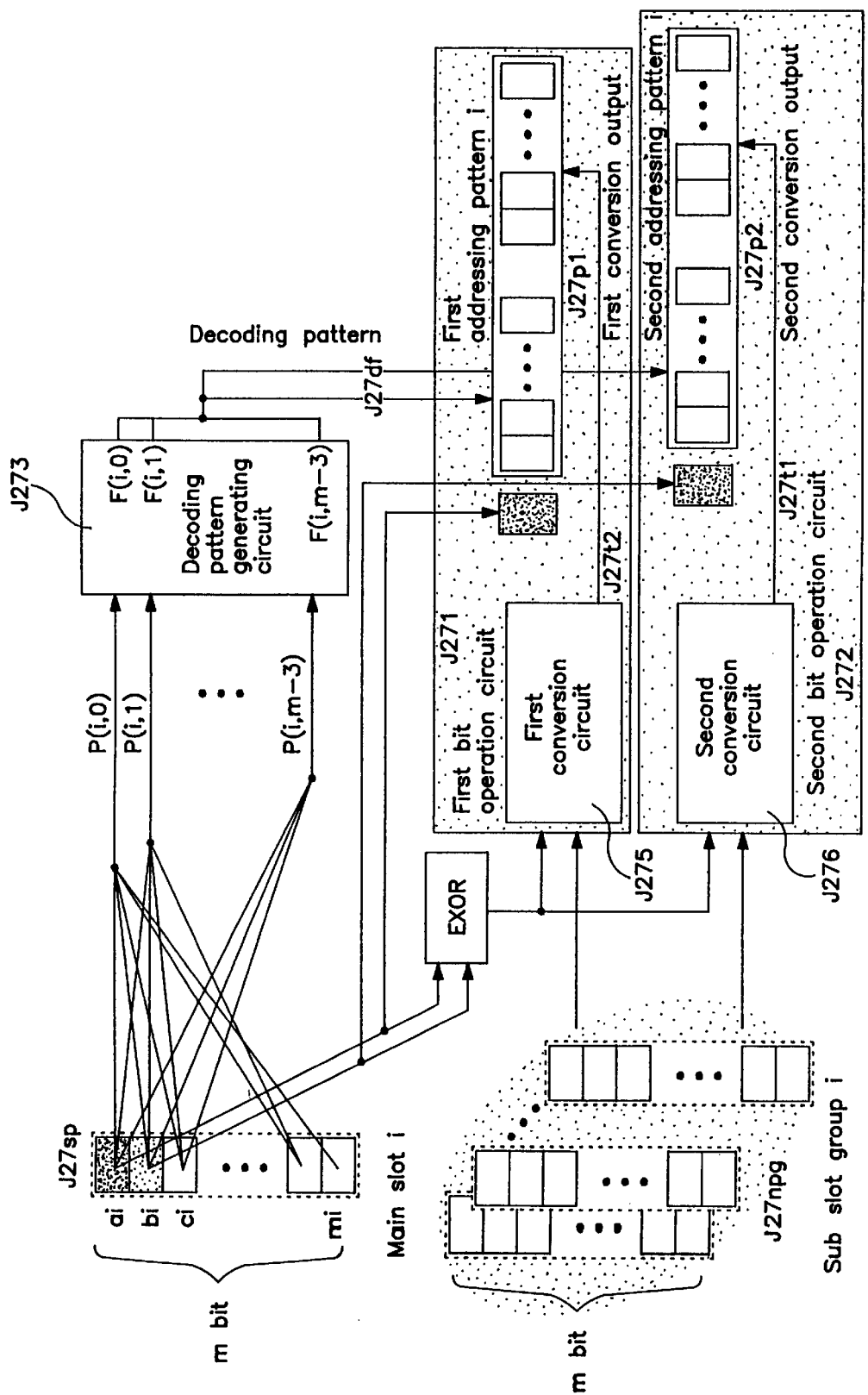
FIG. 39 is a circuit diagram illustrating the decode pattern generating means, the first bit operation circuit, and the second bit operation circuit in the 10th and 11th embodiments.

FIG. 39 is a block diagram illustrating configuration of the i-th decoding pattern generating circuit, the first bit operation circuit and the second bit operation circuit in FIG. 38. In FIG. 39, J271 denotes the first bit operation circuit, J272 the second bit operation circuit, J273 a decoding pattern generating circuit, J275 the first conversion circuit, and J276 the second conversion circuit, while J27sp denotes the i-th main slot, J27npg the i-th sub slot group comprising di-1 piece of sub slot, P(i, j) the j-th identification pattern for the i-th main slot, F(i, j) the i-th decoding symbol for the i-th main slot, J27df a decoding pattern, J27t1 the first converted output, J27t2 the second converted output, J27p1 the i-th first addressing pattern, and J27p2 the i-th second addressing pattern.

In the decoding pattern generating circuit J273, the third bit operation is done. That is, the identification pattern P(i, j) m-j bit from the head of the main slot for each i is inputted in order of j, and if the number of logical value "1" contained in the identification pattern P(i, j) is even-numbered, a 1-bit decoding symbol F(i,j) takes the logical value "0," and if odd-numbered, it takes the logical value "1" (zero is treated as an even number). The 1-bit decoding symbol F(i, j) is arranged in the sequence of j and is outputted as m-2 bit decoding pattern J27df. However, because in the case of m=2, the decoding pattern J27df is not required to be generated, the decoding pattern generating circuit J273 can be eliminated.

Figure 40:
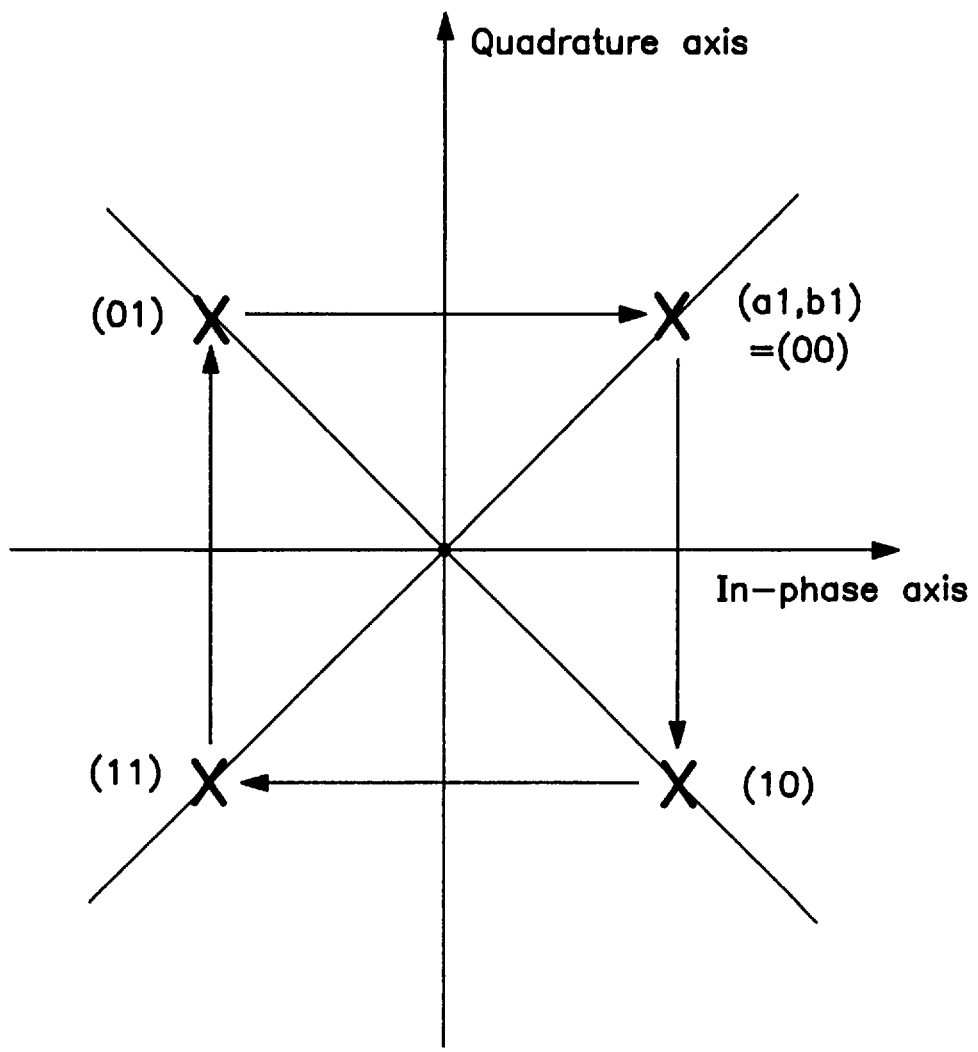
FIG. 40 is a signal space diagram illustrating the first conversion when m=2 in the 10th and 11th embodiments.

In the first conversion circuit J275, the i-th sub slot group J27npg and the i-th main slot J27sp are inputted. The first conversion circuit J275 carries out the first conversion for di-1 pieces of each sub slot in the sub slot group J27npg based on the exclusive OR of the data 2 bit from the head of the main slot. That is, this is the conversion to replace the signal point corresponding to the data in each subslot on the signal space with the data corresponding to the signal point obtained by rotating it −90° with the origin set to the center only when the logical value of exclusive OR is "1." An example of the first conversion when it has the constellation (m=2) as shown in FIG. 40 on the signal space is shown in TABLE 1 shown in FIG. 57.

From the first conversion circuit J275, the sub slot after the first conversion is arranged in the sequence of i and the m(di−1) bit first conversion output J27t1 is outputted. However, because in the case of di=1, even a single sub slot is not contained in the sub slot group J27npg, it is not necessary to carry out the first conversion and the i-th first conversion circuit J275 can be eliminated.

Figure 41:
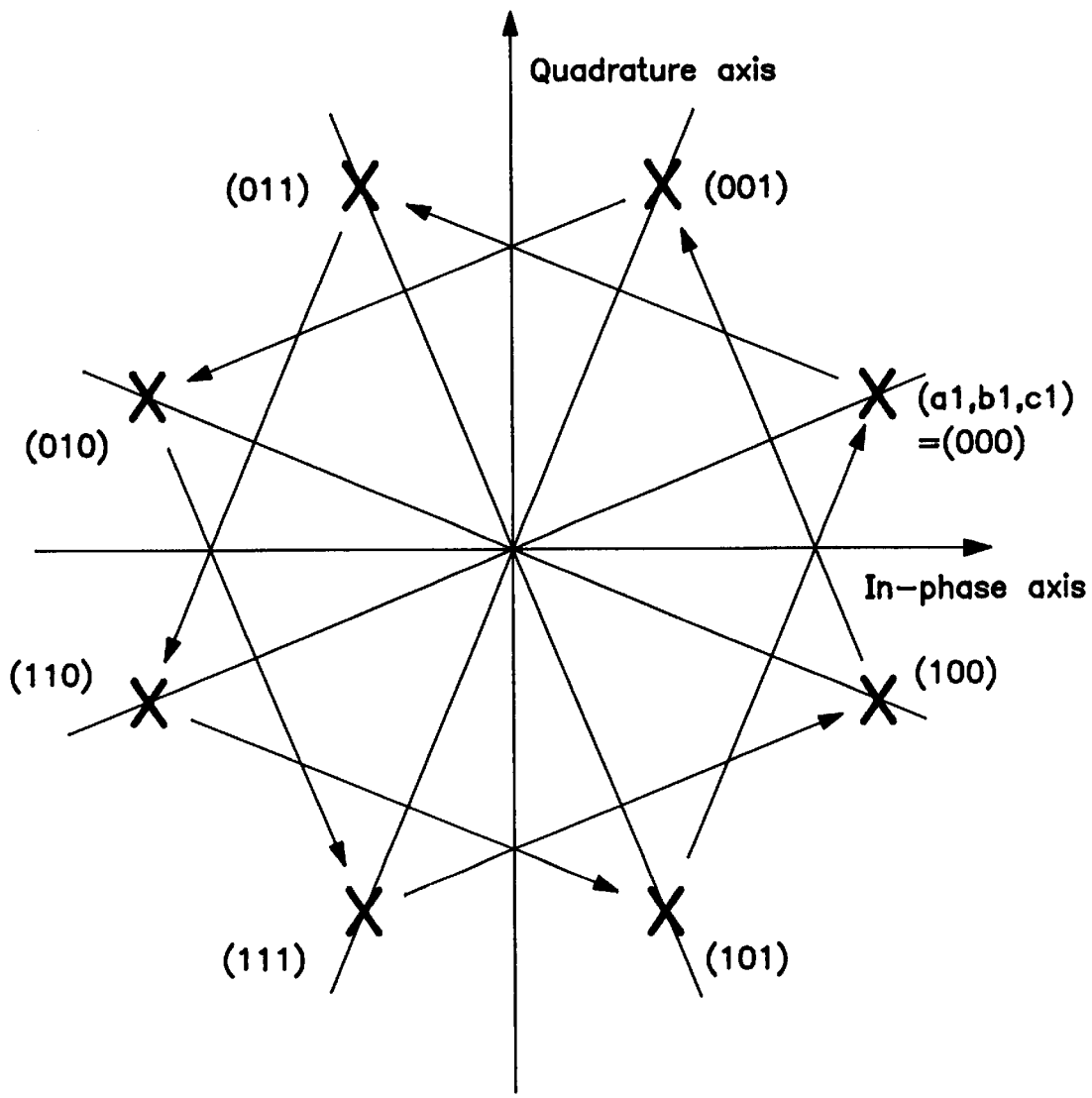
FIG. 41 is a signal space diagram illustrating the second conversion when m=3 in the 10th and 11th embodiments.

In the second conversion circuit J276, the i-th sub slot group J27npg and i-th main slot J27sp are inputted. The second conversion circuit J276 is a circuit to carry out the second conversion for di−1 pieces of each slot in the sub slot group J27npg based on the exclusive OR of the data 2 bits from the head of the main slot. That is, this is the conversion to replace the signal point corresponding to the data in each sub slot on the signal space with the data corresponding to the signal point obtained by rotating it +90° with the origin set to the center only when the logical value of exclusive OR is "1." An example of the second conversion when it has the constellation (m=3) as shown in FIG. 41 on the signal space is shown in TABLE 2 shown in FIG. 58.

From the second conversion circuit J276, the sub slot after the second conversion is arranged in the sequence of i and the m(di−1) bit second conversion output J27t2 is outputted. However, because in the case of di=1, even a single sub slot is not contained in the sub slot group J27npg, it is not necessary to carry out the second conversion and the i-th second conversion circuit J276 can be eliminated.

In the first bit operation circuit J271, to the 1 bit from the head of the i-th main slot J21sp, m-2 bit decoding pattern J27df and m(di−1) bit first converted output J27t1 are added and m×di−1 bit first addressing pattern J27plare formed and outputted.

In the second bit operation circuit J272, to the 1 bit from the head of the i-th main slot J21sp, m-2 bit decoding pattern J27df and m(di−1) bit second converted output J27t2 are added and m×di−1 bit second addressing pattern J27p2 are formed and outputted.

Figure 42A:
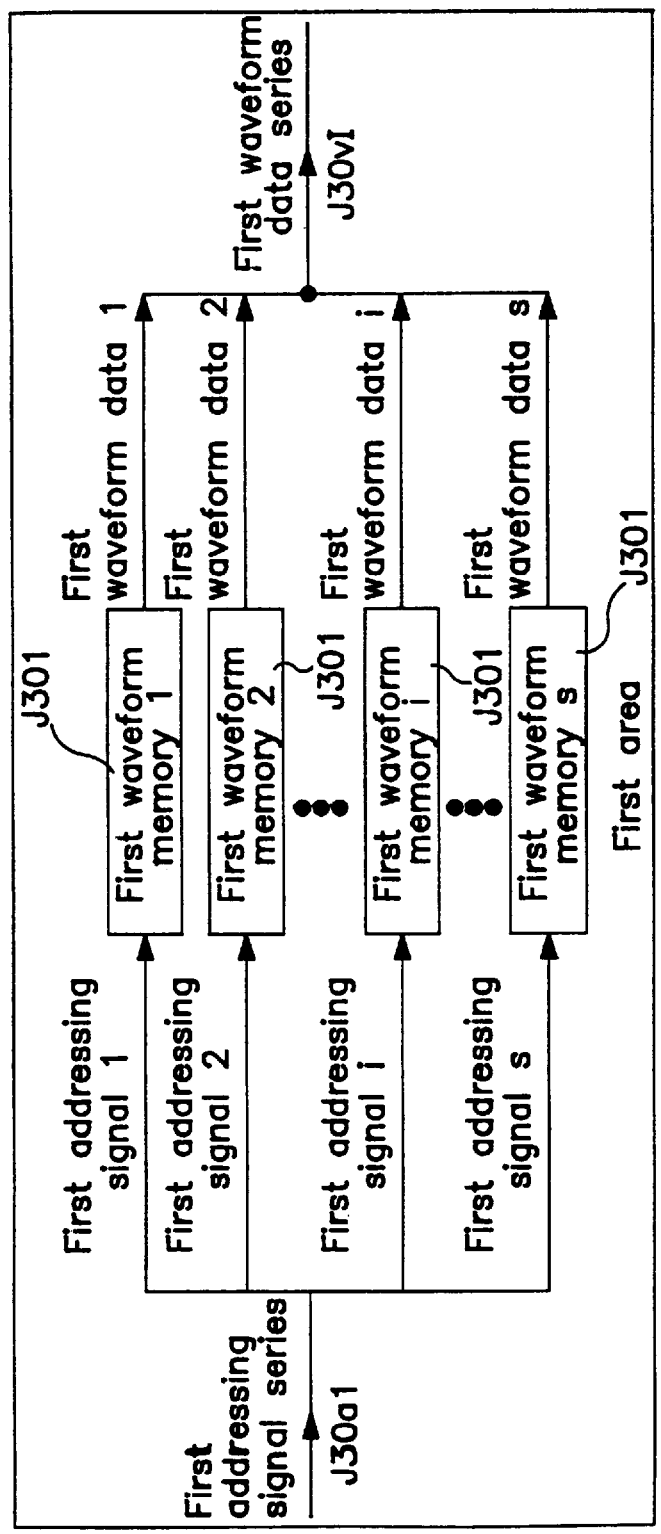
FIGS. 42a and 42b (referred to collectively as FIG. 42) are block diagrams illustrating the first and the second areas in the 11th embodiment.
Figure 42B:
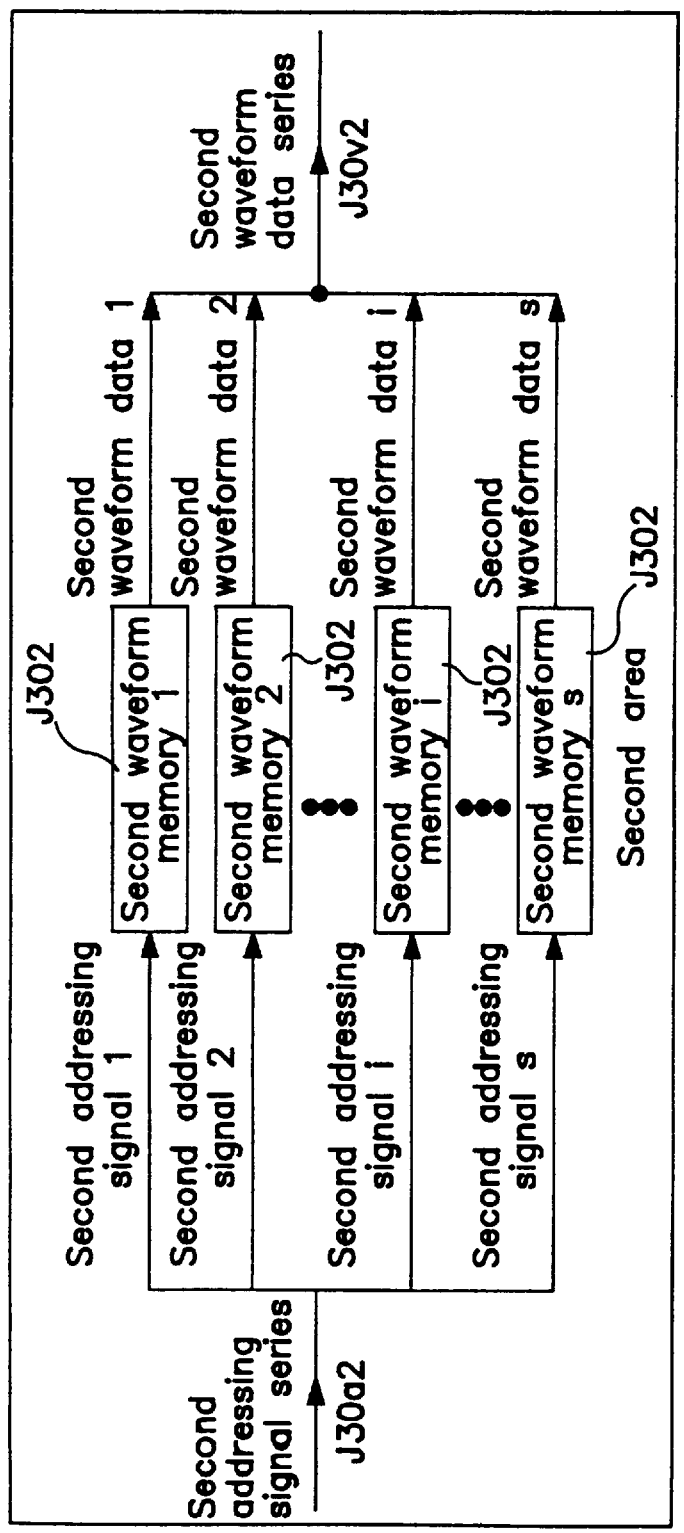

FIG. 42 is a block diagram illustrating configurations of the first and second domains in the 11th embodiment. In FIG. 42, J301 denotes s pieces of first waveform memory corresponding to s pieces of first waveform generating means, J302 s pieces of second waveform memory corresponding to s pieces of second waveform generating means, J30a1 the first addressing signal series, J30a2 the second addressing signal series, J30v1 the first waveform data series, and J30v2 the second waveform data series.

To the i-th first waveform memory J301 and the second waveform memory J302, 2^(m×di−1) types of waveform data are stored, respectively. The i-th m×di−1+n bit first addressing signal is inputted to the i-th first waveform memory J301 and the i-th m×di−1+n bit second addressing signal is inputted to the i-th second waveform memory J302. For each i, the i-th first waveform memory J301 and the second waveform memory J302 read out the i-th first waveform data and the second waveform data successively with the i-th first addressing signal and the second addressing signal used as addresses for reading out the waveform data, arrange in the sequence of i, and form the first waveform data series J30v1 and the second waveform data series J30v2.

Figure 43:
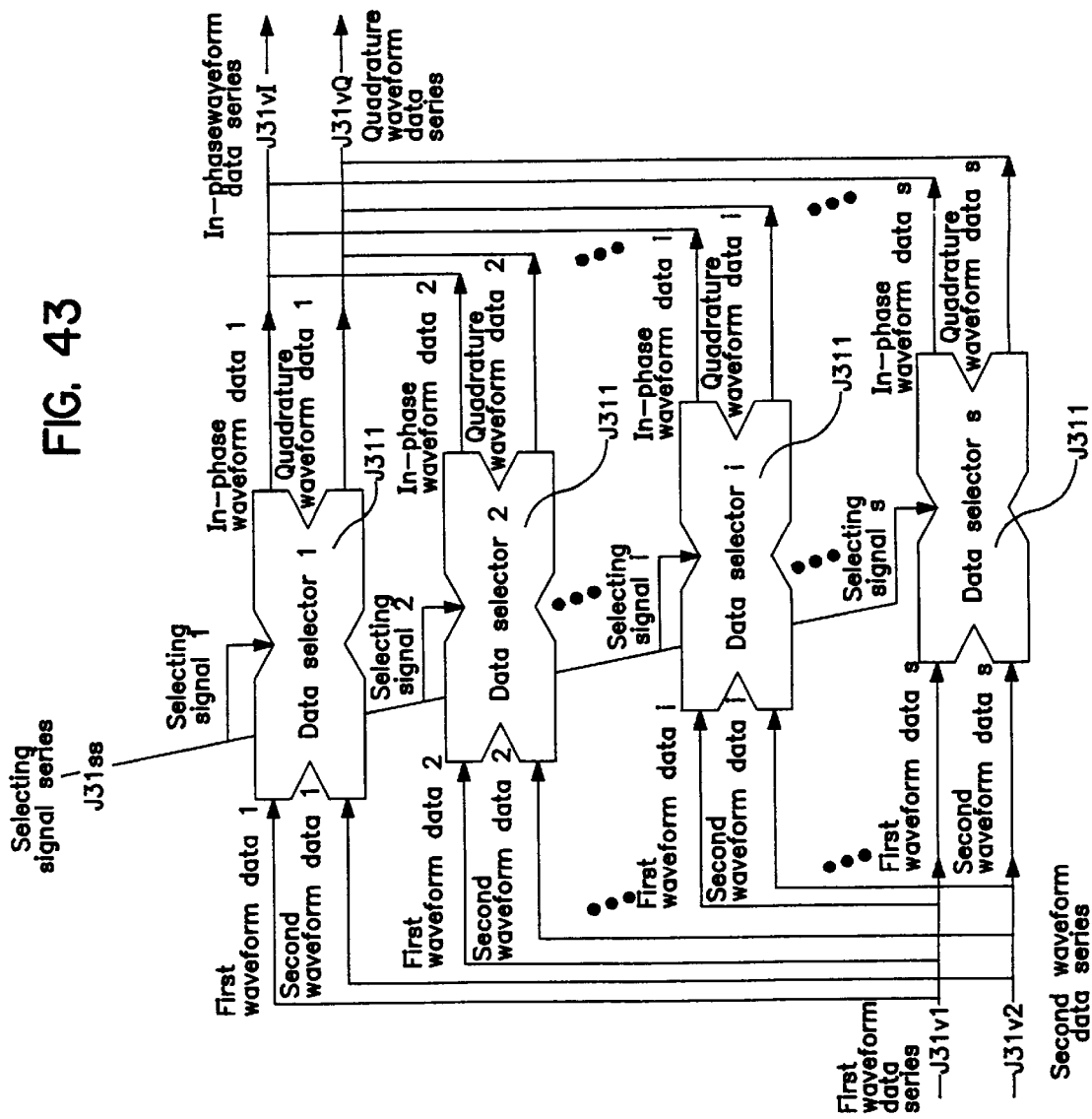
FIG. 43 is a block diagram illustrating the waveform selecting means in the 11th embodiment.

FIG. 43 is a block diagram illustrating the configuration of the waveform selecting means in the 11th embodiment. In FIG. 43, J311 is a data selector with functions of FIG. 35, J31v1 the first waveform data series, J31v2 the second waveform data series, J31ss the selecting signal series, J31vI the in-phase waveform data series, and J31vQ the quadrature data series. The i-th data selector J311 is allocated to the i-th waveform data of the first waveform data series J31v1 and the second waveform data series J31v2 one for each, and the waveform data allotted by each of the data selector J311 are arranged in the sequence of i and outputted as the in-phase waveform data series J31vI and quadrature waveform data series J31vQ.

The first and the second waveform synthesis means in the 11th embodiment can be formed with the s-input adder without using a subtracter by storing waveform data in two's-complement expression by previous calculation in the first and second waveform memories.

Figure 44:
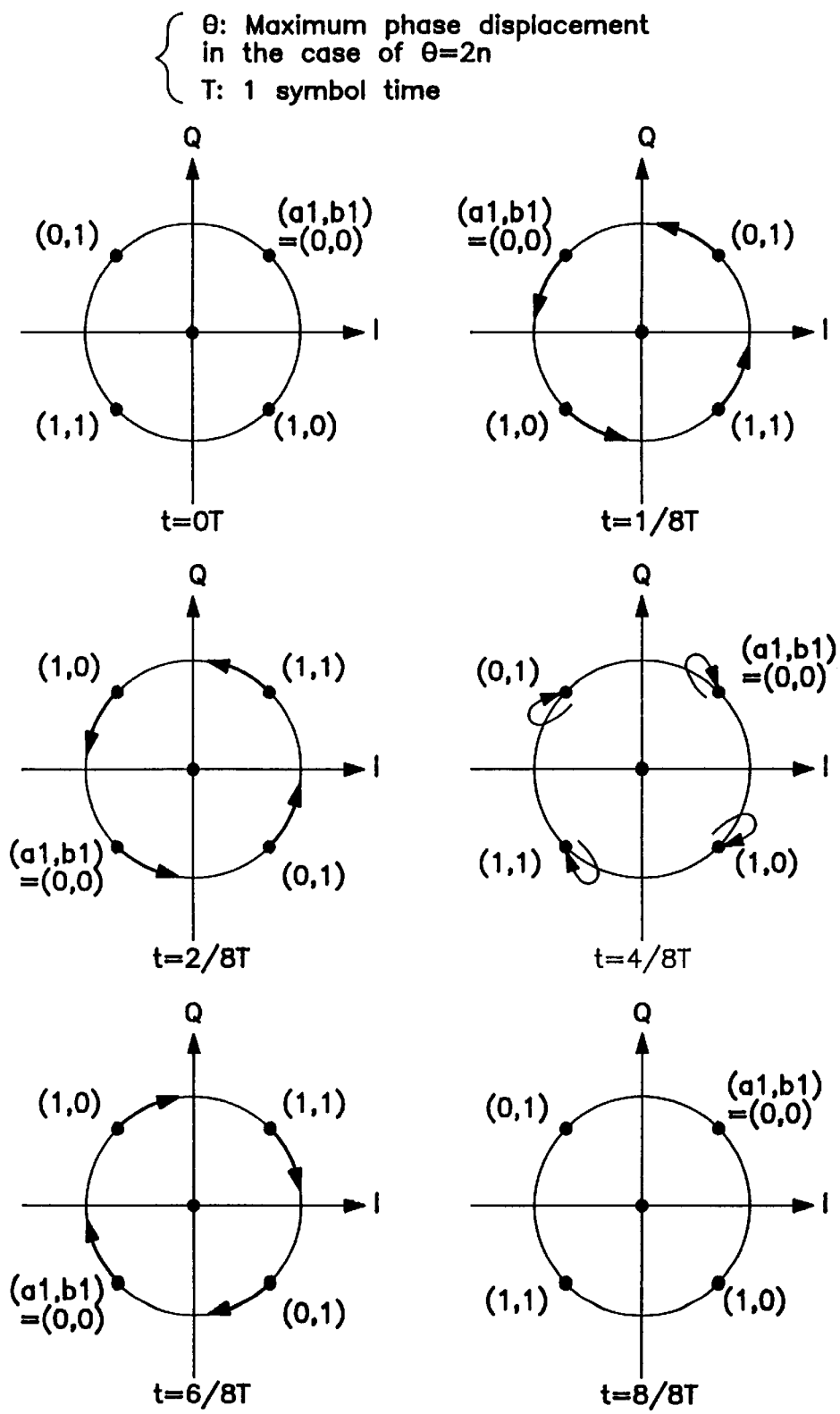
FIGS. 44a–44f (referred to collectively as FIG. 44) are diagrams illustrating the constellation when m=2 and d=1 in the 10th embodiment and applied to the QPSK-VP free from bandlimitation.
Figure 45:
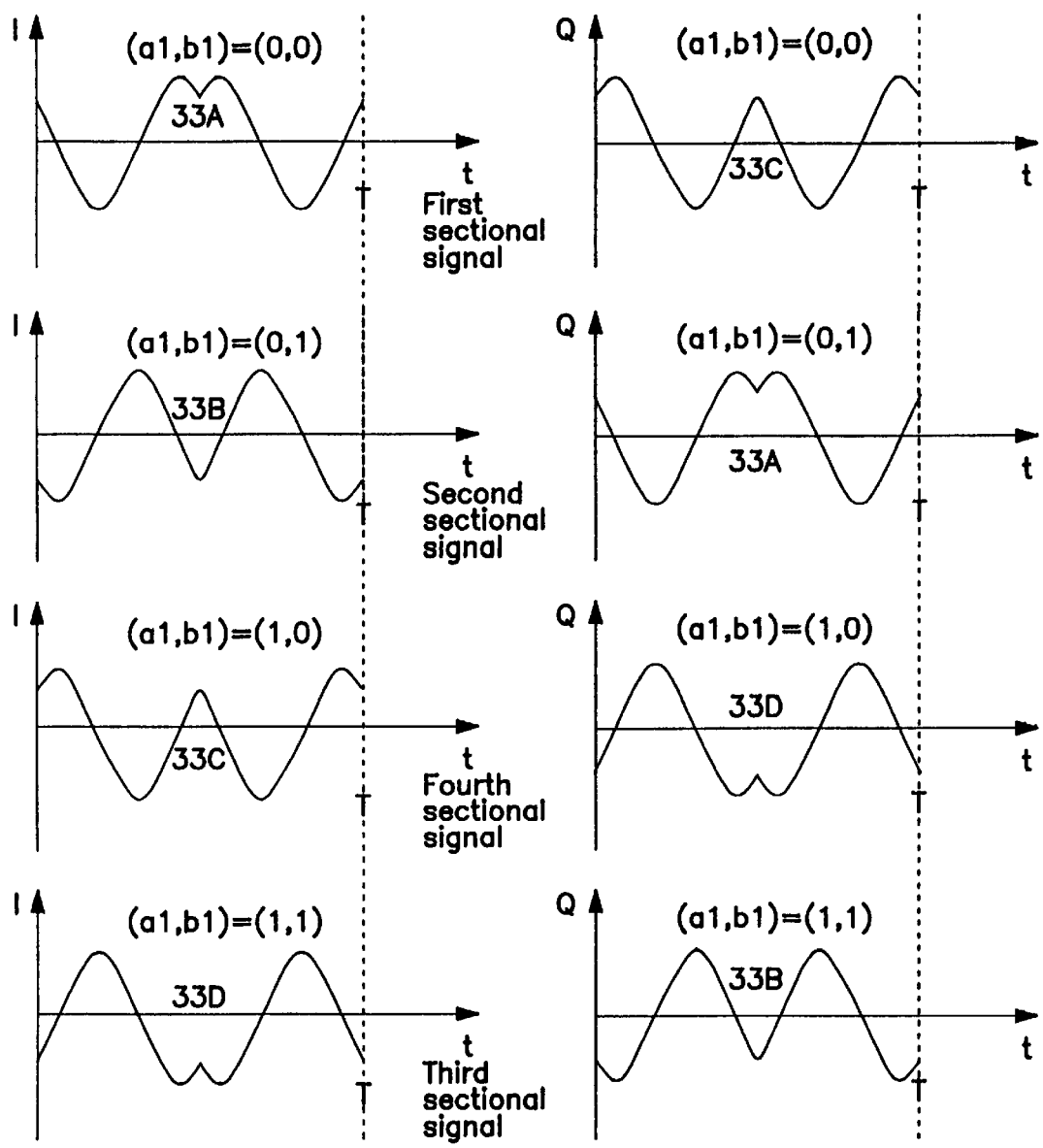
FIGS. 45a–45d (referred to collectively as FIG. 45) show baseband signal waveform diagrams of the in-phase and quadrature axes based on the constellation diagram shown in FIG. 44.

In the 10th embodiment, referring to drawings, particularly, FIG. 44, the operation when the embodiment is applied to QPSK-VP without bandlimitation with m=2, d=1 is described. In this case, the number of main slots is 1 and that of sub slots is 0, and therefore, (a1, b1) is designated as the first main slot. FIG. 44 illustrates the constellation when the maximum phase deviation θ is 2π, and indicates that each signal point allows the phase to continuously rotate in 1 symbol time with the relative positional relationship maintained. In this event, let the in-phase axis be a real-number axis, the quadrature axis be an imaginary-number axis, the complex waveform corresponding to (a1, b1)=(0, 0) be the first sectional waveform, the waveform with the first sectional waveform phase rotated 90° be the second sectional waveform, that rotated 180° be the third sectional waveform, that rotated 270° be the fourth sectional waveform, then, the second, third, fourth sectional waveforms correspond to (a1, b1)=(0, 1), (a1, b1)=(1, 1), and (a1, b1)=(1, 0), respectively. FIG. 45 illustrates above-mentioned four types of in-phase and quadrature baseband waveforms, which correspond to the first, second, fourth, and third sectional waveforms successively from the top. As clear from the figure, the in-phase and quadrature waveforms are formed by combining the four types of waveform 33A, 33B, 33C, and 33D. Of these, let 33A be the first original waveform and 33C the second original waveform, then, 33D is the inversed first waveform with positive and negative symbols of 33A inverted and 33B is the inversed second waveform with positive and negative symbols of 33C inverted. As shown in FIG. 45, each sectional waveform is formed by combining either one of the first original waveform 33A or inverted first original waveform 33D with either one of the second original waveform 33C or inverted second original waveform 33B. Therefore, as shown in TABLE 3 shown in FIGS. 59a and 59b, if the waveform data 33A, 33D are stored in the first waveform memory and the waveform data 33C, 33B in the second waveform memory, each sectional waveform can be expressed by combining each of waveform data of the first waveform memory with each of waveform data of the second waveform memory.

In this event, TABLE 3 shows examples of waveform data to be stored in the first and second waveform memories when m=2, d=1 in the 10th embodiment, and are applied to QPSK-VP without bandlimitation.

In FIG. 39, considering the case in which m=2, there is one main slot and no sub slot, the addressing pattern is only one bit each at the head, and the first addressing pattern becomes a1 and the second addressing pattern b1. Since from FIG. 37, the selecting signal is exclusive OR of a1 and b1, when (a1, b1)=(0, 0) and (1, 1), the first waveform memory data is selected to the in-phase axis and the second waveform memory data to the quadrature axis, and when (a1, b1)=(0, 1) and (1, 0), the first waveform memory data is selected to the in-phase axis and the first waveform memory data to the quadrature axis. As described above, the desired sectional waveforms of FIG. 45 can be formed in correspondence to the main slot (a1, b1) and baseband waveform data of QPSK-VP free from bandlimitation can be obtained. These are D/A-converted, smoothed by filter, if required, and outputted as in-phase signal waveforms and quadrature signal waveforms.

Next, in order to show the best embodiment according to the present invention, operation when m=2 and d=s=2 in the 11th embodiment and the embodiment is applied to band-limited QPSK-VP is described in detail with reference to the accompanying drawings, particularly, FIG. 55.

Figure 46:
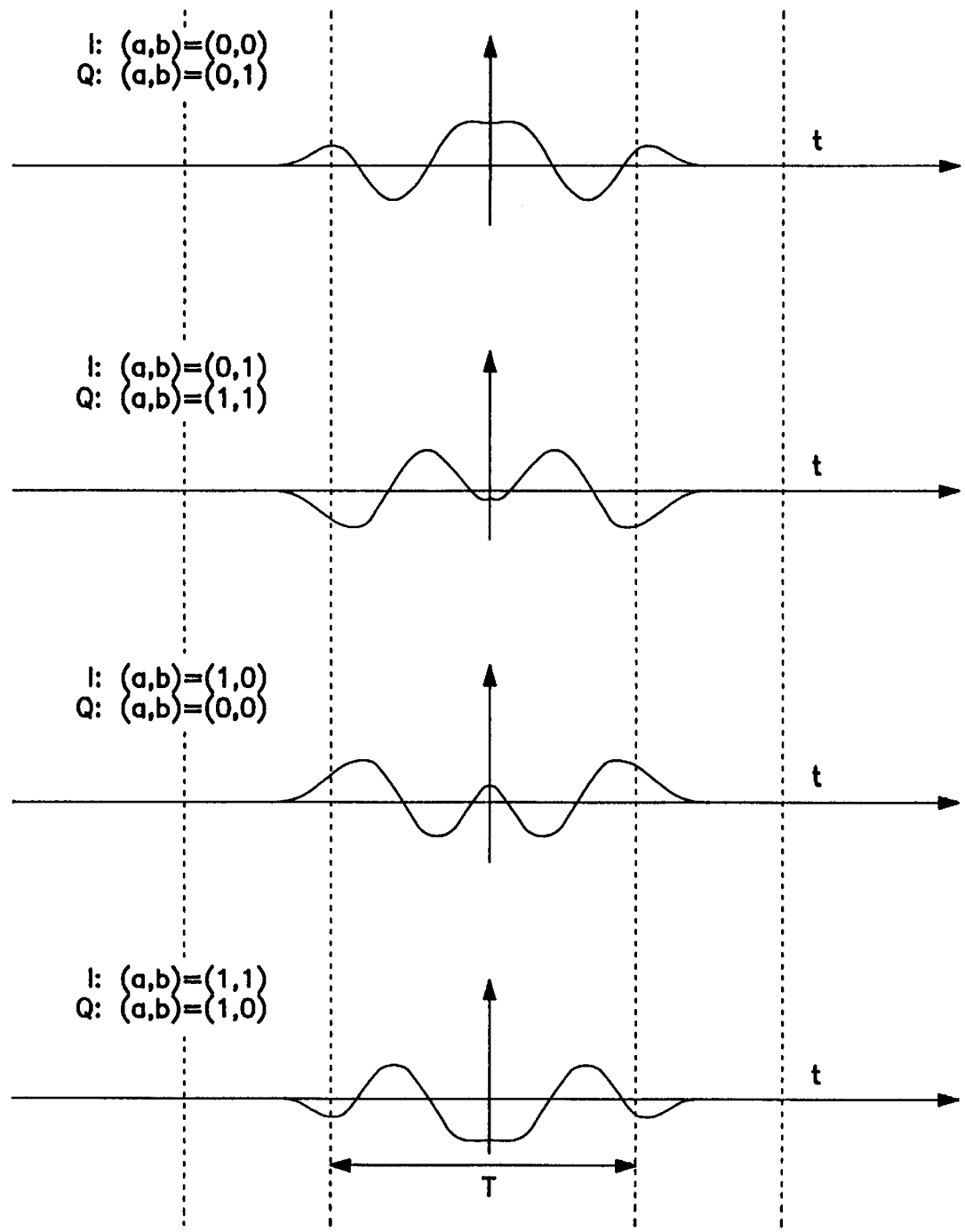
FIGS. 46a–46d (referred to collectively as FIG. 46) show baseband signal waveform diagrams of the in-phase and quadrature axes after bandlimitation when m=2 and d=s=2 and applied to the band-limited QPSK-VP in the 11th embodiment.
Figure 47:
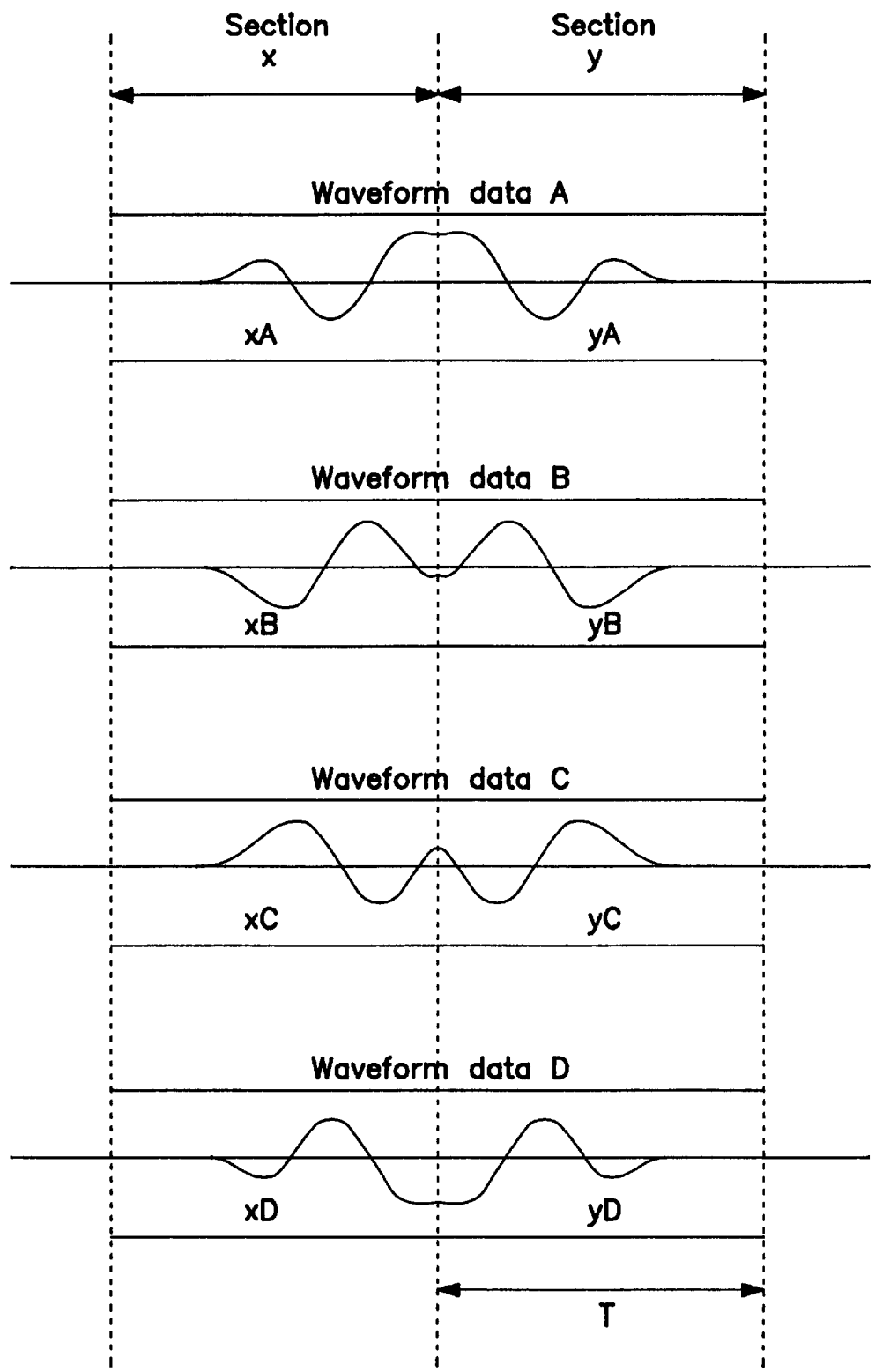
FIG. 47 shows baseband signal waveform data dividing the baseband signal waveform for 2 symbol times according to FIG. 46 into two sections at one symbol time.

In this event, since m=2 and d=s=2, the number of main slots is 2 and that of sub slots is 0. Therefore, (a1, b1) corresponding to the first half of the waveform is designated to the first main slot and (a2, b2) corresponding to the latter half of the waveform to the second main slot. FIG. 46 illustrates band-limited in-phase and quadrature baseband signal waveforms with effects of intersymbol interference for 2 symbols taken into account for FIG. 45, and FIG. 47 is the waveform data with the baseband signal waveform for 2 symbol times of FIG. 46 divided into two sections x, y for each one symbol time, and four types of waveform data of the section x correspond to the main slot (a1, b1) and four types of waveform data yA, yB, yC, yD of the section y correspond to the main slot (a2, b2), respectively.

Figure 55:
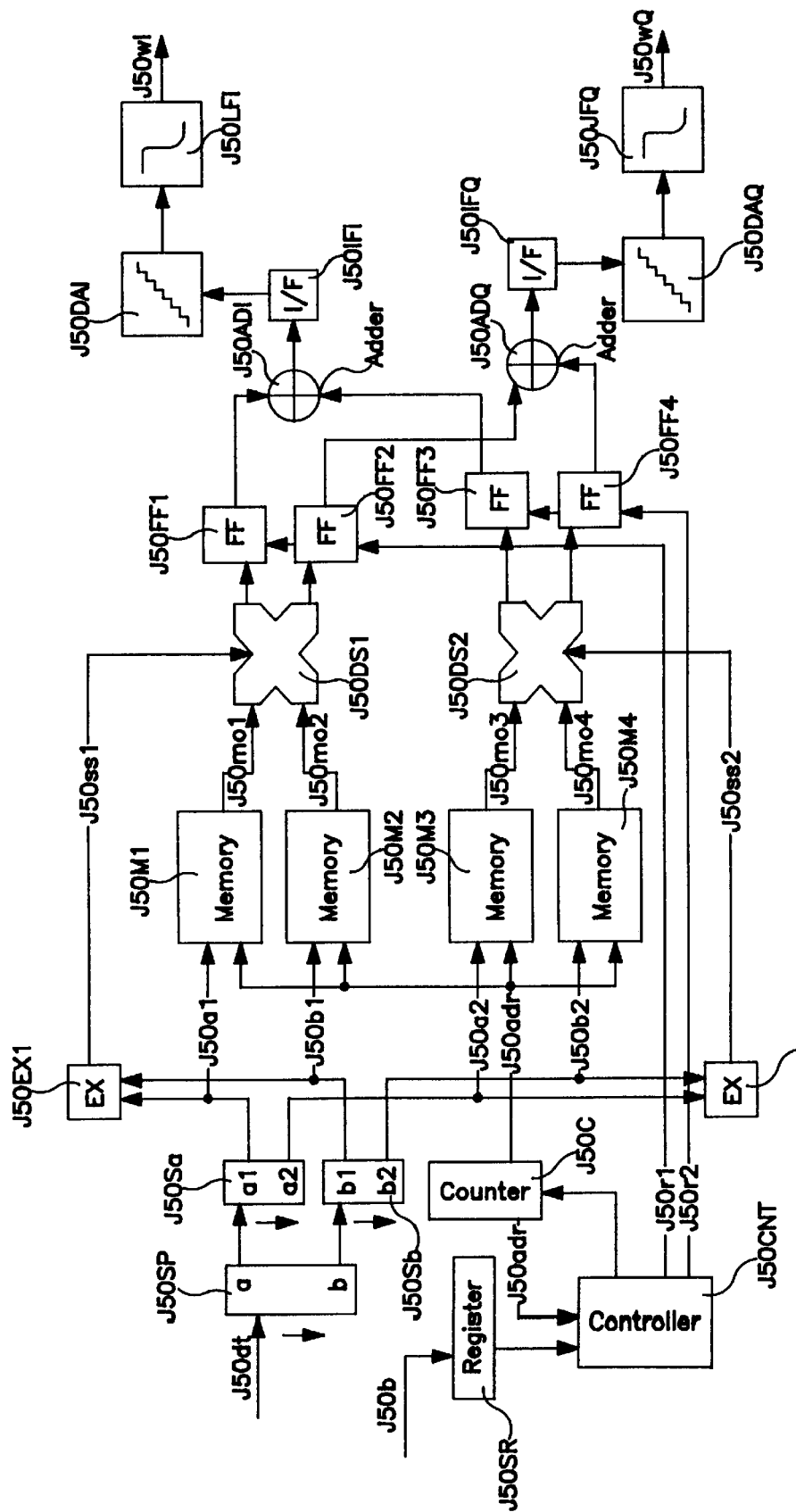
FIG. 55 is a detailed drawing illustrating the best embodiment condition of the present invention when the waveform shaping data shown in FIG. 47 is used to constitute a waveform shaping equipment.

FIG. 55 is a schematic block diagram illustrating the best embodiment of the waveform shaping equipment of the 11th embodiment.

In FIG. 55, J50SP denotes a shift register for serial parallel conversion, J50Sa a shift register for retaining transmission data for 2 symbols related to the quadrature component (a1, a2), J50Sb a shift register for retaining transmission data for 2 symbols related to the in-phase component (b1, b2), J50SR is a status register for expressing the transmission status after burst control signals are inputted, J50C a 3-bit counter for specifying the sampling point, J50EX1 and J50EX2 exclusive-OR circuits for controlling change-over of the data selector, J50M1 the primary first waveform memory for retaining waveforms corresponding to the first half of the sectional waveforms, J50M2 the primary second waveform memory for retaining waveforms corresponding to the first half of the sectional waveforms, J50M3 the secondary first waveform memory for retaining waveforms corresponding to the latter half of the sectional waveforms, J50M4 the secondary second waveform memory for retaining waveforms corresponding to the latter half of the sectional waveforms, J50DS1 and J50DS2 data selectors for changing over output devices of waveforms, J50FF1, J50FF2, J50FF3, J50FF4 are flip-flops for cutting out read-out waveforms, J50CNT a control circuit for controlling counting of counter J50C and for controlling timing of flip-flops (J50FF1, J50FF2, J50FF3, J50FF4) at the output section, J50ADI and J50ADQ adders, J50IFI and J50IFQ D/A converter interface circuits, J50DAI and J50DAQ D/A converters. J50dt denotes transmission data, J50b burst control signals, J50a1 the primary first addressing pattern for the memory J50M1, J50b1 the secondary first addressing pattern for the memory J50M2, J50a2 the primary second addressing pattern for the memory J50M3, J50b2 the secondary second addressing pattern for the memory J50M4, J50adr the 3-bit output for counter j50C, J50ss1 the output of exclusive-OR circuit J50EX1, J50ss2 the output of exclusive-OR circuit J50EX2, J50mo1 the output of memory J50M1, J50mo2 the output of memory J50M2, J50mo3 the output of memory J50M3, J50mo4 the output of memory J50M4, J50r1 reset signals of flip-flops (J50FF1, J50FF2), J50r2 reset signals of flip-flops (J50FF3, J50FF4), J50wI the in-phase shaped waveform output, and J50wQ the quadrature shaped waveform output.

Figure 56:
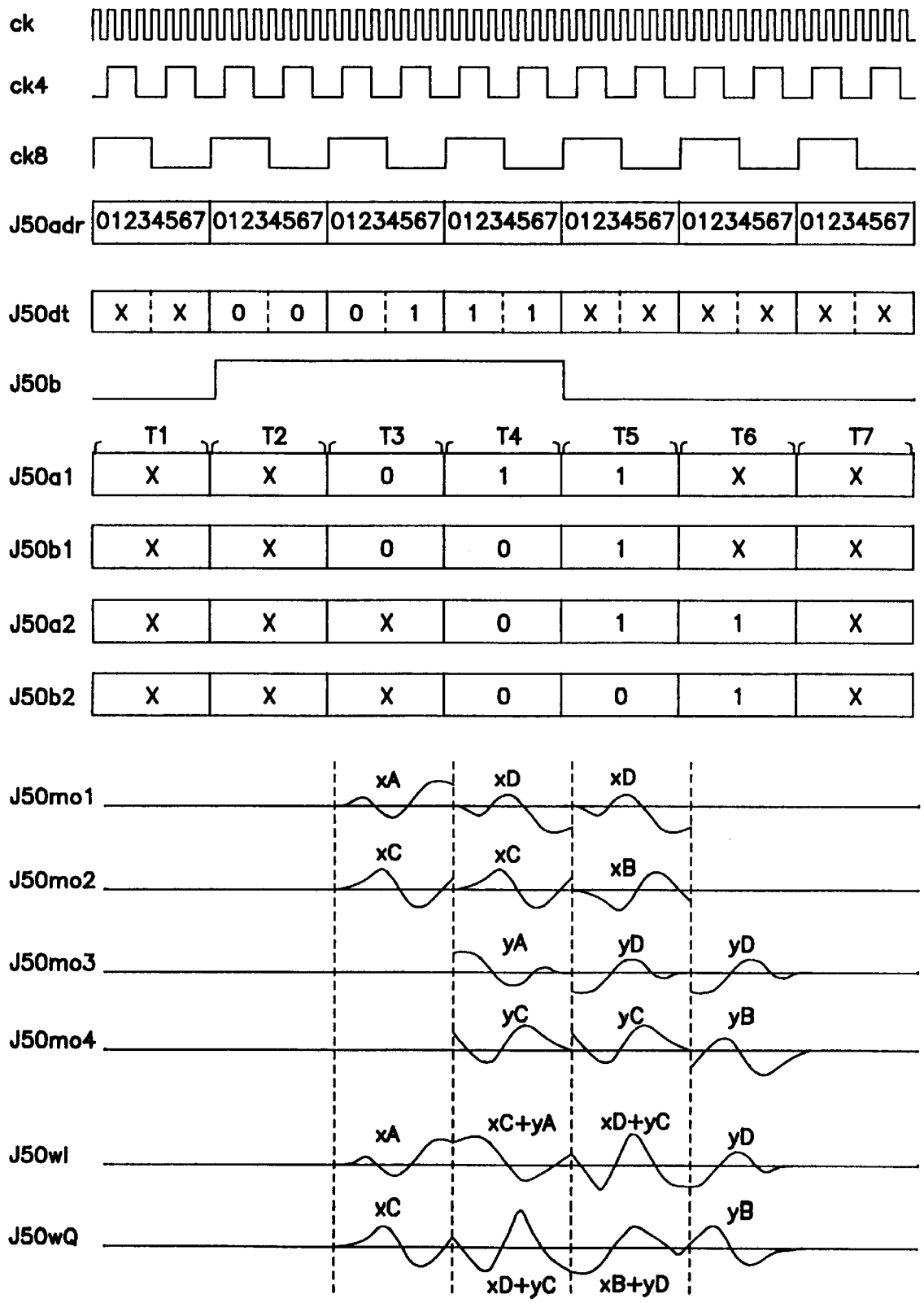
FIG. 56 is a diagram illustrating signal waveforms of each section in the embodiment of FIG. 55.

FIG. 56 is a diagram illustrating the operation timing of each portion of the waveform shaping equipment in FIG. 55. In FIG. 56, the system clock is represented by ck, the clock dividing the system clock ck by 4 is shown with ck4, and the clock dividing the system clock ck by 8 is shown with ck8.

In FIG. 56, 6-bit transmission data string "0, 0, 0, 1, 1, 1" is inputted as a packet, and data value "X" before and after the packet denotes non-significant data. The level of burst control signal J50b is switched to HIGH when the transmission data "0" at the head of the packet is inputted and to LOW when the input of the last data "1" is completed. The shift register J50SP takes in the data value 2 bits each from the head of the packet in synchronism with divide-by-four clock ck4 while shifting and outputs the precedingl bit data out of the 2 bits to the shift register J50Sb as an in-phase component and the succeeding 1 bit data to the shift register J50Sa as a quadrature component. The shift registers J50Sa and J50Sb operate in synchronism with the symbol clock ck8 and retain the data value for the latest 2 symbols. The shift register J50Sa outputs the data value taken in 1 symbol clock before as the primary second addressing pattern J50a2 and the data value taken in at the present symbol clock as the primary first addressing pattern J50a1, while the shift register J50Sb outputs the data value taken in 1 symbol clock before as the secondary second addressing pattern J50b2 and the data value taken in at the present symbol clock as the primary second addressing pattern J50b1.

In each memory, waveform data is stored as shown in TABLE 4 shown in FIGS. 6a–6d, and the primary first waveform memory using the primary first addressing pattern J50a1 and counter output J50adr as address, the primary second waveform memory using the primary second addressing pattern J50b1 and counter output J50adr as address, the secondary first waveform memory using the secondary first addressing pattern J50a2 and counter output J50adr as address, and the secondary second waveform memory using the secondary second addressing pattern J50b2 and counter output J50adr as address read out the sectional waveforms assigned to them, respectively. Of the sectional waveforms read out from relevant memory tables, the memory outputs J50mo1 and J50mo2 are inputted to data selector J50DS1 and memory outputs J50mo3 and J50mo4 are inputted to data selector J50DS2, respectively. Data selectors J50DS1 and J50DS2 are data selectors with functions specified in FIG. 35 and the data selector J50DS1 changes over the output device for the sectional waveforms read out, respectively, using the data value J50a1 and J50b1 outputted from the exclusive-OR circuit J50EX1 as selecting signals and the data selector J50DS2 changes over the output device for the sectional waveforms read out, respectively, using the data value J50a2 and J50b2 outputted from the exclusive-OR circuit J50EX2 as selecting signals. The sectional waveforms with the output devices decided by data selectors J50DS1 and J50DS2 are taken in to flip-flops (J50FF1, J50FF2, J50FF3, J50FF4) by every system clock ck. In the flip-flops (J50FF1, J50FF2, J50FF3, J50FF4), the outputs are enable-controlled with the reset signals generated by the control means J50CNT, and synthesizing the outputs of flip-flops after enable-control with intersymbol interference at the in-phase and quadrature axes, respectively, in adders J50ADI, J50ADQ at the latter stage, waveform shaping at the time of burst is achieved. The shaped waveforms after synthesis at adders J50ADI, J50ADQ are smoothed by low-pass filters J50LFI, J50LFQ after converted into step-form analog waveforms at D/A converters J50DAI, J50DAQ, and QPSK-VP shaped waveforms J50wI and J50wQ after bandlimitation for the in-phase and the quadrature axes are outputted.

Next, waveform shaping at the time of burst will be described with reference to FIG. 56 for control timing of reset signals J50r1, J50r2.

Because at time T1 and T2 before transmission data is taken in to shift registers J50Sa and J50Sb, there is no transmission data, the level of both reset signals J50r1 and J50r2 is fixed to HIGH and zero-level signals are outputted from in-phase and quadrature shaped waveform outputs J50wI, J50wQ. Because at time T3 after one symbol time passes from the head of the packet, the transmission data "0, 0" from the head of the packet to the 2nd bit is retained at the first outputs J50a1, J50b1, respectively, of the shift registers J50Sa and J50Sb, waveform shaping at the burst rising edge is achieved by holding the level of the reset signal J50r1 to LOW and that of the reset signal J50r2 to HIGH. At time T and T5 when the packet is continuously transmitted, the level of both reset signals J50r1 and J50r2 is set to LOW, and shaped continuous waveforms synthesizing the transmission data of the present symbol clock and intersymbol interference with transmission data 1 symbol clock before are achieved. Because at time T6 1 symbol after the completion of packet, the transmission data "1, 1" at the final 2nd bit of the packet is retained only at the second outputs J50a1, J50b1 of the shift registers J50Sa and J50Sb, respectively, waveform shaping at the time of the burst trailing edge is achieved by holding the level of the reset signal J50r1 to HIGH and the reset signal J50r2 to LOW. Because after time T7, there is no transmission data, the levels of both reset signals J50r1 and J50r2 are fixed to HIGH and zero-level signals are outputted from in-phase and quadrature waveform shaping outputs J50wI, J50wQ.

Figure 48:
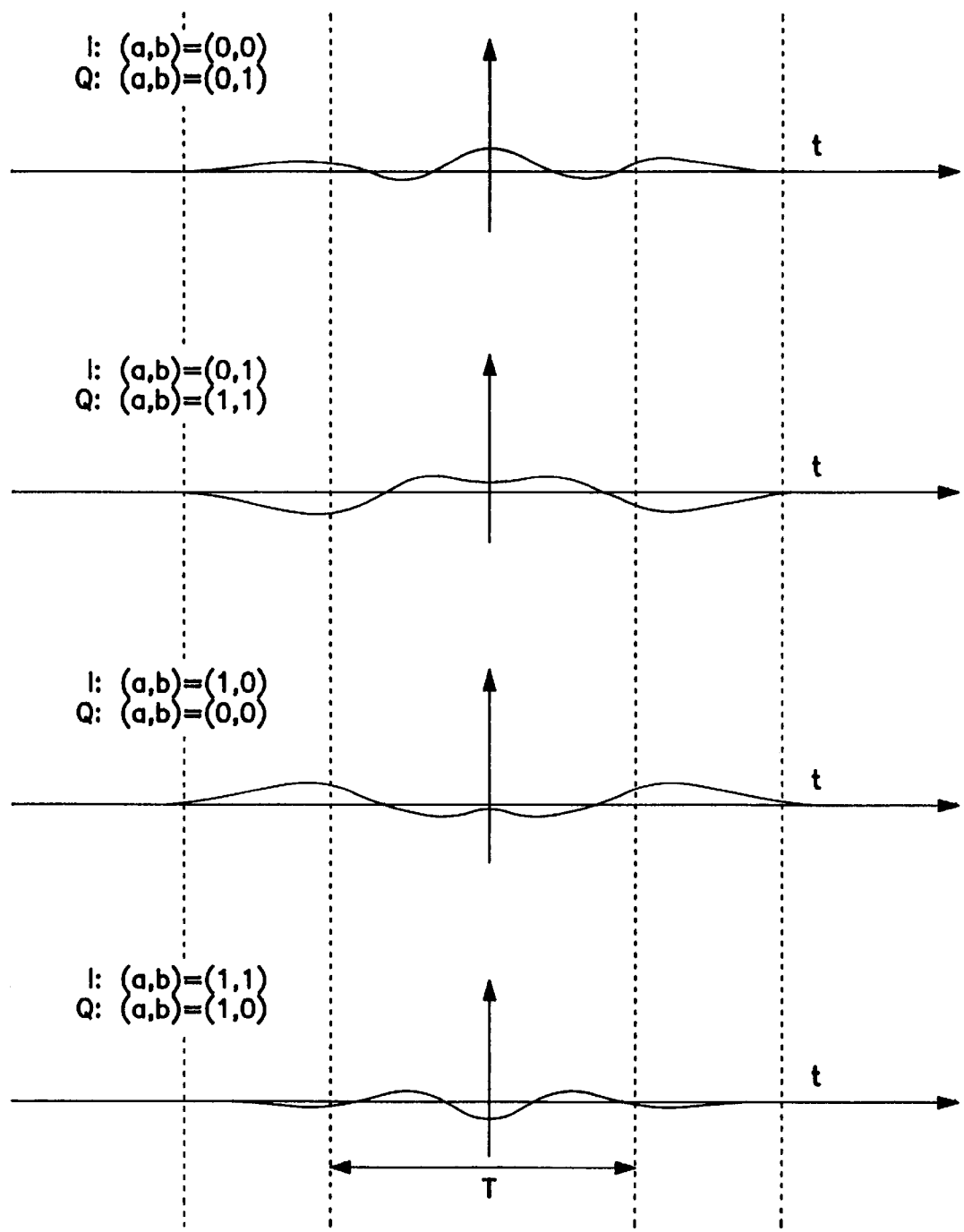
FIG. 48 shows baseband signal waveform diagrams of the in-phase and quadrature axes after bandlimitation when m=2, d=3, s=1 and applied to the band-limited QPSK-VP in the 10th embodiment.
Figure 49:
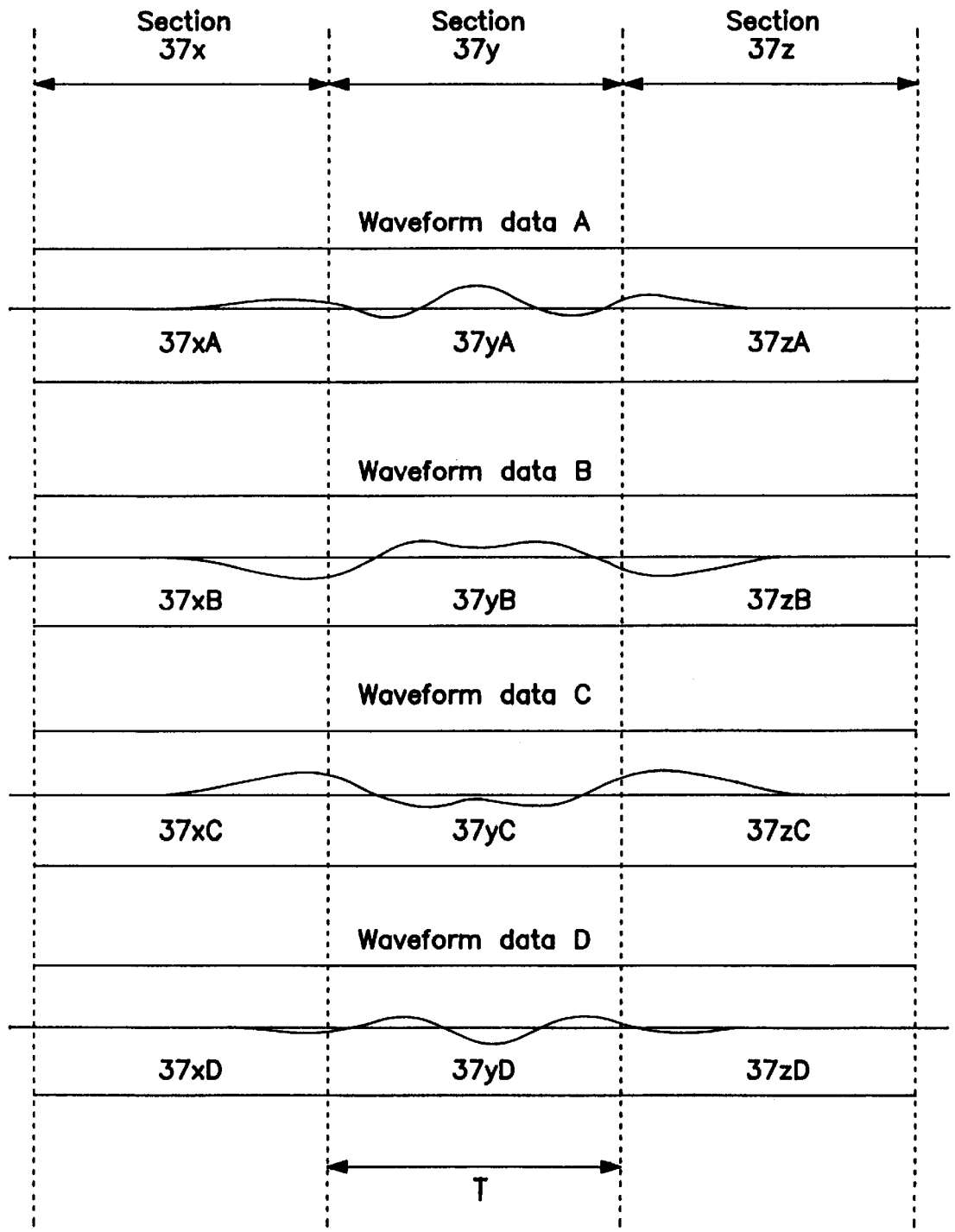
FIG. 49 shows baseband signal waveform data dividing the baseband signal waveform for 3 symbol times according to FIG. 48 into three sections at one symbol time.

Now in the 10th embodiment, operation when m=2, d=3 and the invention is applied to band-limited QPSK-VP will be described with reference to drawings, particularly, FIG. 48. In this event, because the number of main slots is 1 and the number of sub slots is 2, (a2, b2) is designated as first main slot and (a1, b1) the first sub slot, (a3, b3) second sub slot. FIG. 48 illustrates in-phase and quadrature baseband signal waveforms after bandlimitation with effects of intersymbol interference for 3 symbols taken into account with respect to FIG. 42. FIG. 49 is waveform data when the baseband signal waveforms for 3 symbol times in FIG. 48 are divided into three sections 37x, 37y, 37z for each 1 symbol time, and the waveform data of section 37x corresponds to sub slot (a1, b1), the waveform data of section 37y corresponds to main slot (a2, b2), and the waveform data of section 37z corresponds to sub slot (a3, b3), respectively. TABLE 5 shown in FIGS. 61a–61d shows waveform data stored in the first and second waveform memories corresponding to the main slot (a2, b2). Unlike the case of d=1, the waveform memories store data with the effects of intersymbol interference from the slots before and after added.

In FIG. 39, let m=2, the number of main slots be one and that of sub slots be two, then, the first addressing pattern becomes (a2, a1', b1', a3', b3') and the second addressing pattern (b2, a1', b1', a3', b3'). Of these, it is understood that a2 and b2 of the first bit originate from the main slot and correspond to the 1-bit addressing pattern when d=1, which was previously mentioned. It is also understood that the second to fifth bits a1', b1', a3', b3' indicate variations of waveforms generated by intersymbol interference arising from sub slots. As clear from FIG. 37, because the selecting signals are decided by the main slot only, the case is, in principle, same as that when d=1, and the selecting signals are the exclusive-OR of a2 and b2. Therefore, the operation after the waveform shaping equipment is the same as that when d=1.

Figure 50:
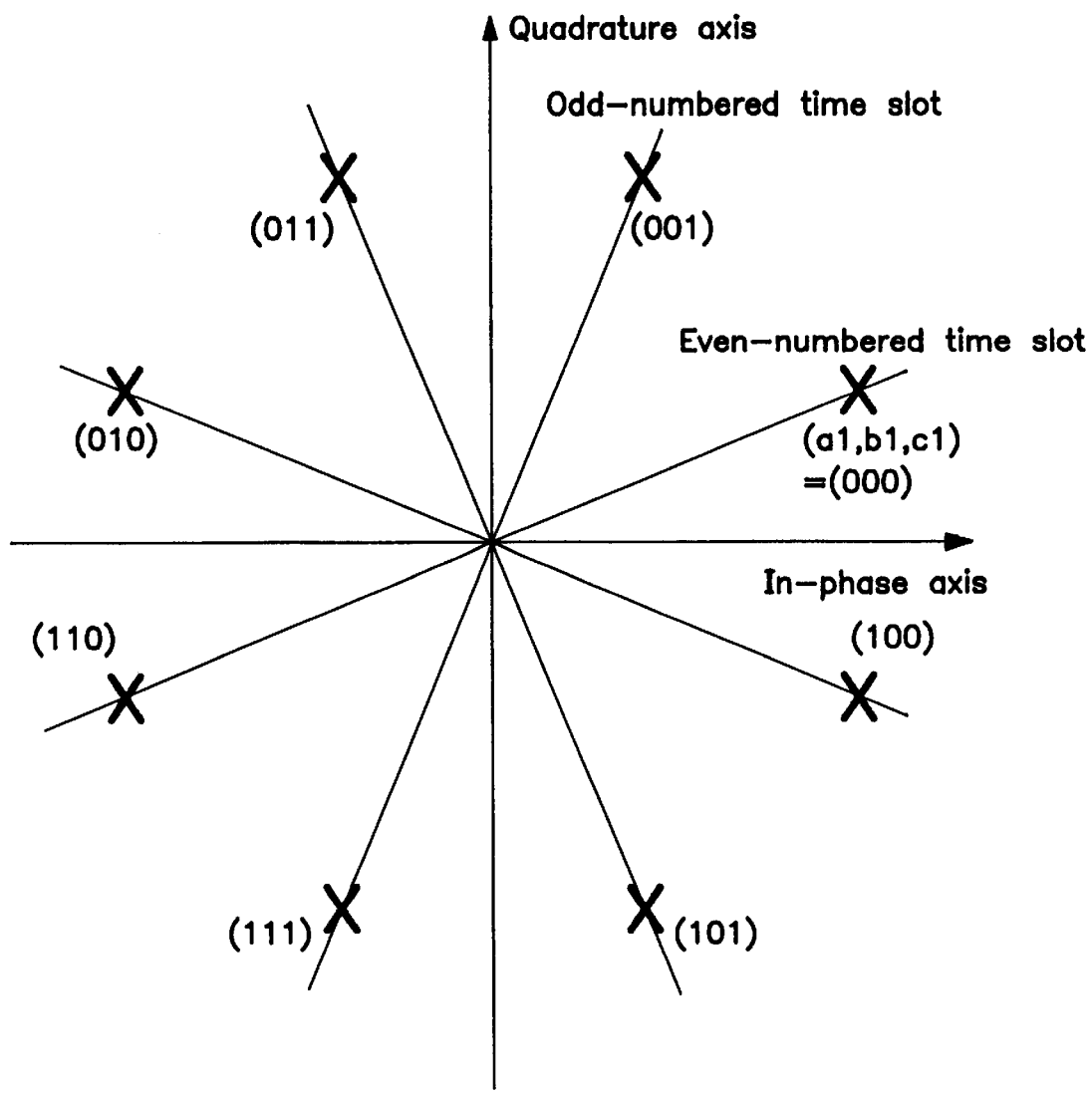
FIG. 50 is a diagram illustrating constellation when m=3 and d=1 and applied to the π/4 shift QPSK with no bandlimitation in the 10th embodiment.
Figure 51:
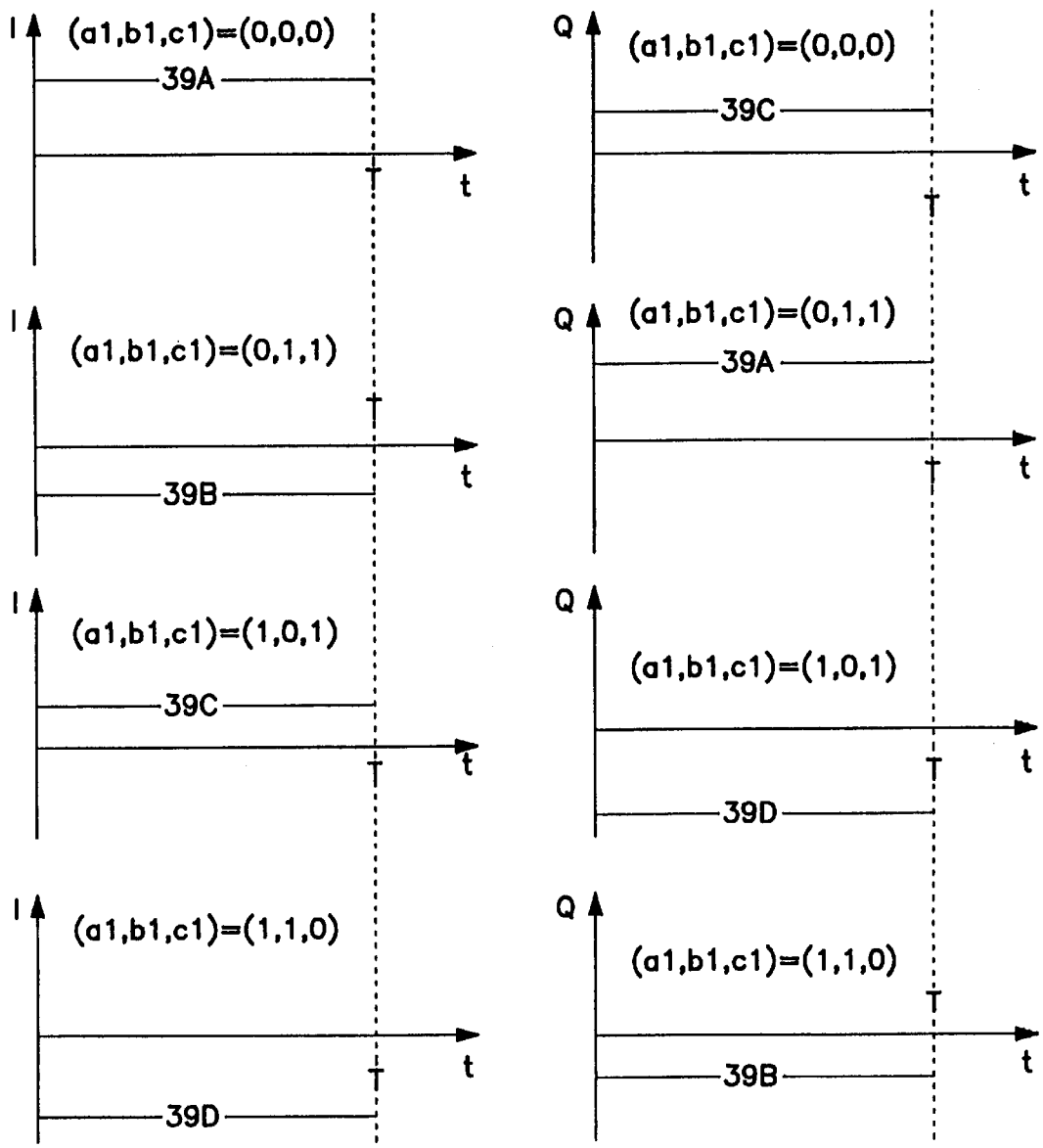
FIG. 51 is a diagram illustrating baseband signal waveforms of in-phase and quadrature axes corresponding to even-number time slots based on the constellation diagram shown in FIG. 50.
Figure 52:
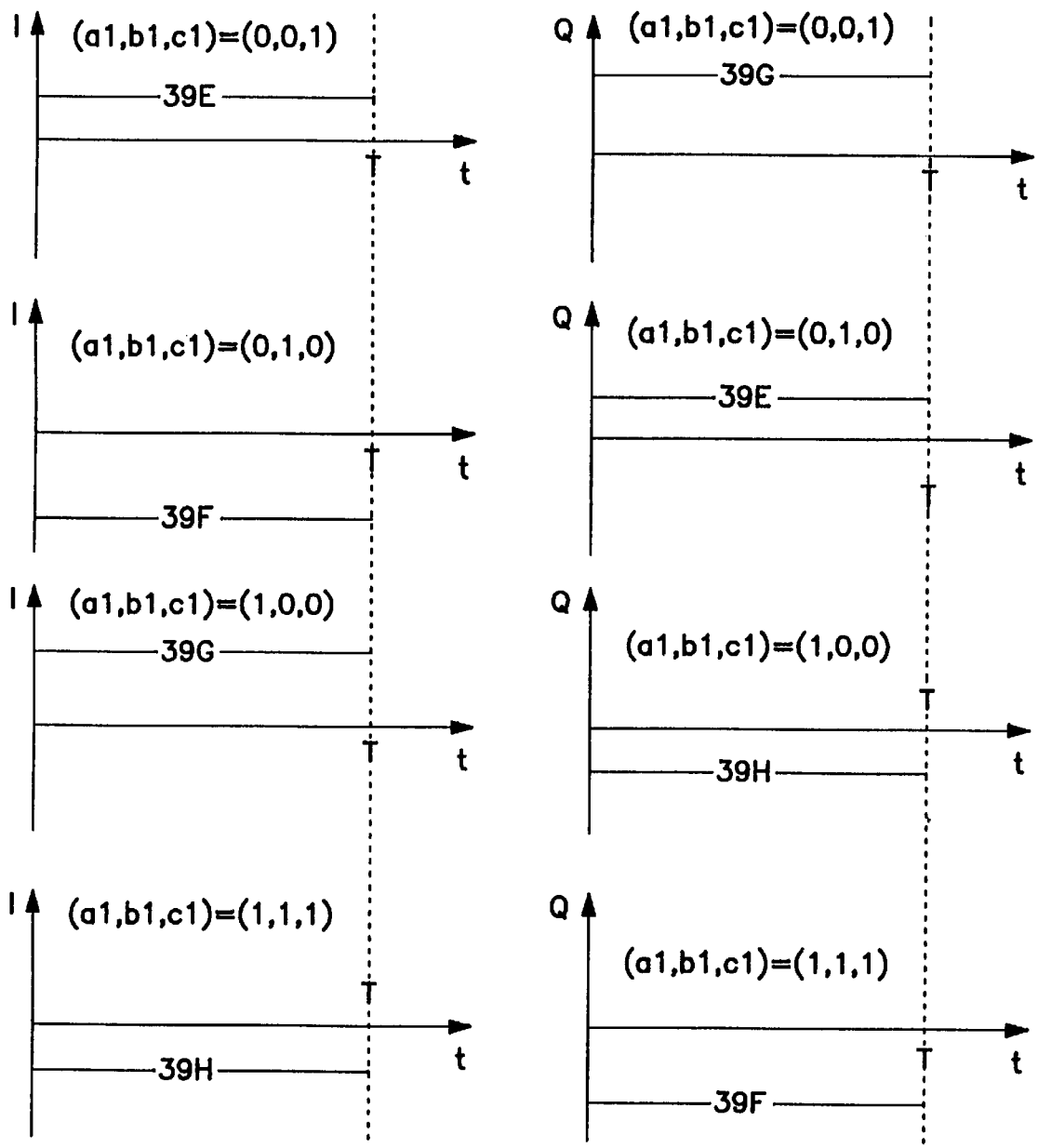
FIG. 52 is a diagram illustrating baseband signal waveforms of in-phase and quadrature axes corresponding to odd-number time slots based on the constellation diagram shown in FIG. 50.
Figure 53:
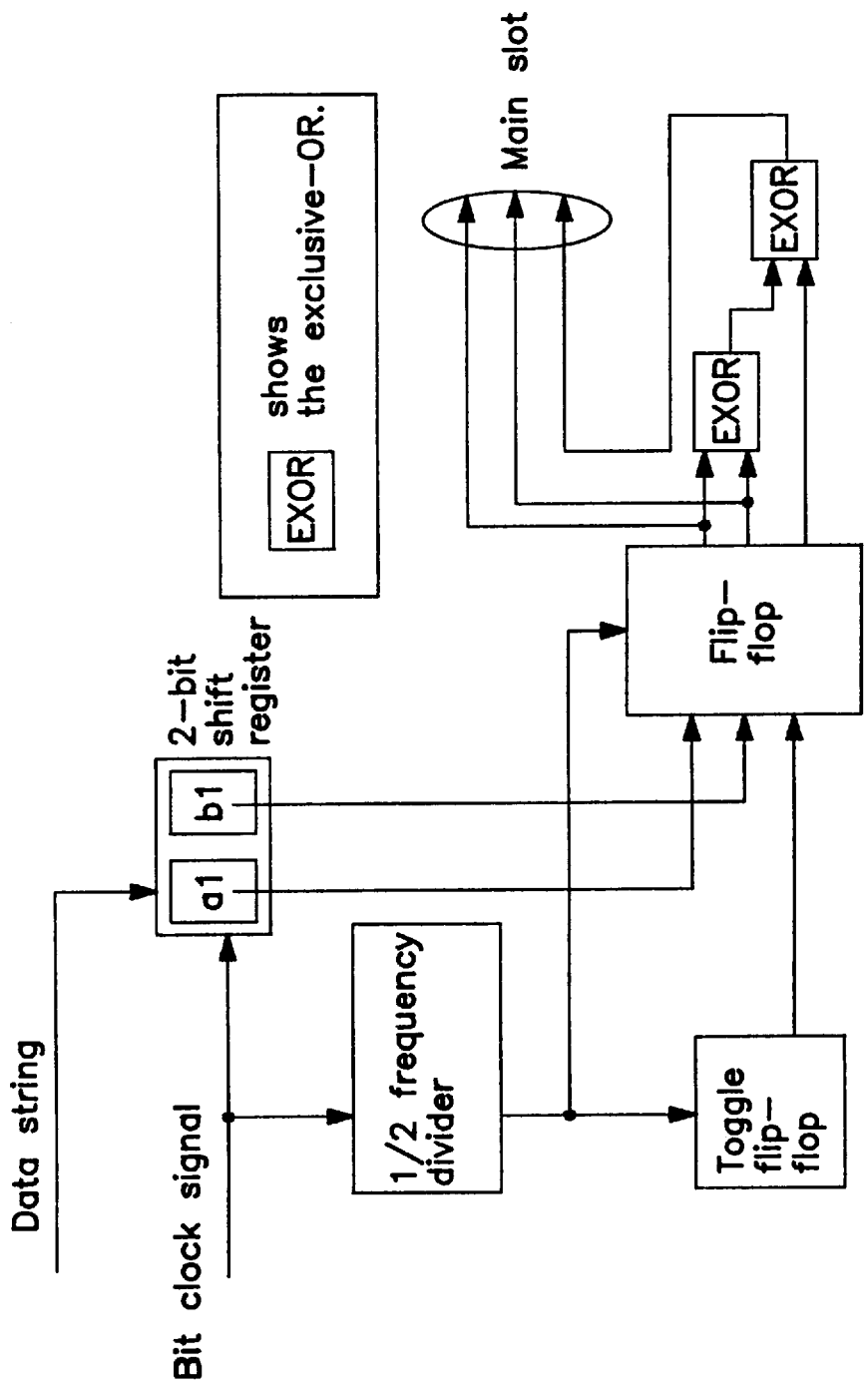
FIG. 53 is a circuit diagram of a slot generating means when m=3 and d=1 and applied to the π/4 shift QPSK with no bandlimitation in the said embodiment.

Now in the 10th embodiment, operation when m=3, d=1 and the invention is applied to π/4 shift QPSK free from bandlimitation will be described with reference to drawings, particularly, FIG. 50. However, in the case of the π/4 shift QPSK, the configuration of the slot generating means is not that shown in FIG. 36 but that shown in FIG. 53, in which slots are changed over from even-numbered time slot to odd-numbered time slot and vice versa alternately everyone symbol time. In FIG. 50, the number of main slots is1 and (a1, b1, c1) is designated to the first main slot. FIG. 50 illustrates the constellation and each signal point in FIG. 50 can be separated to sets of four points with varying phases 90° each, that is, it can be separated to two sets expressing even-numbered time slots of (0, 0, 0), (0, 1, 1), (1, 1, 0), (1, 0, 1) and the set expressing odd-numbered time slots of (0, 0, 1), (0, 1, 0), (1, 1, 1), (1, 0, 0). FIG. 51 illustrates four types of waveform data 39A, 39B, 39C, and 39D for 1 symbol time of the in-phase and quadrature axes corresponding to the sets expressing even-numbered time slots. FIG. 52 illustrates four types of waveform data 39E, 39F, 39G, and 39H for 1 symbol time of the in-phase and quadrature axes corresponding to the sets expressing odd-numbered time slots. In the case of the π/4 shift QPSK, each signal point can be separated into four points on quadrature coordinate axis expressing even-numbered time slot and four points on quadrature coordinate axis expressing odd-numbered time slot, and therefore, it is possible to assign four types of waveform data to the first and the second waveform memories with respect to each quadrature coordinate axis as shown in TABLE 6 shown in FIGS. 62a and 62b, respectively. The two types of waveform data read out from these are allotted to in-phase axis and quadrature axis by the waveform selecting means, D/A converted, and formed into in-phase and quadrature signal waveforms, which are π/4 shift QPSK baseband signal waveforms free from bandlimitation. Operation after the waveform selecting signals is the same as the case of QPSK-VP free from bandlimitation.

Figure 54:
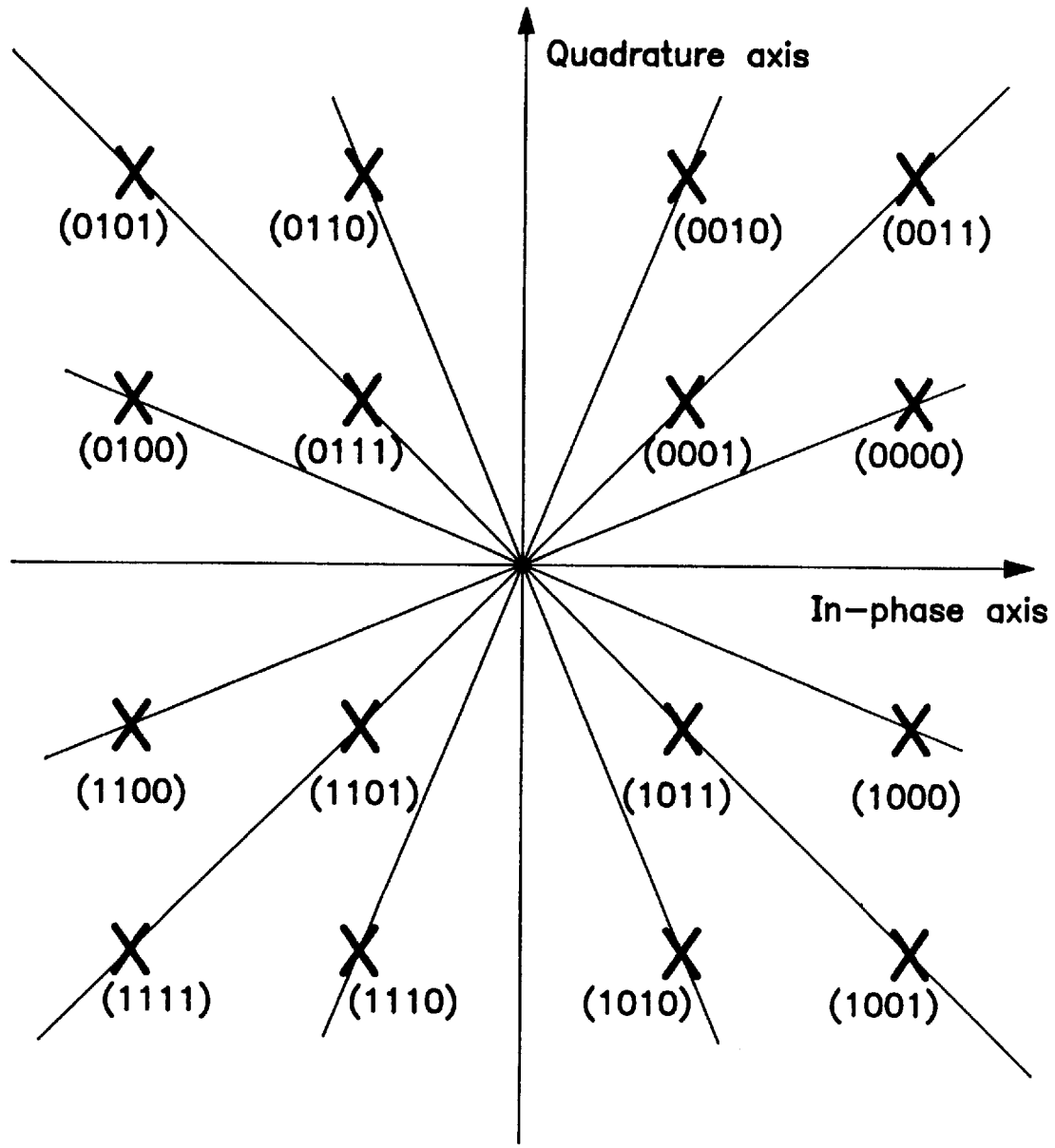
FIG. 54 is a diagram showing the constellation when the said embodiment is applied to the 16QAM.

The above configuration can be applied to other multi-level modulation systems in addition to the modulation systems described above. For example, in the case of 16QAM, let m=4 and the constellation be that as shown in FIG. 54, then, waveform shaping can be achieved in the manner similar to the π/4 shift QPSK by dividing the constellation into four quadrature coordinate axes of the first set (0, 0, 0, 0), (0, 1, 1, 0), (1, 1, 0, 0), (1, 0, 1, 0), the second set (0, 0, 0, 1), (0, 1, 1, 1), (1, 1, 0, 1), (1, 0, 1, 1), the third set (0, 0, 1, 1), (0, 1, 1, 1), (1, 1, 1, 1), (1, 0, 0, 1), and the fourth set (0, 0, 1, 0), (0, 1, 0, 0), (1, 1, 1, 0), (1, 0, 0, 0).

What is claimed is:

1. A waveform shaping equipment comprising:

pulse waveform generating means for receiving a data string, and generating and providing a first waveform which is a first half of a bandlimited pulse waveform corresponding to each one of symbols for the data string and a second waveform which is a second half of the band-limited pulse waveform, and waveform processing means for adding the first waveform and the second waveform to generate a third waveform as a shaped waveform, with the first waveform being provided at the start of the data string to be transmitted, the second waveform being provided at the end of the data string to be transmitted, wherein the first and second waveforms define one symbol time.

2. A waveform shaping equipment comprising:

a pulse waveform generating means for receiving a data string and generating and providing a first waveform which is a first half of a band-limited pulse waveform corresponding to each one of symbols for the data string and a second waveform which is a second half of the band-limited pulse waveform, and waveform processing means for adding the first waveform and the second waveform to generate a third waveform as a shaped waveform, wherein the waveform processing means provides (1) zero-level waveform whose level is zero before a start of the data string to be transmitted, (2) the first waveform for one symbol time from the start of the data string to be transmitted, (3) the second waveform for one symbol time from an end of the data string to be transmitted, and (4) thereafter the zero-level waveform until a next data string to be transmitted starts.

3. A waveform shaping equipment comprising a pulse waveform generating means for receiving a data string, and generating and providing a first waveform which is a first half of a band-limited pulse waveform corresponding to each one of symbols for the data string and a second waveform which is a second half of the band-limited pulse waveform, and waveform processing means for adding the first waveform and the second waveform to generate a third waveform as a shaped waveform, wherein the waveform processing means has a waveform selecting means for receiving a zero-level waveform, the first waveform, the second waveform, and the third waveform and for selecting any of the received waveforms to provide the zero-level waveform whose level is zero before a start of the data string to be transmitted, the first waveform for one symbol time from the start of the data string to be transmitted, the second waveform for one symbol time from an end of the data string to be transmitted, and thereafter the zero-level waveform until a next data string to be transmitted starts.

4. A waveform shaping equipment comprising:

a pulse waveform generating means for receiving a data string and generating and providing a first waveform which is a first half of a band-limited pulse waveform corresponding to each one of symbols of the data string and a second waveform which is a second half of the band-limited pulse waveform, and a waveform processing means for adding the first waveform and the second waveform to generate a third waveform as a shaped waveform, wherein the waveform processing means provides (1) a zero-level waveform whose level is zero before a start of the data string to be transmitted, (2) the first waveform for one symbol time from the start of the data string to be transmitted, (3) the second waveform for one symbol time from an end of the data string to be transmitted, and (4) thereafter the zero-level waveform until a next data string to be transmitted starts, the waveform processing means has a first input terminal for receiving the first waveform and a second input terminal for receiving the second waveform, the first input terminal and the second input terminal are designed to be cut off, respectively, wherein when the first waveform is provided as the shaped waveform, the second input terminal is cut off, and when the second waveform is provided as the shaped waveform, the first input terminal is cut off, and when the zero-level waveform is provided, both the first and second input terminals are cut off.

5. A waveform shaping equipment comprising a pulse waveform generating means for inputting the data string and generating and outputting the first waveform which is the first half of the band-limited pulse waveform corresponding to each symbol of the data string and the second waveform which is the latter half of the band-limited pulse waveform, and a waveform processing means which has adding means which inputs the first and the second waveforms and adds the first waveform and the second waveform to generate a third waveform as a shaped waveforms, wherein the pulse wave generating means comprises memory table for storing the first and the second waveform data, an addressing signal generating means for generating addressing signals for reading out data related to waveforms from a specified position of the memory table, and the memory table is designed to be retrieved by the addressing signals to read and output the first and second waveform data.

6. A waveform shaping equipment according to claim 5 wherein the addressing signal generating means comprises a shift register for accumulating data for the latest 2 symbols of data strings and outputting them in parallel and a cyclic counter which has a period equal to the symbol time, and the addressing signal for reading out the first waveform comprises the first-stage output of the shift register and the output of the counter, and the addressing signal for reading out the second waveform comprises the second-stage output of the shift register and the output of the counter.

7. A waveform shaping equipment according to claim 5 wherein the waveforms obtained by inverting the first waveform with respect to time is used for the second waveform and the pulse waveform generating means generates the first waveform and the second waveform from the same data of the memory table.

8. A waveform shaping equipment according to claim 5 wherein the waveforms obtained by inverting the first waveform with respect to time is used for the second waveform and the pulse waveform generating means generates the first waveform and the second waveform from the same data of the memory table, and when the second waveform data is read out, the addressing signal generating means generates addressing signals in the sequence reversal to that of the addressing signals, with respect to time, when the first waveform data is read out in each symbol time.

9. A waveform shaping equipment according to claim 5 wherein the addressing signal generating means is designed to generate addressing signals for reading out the first waveform data and addressing signals for reading out the second waveform data alternately, and the pulse generating means is designed to read out the first waveform data and the second waveform data alternately from the memory table.

10. A waveform shaping equipment according to claim 5 wherein the waveforms obtained by inverting the first waveform with respect to time is used for the second waveform and the pulse waveform generating means generates the first waveform and the second waveform from the same data of the memory table, and when the second waveform data is read out, the addressing signal generating means generates addressing signals in the sequence reversal to that of the addressing signals, with respect to time, when the first waveform data is read out in each symbol time, the addressing signal generating means is designed to generate addressing signals for reading out the first waveform data and addressing signals for reading out the second waveform data alternately, and the pulse generating means is designed to read out the first waveform data and the second waveform data alternately from the memory table.

11. A waveform shaping equipment comprising:

a pulse waveform generating means for receiving a data string, and generating and providing a first waveform which is a first half of a band-limited pulse waveform corresponding to each one of symbols of the data string and a second waveform which is a second half of the band-limited pulse waveform, and a waveform processing means for adding the first waveform and the second waveform to generate a third waveform as a shaped waveform, wherein the waveform processing means provides (1) a zero-level waveform whose level is zero before a start of the data string to be transmitted, (2) the first waveform for one symbol time from the start of the data string to be transmitted, (3) the second waveform for one symbol time from the end of the data string to be transmitted, and (4) thereafter the zero-level waveform until a next data string to be transmitted starts, wherein the pulse waveform generating means comprises a memory table for storing data for the first waveform and the second waveform and addressing signal generating means for generating addressing signals for retrieving the data related to the first waveform and the second waveform from a specified position of the memory table, wherein the data is retrieved from the memory table in response to the addressing signals.

12. A waveform shaping equipment according to claim 11 wherein the addressing signal generating means comprises:

a shift register for accumulating data for a latest two symbols of the data string and providing the accumulated data in parallel, and a cyclic counter which has a period equal to a symbol time, wherein an addressing signal for retrieving the first waveform comprises a first-stage output of the shift register and an output of the cyclic counter, and an addressing signal for retrieving the second waveform comprises a second-stage output of the shift register and the output of the cyclic counter.

13. A waveform shaping equipment according to claim 11 wherein the second waveform is produced by inverting the first waveform with respect to time and the pulse waveform generating means generates the first waveform and the second waveform from same data of the memory table.

14. A waveform shaping equipment according to claim 11 wherein the second waveform is produced by inverting the first waveform with respect to time and the pulse waveform generating means generates the first waveform and the second waveform from same data of the memory table, and when the data for the second waveform is retrieved, the addressing signal generating means generates addressing signals in a reverse sequence to that of the addressing signals, with respect to time, when the data for the first waveform is retrieved in each symbol time.

15. A waveform shaping equipment according to claim 11 wherein the addressing signal generating means generates the addressing signals for retrieving data for the first waveform and the addressing signals for retrieving the data for the second waveform data alternately, and the pulse waveform generating means is further for retrieving the data for the first waveform and the data for the second waveform alternately from the memory table.

16. A waveform shaping equipment according to claim 11 wherein the second waveform is obtained by inverting the first waveform with respect to time and the pulse waveform generating means generates the first waveform and the second waveform from same data of the memory table, and wherein when the data for the second waveform is retrieved, the addressing signal generating means generates addressing signals in a reverse sequence to that of the addressing signals, with respect to time, when the data for the first waveform is retrieved in each symbol time, the addressing signal generating means generates addressing signals for retrieving the data for the first waveform and the addressing signals for retrieving the data for the second waveform alternately, and the pulse waveform generating means is further for retrieving the data for the first waveform and the data for the second waveform alternately from the memory table.

17. A waveform shaping equipment comprising:

a pulse waveform generating means for receiving a data string and generating and providing a first waveform which is a first half of a band-limited pulse waveform corresponding to each one of symbols of the data string and a second waveform which is a second half of the band-limited pulse waveform, and a waveform processing means for adding the first waveform and the second waveform to generate a third waveform as a shaped waveform, wherein the waveform processing means has a waveform selecting means for receiving a zero-level waveform, the first waveform, the second waveform, and the third waveform and for selecting any of the received waveforms to provide the zero-level waveform whose level is zero before a start of the data string to be transmitted, the first waveform for one symbol time from the start of the data string to be transmitted, the second waveform for one symbol time from an end of the data string to be transmitted, and thereafter the zero-level waveform until a next data string to be transmitted starts, wherein the pulse waveform generating means comprises a memory table for storing data for the first waveform and the second waveform and addressing signal generating means for generating addressing signals for retrieving the data related to the first waveform and the second waveform from a specified position of the memory table, wherein the data is retrieved from the memory table in response to the addressing signals.

18. A waveform shaping equipment according to claim 17 wherein the addressing signal generating means comprises:

a shift register for accumulating data for a latest two symbols of the data string and providing the accumulated data in parallel, and a cyclic counter which has a period equal to a symbol time, wherein an addressing signal for retrieving the first waveform comprises a first-stage output of the shift register and an output of the cyclic counter, and an addressing signal for retrieving the second waveform comprises a second-stage output of the shift register and the output of the cyclic counter.

19. A waveform shaping equipment according to claim 17 wherein the second waveform is produced by inverting the first waveform with respect to time and the pulse waveform generating means generates the first waveform and the second waveform from same data of the memory table.

20. A waveform shaping equipment according to claim 17 wherein the second waveform is produced by inverting the first waveform with respect to time and the pulse waveform generating means generates the first waveform and the second waveform from same data of the memory table, and when the data for the second waveform is retrieved, the addressing signal generating means generates addressing signals in a reverse sequence to that of the addressing signals, with respect to time, when the data for the first waveform is retrieved in each symbol time.

21. A waveform shaping equipment according to claim 17 wherein the addressing signal generating means generates the addressing signals for retrieving the data for the first waveform and the addressing signals for retrieving the data for the second waveform alternately, and the pulse waveform generating means is further for retrieving the data for the first waveform and the data for the second waveform alternately from the memory table.

22. A waveform shaping equipment according to claim 17 wherein the second waveform is obtained by inverting the first waveform with respect to time and the pulse waveform generating means generates the first waveform and the second waveform from same data of the memory table, and when the data for the second waveform is retrieved, the addressing signal generating means generates the addressing signals in a reverse sequence to that of the addressing signals, with respect to time, when the data for the first waveform is retrieved in each symbol time, the addressing signal generating means generates the addressing signals for retrieving the data for the first waveform and the addressing signals for retrieving the second waveform data alternately, and the pulse waveform generating means is further for retrieving the data for the first waveform and the data for the second waveform data alternately from the memory table.

23. A waveform shaping equipment comprising:

a pulse waveform generating means for receiving a data string and generating and providing a first waveform which is a first half of a band-limited pulse waveform corresponding to each one of symbols of the data string and a second waveform which is a second half of the band-limited pulse waveform, and a waveform processing means for adding the first waveform and the second waveform to generate a third waveform as a shaped waveform, wherein the waveform processing means provides (1) a zero-level waveform whose level is zero before a start of the data string to be transmitted, (2) the first waveform for one symbol time from the start of the data string to be transmitted, (3) the second waveform for one symbol time from an end of the data string to be transmitted, and (4) thereafter the zero-level waveform until the next data string to be transmitted starts, the waveform processing means has a first input terminal for receiving the first waveform and a second input terminal for receiving the second waveform where the first input terminal and the second input terminal are designed to be cut off, respectively, wherein (1) when the first waveform is provided as the shaped waveform, the second input terminal is cut off, and (2) when the second waveform is provided as the shaped waveform, the first input terminal is cut off, and (3) when the zero-level waveform is provided, both the first input terminal and the second input terminal are cut off, wherein the pulse waveform generating means comprises a memory table for storing data for the first waveform and the second waveform, and addressing signal generating means for generating addressing signals for retrieving the data related to the first waveform and the second waveform from a specified position of the memory table, wherein the data is retrieved in response to the addressing signals.

24. A waveform shaping equipment according to claim 23 wherein the addressing signal generating means comprises:

a shift register for accumulating data for a latest two symbols of the data string and providing the accumulated data in parallel, and a cyclic counter which has a period equal to a symbol time, wherein an addressing signal for retrieving the first waveform comprises a first-stage output of the shift register and an output of the cyclic counter, and an addressing signal for retrieving the second waveform comprises a second-stage output of the shift register and the output of the cyclic counter.

25. A waveform shaping equipment according to claim 23 wherein the second waveform is produced by inverting the first waveform with respect to time and the pulse waveform generating means generates the first waveform and the second waveform from same data of the memory table.

26. A waveform shaping equipment according to claim 23 wherein the second waveform is produced by inverting the first waveform with respect to time and the pulse waveform generating means generates the first waveform and the second waveform from same data of the memory table, and when the data for the second waveform is retrieved, the addressing signal generating means generates addressing signals in a reverse sequence to that of the addressing signals, with respect to time, when the data for the first waveform is retrieved in each symbol time.

27. A waveform shaping equipment according to claim 23 wherein the addressing signal generating means generates the addressing signals for retrieving the data for the first waveform and the addressing signals for retrieving the data for the second waveform alternately, and the pulse waveform generating means is further for retrieving the data for the first waveform and the data for the second waveform alternately from the memory table.

28. A waveform shaping equipment according to claim 23 wherein the second waveform is obtained by inverting the first waveform with respect to time and the pulse waveform generating means generates the first waveform and the second waveform from same data of the memory table, and when the data for the second waveform is retrieved, the addressing signal generating means generates the addressing signals in a reverse sequence to that of the addressing signals, with respect to time, when the data for the first waveform is read out in each symbol time, the addressing signal generating means generates the addressing signals for retrieving the data for the first waveform and the addressing signals for retrieving the data for the second waveform alternately, and the pulse waveform generating means is further for retrieving the data for the first waveform and the data for the second waveform alternately from the memory table.

* * * * *

UNITED STATES PATENT AND TRADEMARK OFFICE
CERTIFICATE OF CORRECTION

PATENT NO. : 5,825,820
DATED : October 20, 1998
INVENTOR(S) : Urabe et al.

It is certified that error appears in the above-identified patent and that said Letters Patent is hereby corrected as shown below:

Cover page, item [56], References Cited, Other Documents, add the following:

Hitoshi Takai, "BER Performance of Anti-Multipath Modulation PSK-VP and its Optimum Phase-Waveform", 1990 IEEE, CH 2846-4/90/0000-0412, pp. 412-419.

"IEEE Transactions on Communications", October 1977, Vol. COM-25, No. 10, pp. 1242-1245.

Signed and Sealed this

Twentieth Day of July, 1999

*Attest:*

Q. TODD DICKINSON

*Attesting Officer*     *Acting Commissioner of Patents and Trademarks*